(12) United States Patent
Huang et al.

(10) Patent No.: US 12,314,650 B2
(45) Date of Patent: May 27, 2025

(54) INTEGRATED CIRCUIT DEVICE AND MANUFACTURING METHOD OF THE SAME

(71) Applicant: Taiwan Semiconductor Manufacturing Company, Ltd., Hsinchu (TW)

(72) Inventors: Ching-Yu Huang, Hsinchu (TW); Wei-Cheng Tzeng, Taipei (TW); Shih-Wei Peng, Hsinchu (TW); Wei-Cheng Lin, Taichung (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 444 days.

(21) Appl. No.: 17/825,383

(22) Filed: May 26, 2022

(65) Prior Publication Data

US 2023/0401368 A1 Dec. 14, 2023

(51) Int. Cl.
| | |
|---|---|
| *H01L 29/06* | (2006.01) |
| *G06F 30/392* | (2020.01) |
| *H01L 23/528* | (2006.01) |
| *H10D 86/00* | (2025.01) |

(52) U.S. Cl.
CPC ........ *G06F 30/392* (2020.01); *H01L 23/5286* (2013.01); *H10D 86/00* (2025.01)

(58) Field of Classification Search
CPC .... G06F 30/392; G06F 30/394; G06F 30/398; H01L 23/5286; H10D 86/00; H10D 30/689; H10D 84/0188; H10D 84/135; H10D 84/201; H10D 84/948; A61K 40/4218; H02K 15/027; A23B 2/783; C01G 53/82; H10F 19/908; B82Y 10/00; H10H 20/826
USPC ....................................................... 257/618
See application file for complete search history.

(56) References Cited

U.S. PATENT DOCUMENTS

| | | | |
|---|---|---|---|
| 2007/0194387 A1* | 8/2007 | Dyer ............... | H01L 21/823425 257/E29.267 |
| 2014/0077288 A1* | 3/2014 | Yamamoto ......... | H10D 30/0212 438/300 |

* cited by examiner

*Primary Examiner* — Theresa T Doan
(74) *Attorney, Agent, or Firm* — Birch, Stewart, Kolasch & Birch, LLP

(57) ABSTRACT

A method is provided, including following operations: identifying a first contact via, a second contact via, or a combination thereof in a first standard cell, wherein the first contact via is coupled between a first active region and a first conductive line on a first side, and the second contact via is coupled between a second active region and a second conductive line on a second side; calculating a first cell height according to a first width of the first and second active regions, and calculating a second cell height according to a second width of the first and second active regions; calculating multiple first available cell heights based on a ratio between the first and second cell heights; generating layout designs of multiple first cells; and manufacturing at least first one element in the integrated circuit based on the layout designs of the first cells.

20 Claims, 46 Drawing Sheets

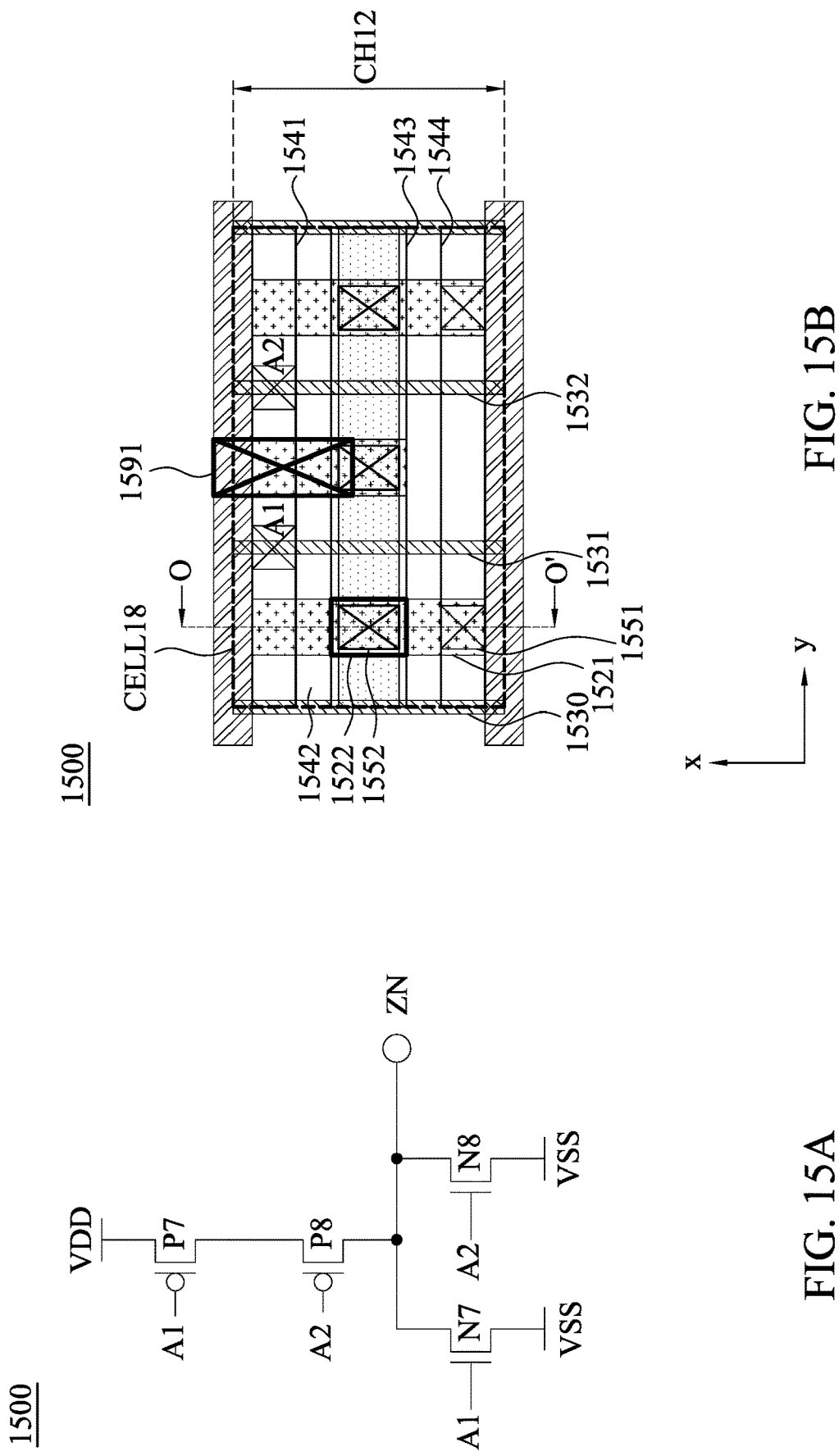

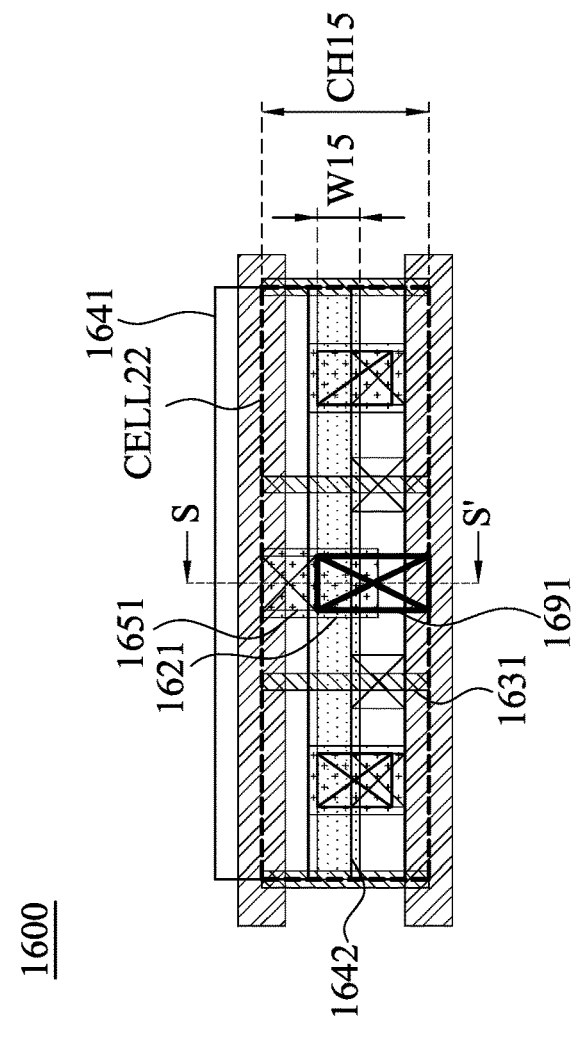
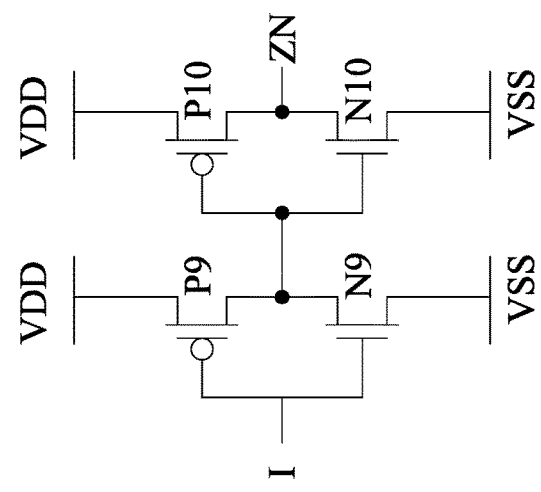
FIG. 16A
FIG. 16B

INTEGRATED CIRCUIT DEVICE AND MANUFACTURING METHOD OF THE SAME

BACKGROUND

As planar area of integrated circuits is scaled down in demand and well isolation issue in designing integrated circuits, stacked field-effect transistors become prevailing in semiconductor industry. Hybrid cell height structure is utilized for optimizing power, performance and area of the integrated circuit layout design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16A is a schematic diagram of a circuit, FIG. 16B is a layout diagram in a plan view corresponding to the circuit in FIG. 16A.

DETAILED DESCRIPTION

Figure 1:
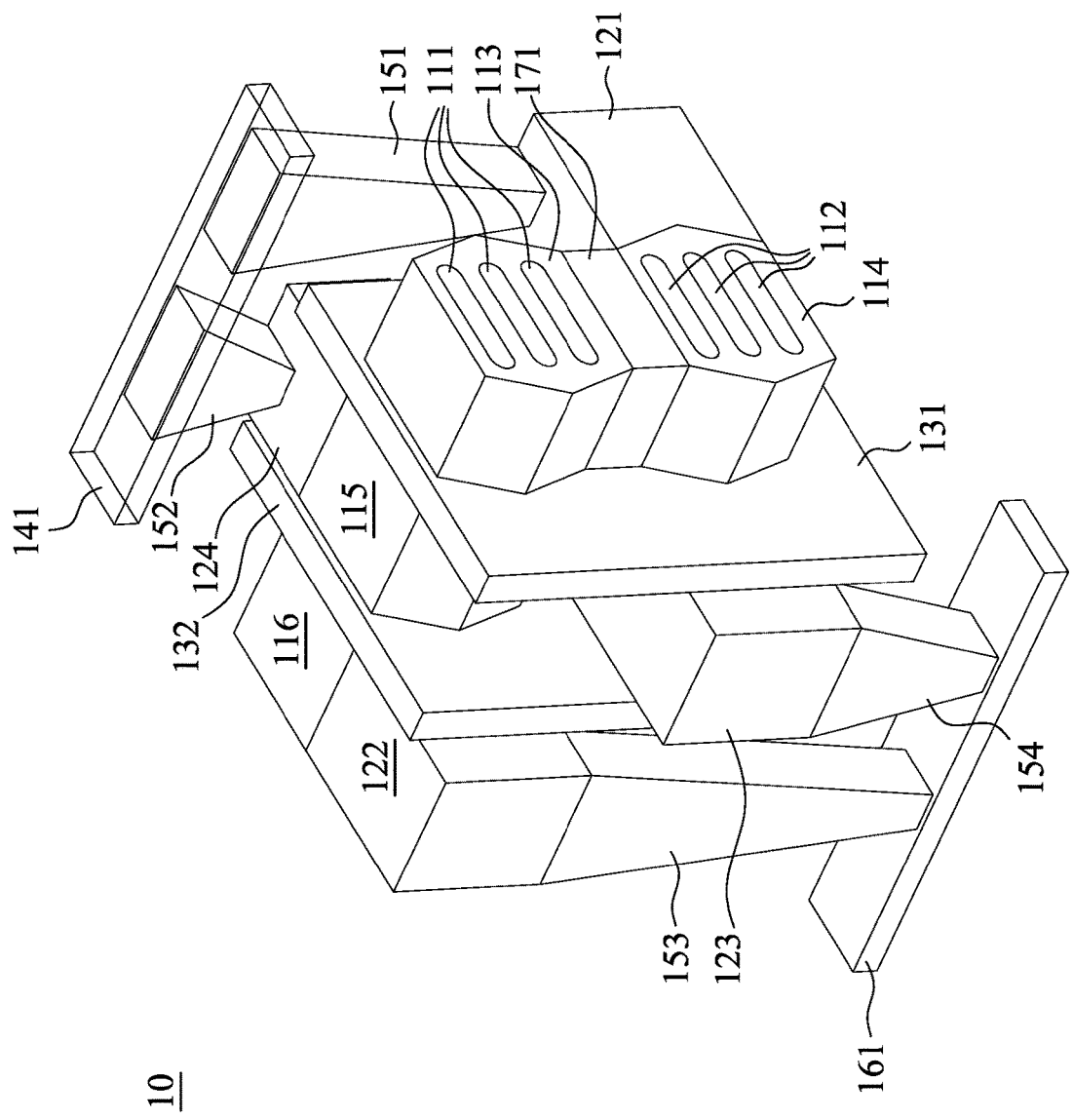
FIG. 1 is a schematic diagram of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

In some embodiments of the present application, a method and structures are provided for power, performance and area (PPA) optimization with variety of cell heights. For example, based on the layout of a standard cell from the library, the layout is analyzed to identify a number of specific vias that couples conductive lines on a front side of an integrated circuit to conductive segments closer to the back side of the integrated circuit or couples conductive lines on a back side of the integrated circuit to conductive segments closer to the front side metal. Furthermore, in response to the identification, a cell height range of the standard cell is obtained and accordingly, multiple cells, having different cell heights, corresponding to the standard cell are generated for hybrid cell height structure.

Reference is now made to FIG. 1. FIG. 1 is a schematic diagram of an integrated circuit 10, in accordance with some embodiments. The integrated circuit 10 includes active regions 111-112, conductive segments (e.g., metal-on-device) 121-124, gates (poly) 131-132, a conductive line 141 on a front side of the integrated circuit 10, contact vias 151 and 153, a via 152 and 154, a conductive line 161 on a back side, opposite to the front side, of the integrated circuit 10, and an interconnect segment 171. In some embodiments, the conductive line 141 is referred to as a metal-zero conductive line to transmit supply voltages or signals for the integrated circuit 10, and the conductive line 161 is referred to as a power rail on the back side of the integrated circuit 10 for transmitting the supply voltages. In various embodiments, the conductive line 161 is configured to transmit signals from/to the integrated circuit 10. As shown in FIG. 1, the active regions 111 are disposed in a first layer below the conductive line 141 and the active regions 112 are disposed in a second layer below the first layer while the interconnect segment 171 is sandwiched between the first and second layers. The conductive line 161 is in a third layer below the second layer.

In FIG. 1, the active regions 111-112 extend in y direction and are separated from each other in z direction. The active regions 111-112 are referred to as a pair of stacked active regions and crossed by the gates 131-132 extending in the x direction. In some embodiments, source/drain regions 113-116 are formed around the active regions 111-112. In some embodiments, the active regions 111-112 are referred to as channel regions (for example, structures of round/square wire, nanoslab, nano-sheet, multi-bridge channel, nano-ring or any other suitable kinds of the nano structures) of active devices (e.g., complementary field-effect transistor.) For example, in some embodiments, the source/drain regions 113, 115-116 are N-type doped and are included in N-type transistors consisted of the source/drain regions 113, 115-116, the active regions 111, and the gates 131-132. Similarly, the source/drain region 114 are P-type doped and are included in P-type transistors consisted of the source/drain region 114, the active regions 112, and the gates 131-132. Alternatively stated, the gates 131-132 are shared by the P-type transistors and N-type transistors formed by the active regions 111-112. In some embodiments, the gate 130 includes a gate dielectric layer (not shown) and a gate electrode layer (not shown). For the sake of simplicity, the source/drain regions and active regions are as a whole referred to as active regions in the layout view, the width of the active regions indicates the width of the channel regions (e.g., the active regions 111-112), and the conductivity type of the active regions are referred to as the conductivity type of source/drain regions surrounding the active regions 111-112.

The conductive segments 121-124 extend in x direction and are configured as source/drain contacts to couple the active regions 111-112 to the conductive lines (e.g., the conductive line 141 or 161) through the source/drain regions and the contact vias 151 and 153 and the vias 152 and 154. For example, as shown in FIG. 1, the active regions 112 are coupled to the conductive line 141 by the conductive segment 121 and the contact via 151 which passes the active regions 111 along z direction. The active regions 111 enveloped with the source/drain region 116 are coupled to the conductive line 161 by the conductive segment 122 and the contact via 153 which passes the active regions 112 along z direction. In addition, the active regions, for example, 111 in the first layer couple to the conductive line, for example, 141 on the front side through the via, for example, 152, and the conductive segment, for example, 124. The active regions, for example, 112 in the second layer couple to the conductive line, for example, 161 on the back side through the via, for example, 154, and the conductive segment, for example, 123.

In some embodiments, the interconnect segment 171 is configured to electrically couple the active regions 111-112. In various embodiments, the interconnect segment is configured as an isolation between the active regions 111-112.

The configurations of FIG. 1 are given for illustrative purposes. Various implements are within the contemplated scope of the present disclosure. For example, in some embodiments, the active regions in the first layer (top) of the P conductivity type and the active regions in the second layer (bottom) of the N conductivity type.

As discussed in FIG. 1, the contact vias, for example, 151 and 153 are configured to electrically couple the conductive line on front side to the active regions in the second layer (bottom) or the conductive line on back side to the active regions in the first layer (top). At least three types of configurations of contact vias in a cell are discussed with reference to the embodiments of FIGS. 2A-8D. For example, in the embodiments of FIG. 2C, for the first configuration, one contact via 251 in the cell CELL2 is configured to couple the conductive line 243 to the conductive segment 222 in the second layer. In the embodiments of FIG. 3C, for the second configuration, two contact vias 351 and 353 in the cell CELL4 are configured to couple the conductive lines 343 and 361 to the conductive segment 322 in the second layer and the conductive segment 321 in the first layer respectively. For the third configuration, as shown in FIG. 6D, no via in the cell CELL6 passes the active regions 611-612 for connection.

Figure 2A:
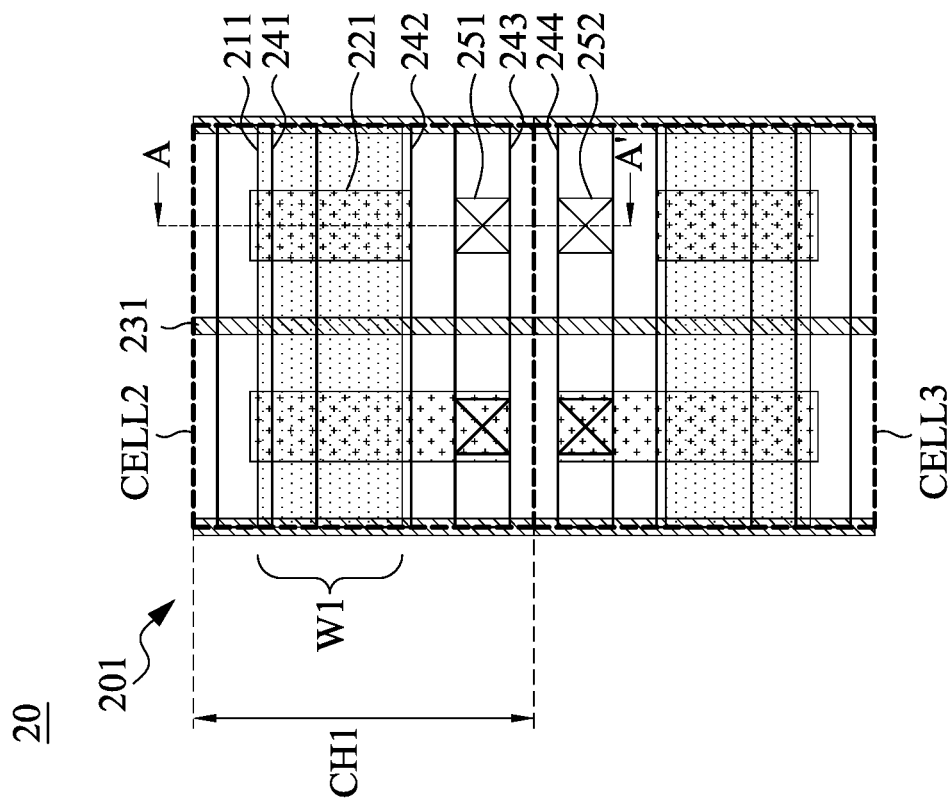
FIGS. 2A-2B are layout diagrams in a plan view of front and back portions of an integrated circuit.
Figure 2C:
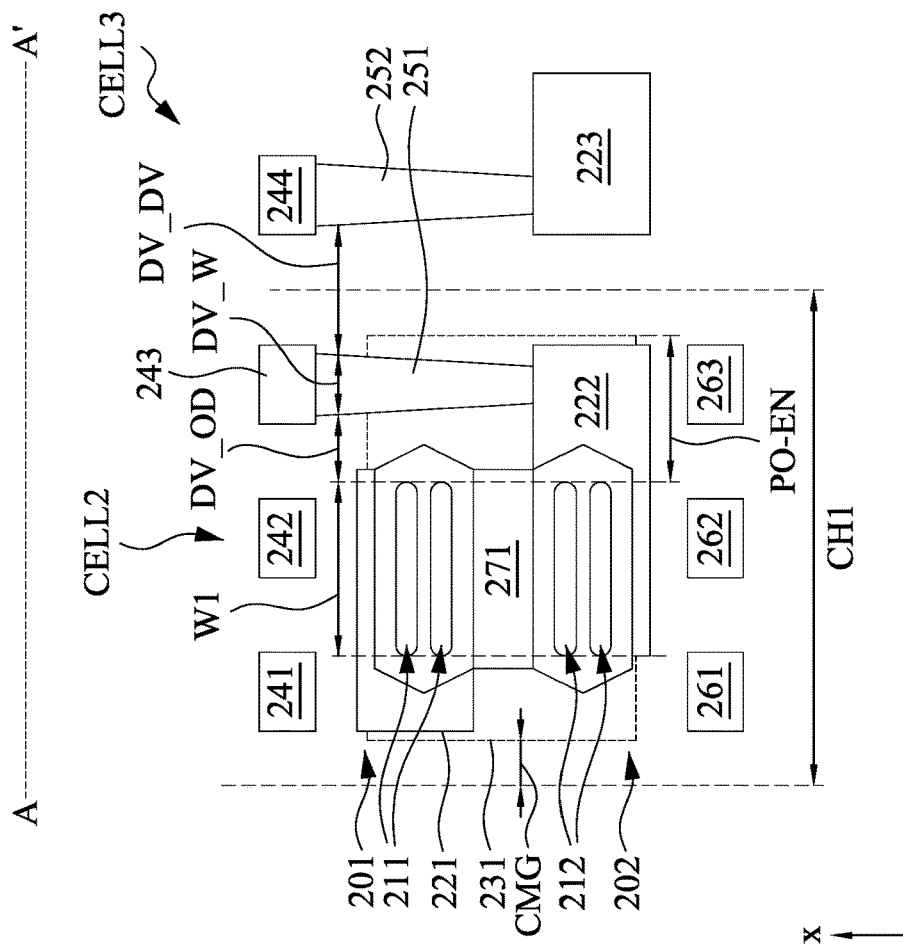
FIG. 2C is a cross-sectional diagram of the integrated circuit along line A-A' in FIGS. 2A-2B, in accordance with some embodiments.
Figure 2B:
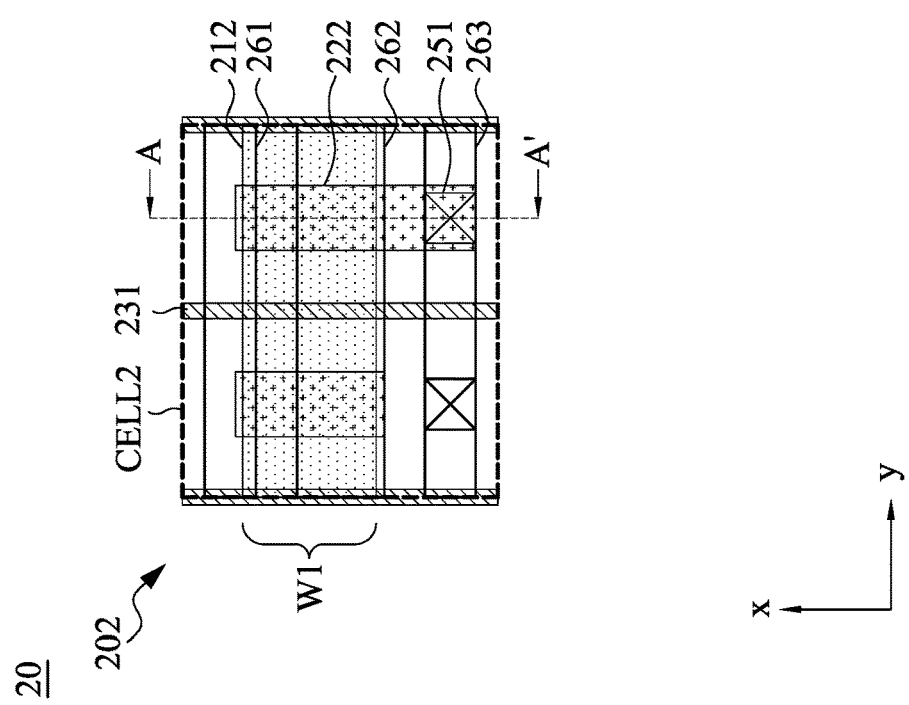

For the first configuration, reference is now made to FIGS. 2A-2C. FIGS. 2A-2B are layout diagrams in a plan view of a front portion 201 and a back portion 202 of an integrated circuit 20, and FIG. 2C is a cross-sectional diagram of the integrated circuit 20 along line A-A' in FIGS. 2A-2B, in accordance with some embodiments. As the layout diagram of the front portion 201 of the integrated circuit 20 in FIG. 2A, the integrated circuit 20 includes a standard cell CELL2 having a cell height CH1 and a standard cell CELL3 abutting the standard cell CELL2. In some embodiments, the standard cells CELL2-CELL3 are mirror images of each other with respect to x direction.

In FIGS. 2A-2C the standard cell CELL2 includes active regions 211-212 configured with respect to the active regions 111-112 in FIG. 1, conductive segments 221 and 223 configured with respect to the conductive segment 121 in FIG. 1, a gate 231 configured with respect to the gates 131-132 in FIG. 1, conductive lines 241-243 configured with respect to the conductive line 141 in FIG. 1, a contact via 251 configured with respect to the contact via 151 in FIG. 1, conductive lines 261-263 configured with respect to the conductive line 161 in FIG. 1 and an interconnect segment 271 configured with respect to the interconnect segment 171 in FIG. 1.

As illustratively shown in FIG. 2C, the conductive line 243 is coupled to the conductive segment 222 through the contact via 251, and the conductive segment 222 is coupled to the active regions 212. In some embodiments, the standard cell CELL2 further includes an interconnect segment 271 to electrically couple the active regions 211-212 with each other. In various embodiments, the interconnect segment 271 is an isolation between the active regions 211-212.

In some embodiments, for the standard cell CELL2 having one contact via (i.e., the contact via 251), the cell height CH1 of the standard cell CELL2 is calculated based on the equation (1):

$$CH = WA + PO\_EN + CMG + DV\_OD + DV\_W + \max(CMG; 0.5 \times DV\_DV) \quad (1)$$

CH corresponds to the cell height CH1 of the standard cell CELL2, WA corresponds to the width W1 of the active regions 211-212, PO_EN corresponds to a distance between the active regions 211-212 and an edge of the gate 231 crossing thereabove, CMG corresponds to the edge of the gate 231 and a first boundary of the standard cell CELL2, DV_OD corresponds to a distance between the active regions 211-212 and the contact via 251, DV_W corresponds to a width of the contact via 251, DV_DV corresponds to a distance between a contact via 252 in the standard cell CELL3 and the contact via 251, and max(CMG; 0.5×DV_DV) corresponds to a greatest value among CMG and DV. The contact vias 251-252 are separated by a second boundary of the standard cell CELL2.

Figure 3A:
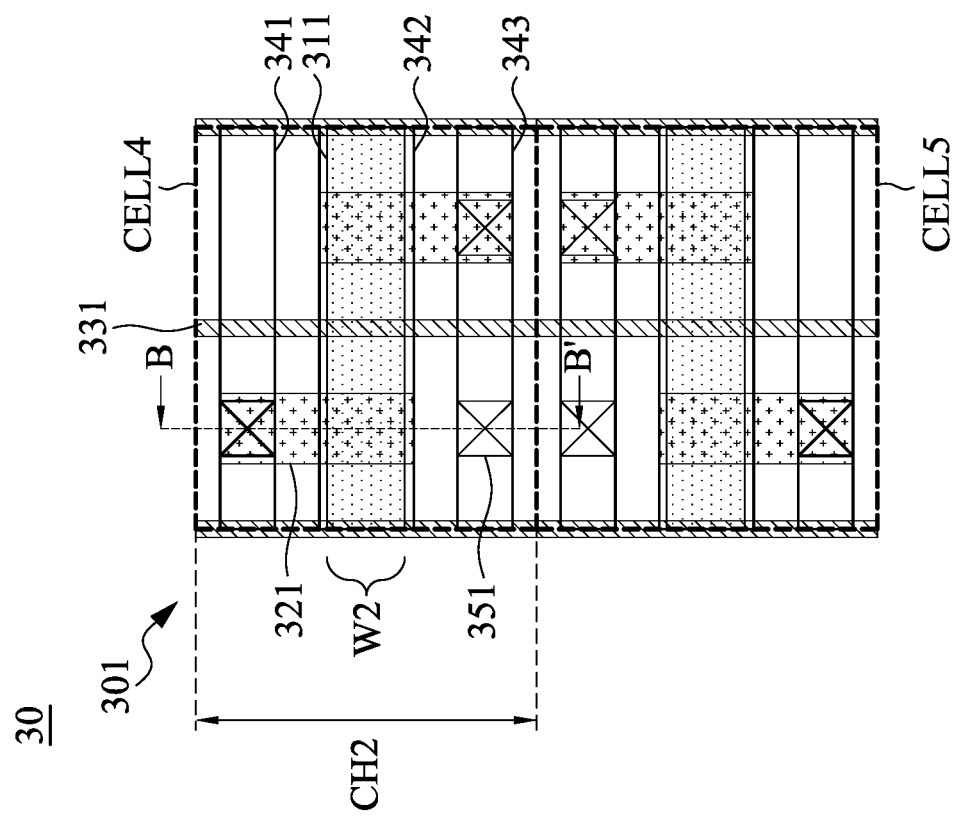
FIGS. 3A-3B are layout diagrams in a plan view of front and back portions of an integrated circuit.
Figure 3C:
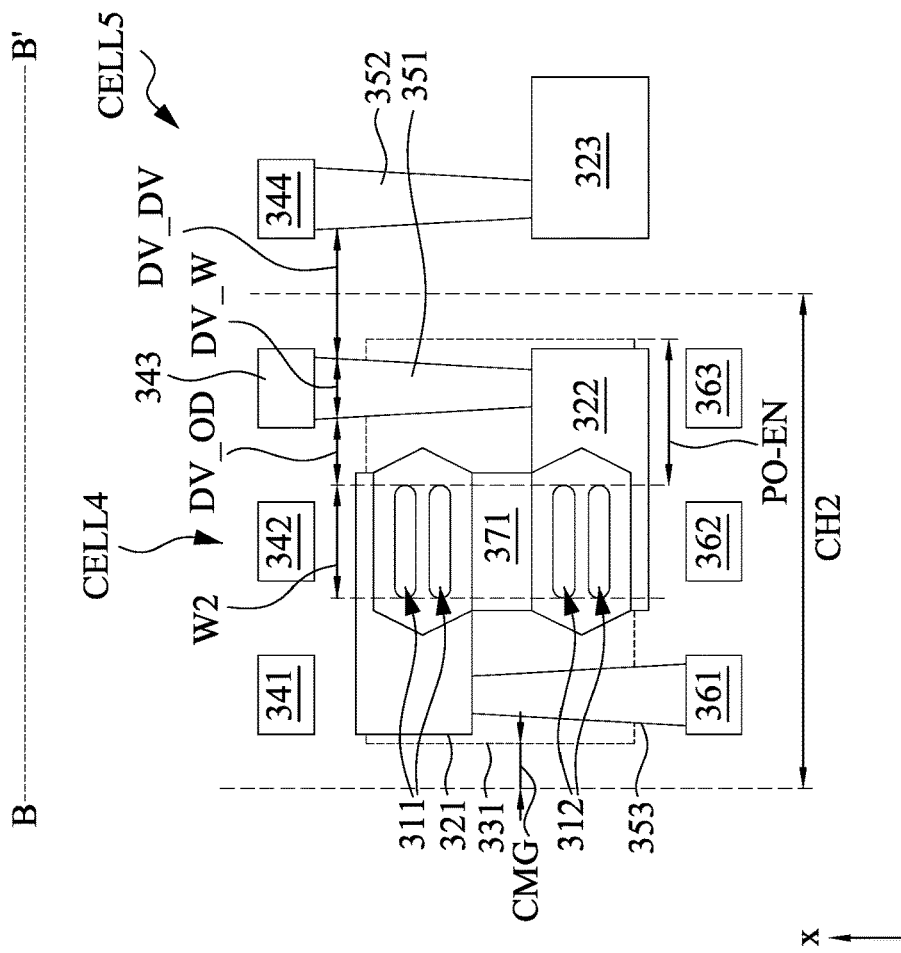
FIG. 3C is a cross-sectional diagram of the integrated circuit along line B-B' in FIGS. 3A-3B, in accordance with some embodiments.
Figure 3B:
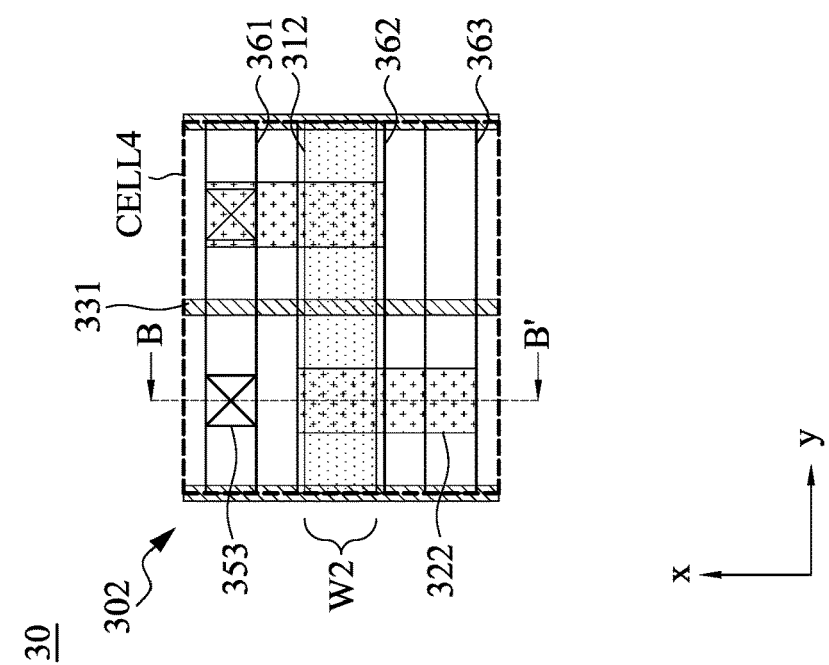

Reference is now made to FIGS. 3A-3C. FIGS. 3A-3B are layout diagrams in a plan view of a front portion 301 and a back portion 302 of an integrated circuit 30, and FIG. 3C is a cross-sectional diagram of the integrated circuit 30 along line B-B' in FIGS. 3A-3B, in accordance with some embodiments. As the layout diagram of the front portion 301 of the integrated circuit 30 in FIG. 3A, the integrated circuit 30 includes a standard cell CELL4 having a cell height CH2 and a standard cell CELL5 abutting the standard cell CELL4. In some embodiments, the standard cells CELL4-CELL5 are mirror images of each other with respect to x direction.

In FIGS. 3A-3C the standard cell CELL4 includes active regions 311-312 configured with respect to the active regions 111-112 in FIG. 1, conductive segments 321 and 323 configured with respect to the conductive segments 122 and 121 in FIG. 1, a gate 331 configured with respect to the gates 131-132 in FIG. 1, conductive lines 341-343 configured with respect to the conductive line 141 in FIG. 1, contact vias 351 and 353 configured with respect to the contact vias 151 and 153 in FIG. 1, conductive lines 361-363 configured with respect to the conductive line 161 in FIG. 1 and an interconnect segment 371 configured with respect to the interconnect segment 171 in FIG. 1.

As illustratively shown in FIG. 3C, the conductive line 343 is coupled to the conductive segment 322 through the contact via 351, and the conductive segment 222 is coupled to the active regions 312. The conductive line 361 is coupled to the conductive segment 321 through the contact via 353, and the conductive segment 321 is coupled to the active regions 311. In some embodiments, the standard cell CELL4 further includes an interconnect segment 371 to electrically couple the active regions 311-312 with each other. In various embodiments, the interconnect segment 371 is an isolation between the active regions 311-312.

In some embodiments, for the standard cell CELL4 having two contact vias (i.e., the contact vias 351 and 353), the cell height CH2 of the standard cell CELL4 is calculated based on the equation (2):

$$CH=WA+\max(PO\_EN+CMG;DV\_OD+DV\_W+0.5\times DV\_DV;CMG+DV\_OD+DV)\times 2 \quad (2)$$

CH corresponds to the cell height CH2 of the standard cell CELL4, WA corresponds to the width W2 of the active regions 311-312, PO_EN corresponds to a distance between the active regions 311-312 and an edge of the gate 331 crossing thereabove, CMG corresponds to the edge of the gate 331 and a first boundary of the standard cell CELL4, DV_OD corresponds to a distance between the active regions 311-312 and the contact via 351, DV_W corresponds to a width of the contact via 351, DV_DV corresponds to a distance between a contact via 352 in the standard cell CELL5 and the contact via 351, and max(PO_EN+CMG;DV_OD+DV W+0.5×DV_DV;CMG+DV_)D+DV) corresponds to a greatest value among values within the brackets. The contact vias 351-352 are separated by a second boundary of the standard cell CELL4.

With reference to FIGS. 2A-3C, in some embodiments, the width W1 of the active regions 211-212 is different from the width W2 of the active regions 311-312. In various embodiments, the width W1 of the active regions 211-212 is smaller than the width W2 of the active regions 311-312.

Figure 5:
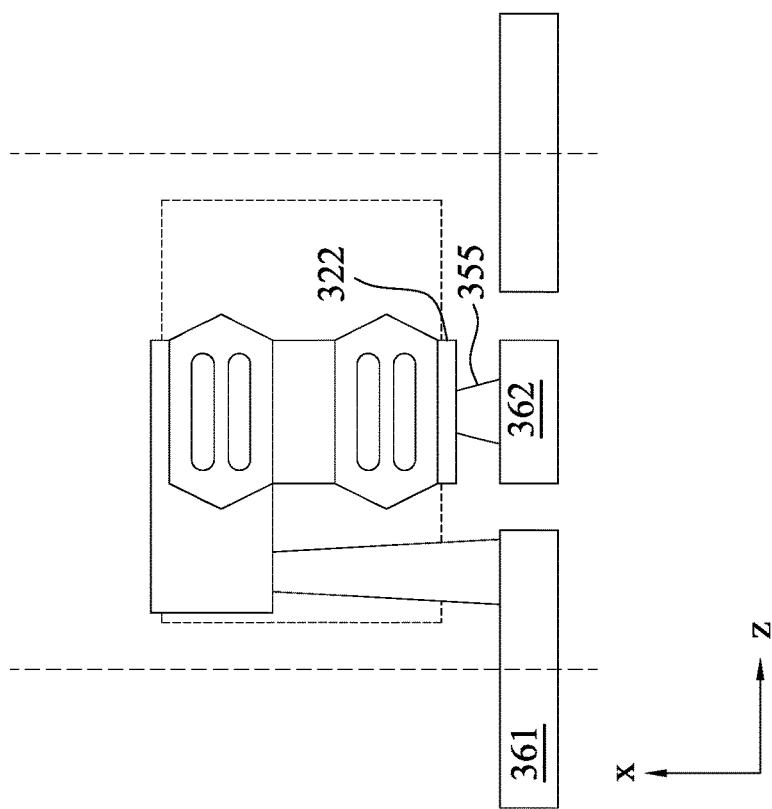
FIG. 5 is a cross-sectional diagram of an integrated circuit, in accordance with some embodiments.
Figure 4:
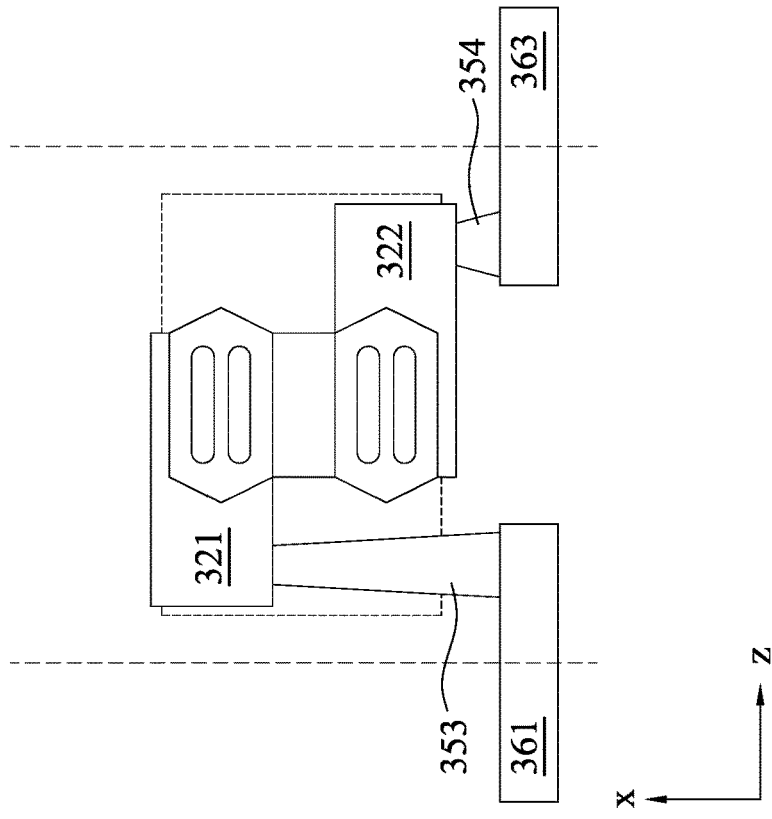
FIG. 4 is a cross-sectional diagram of an integrated circuit, in accordance with some embodiments.

Reference is now made to FIGS. 4-5. FIGS. 4-5 are cross-sectional diagrams of integrated circuits, in accordance with some embodiments. With respect to the embodiments of FIGS. 1-3C, like elements in FIGS. 4-5 are designated with the same reference numbers for ease of understanding.

Compared with the integrated circuit 30 in FIG. 3C, the conductive lines 361-363 are configured as power rails to provide supply voltages, for example, VDD and VSS, to the integrated circuits 40-50, and are arranged on the back side of the integrated circuits 40-50.

In some embodiments, as shown in FIG. 4, the conductive segment 321 receives the supply voltage VSS from the conductive line 361 through the contact via 353 for the active regions 311 in the NMOS structure, and the conductive segment 322 receives the supply voltage VDD from the conductive line 363 through the via 354 for the active regions 312 in the PMOS structure below the NMOS structure along z direction. The conductive segments 321-322 extend along x direction.

With reference to FIG. 5, compared with FIG. 4, the conductive segment 322 has a portion to be coupled to the conductive line 362 right below the active regions 311-312 through the via 355 for receiving the supply voltage VDD.

Figure 6B:
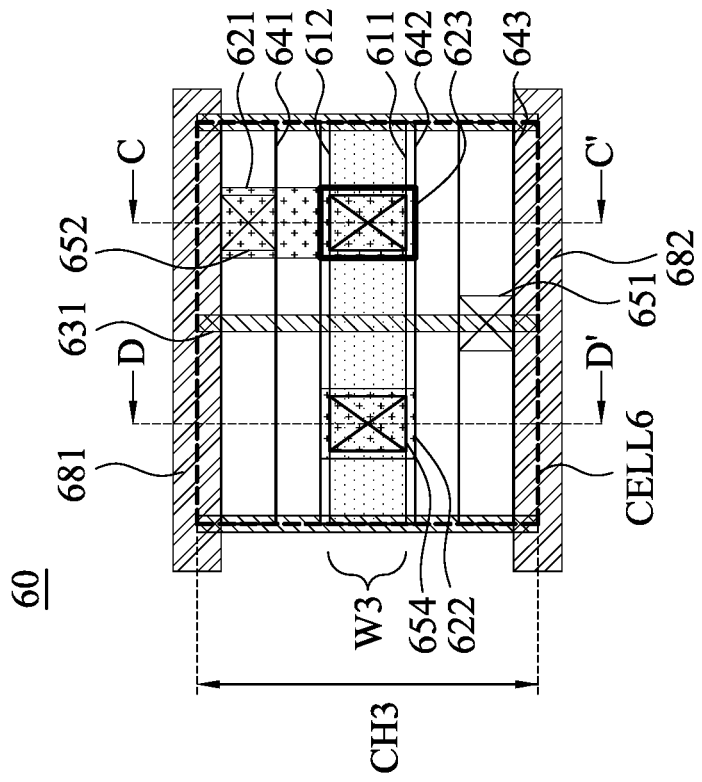
FIG. 6B is a layout diagram in a plan view corresponding to the circuit in FIG. 6A, and FIGS. 6C-6D are cross-sectional diagrams corresponding to the circuit in FIG. 6A along lines C-C' and D-D' in FIG. 6B, in accordance with some embodiments.
Figure 6A:
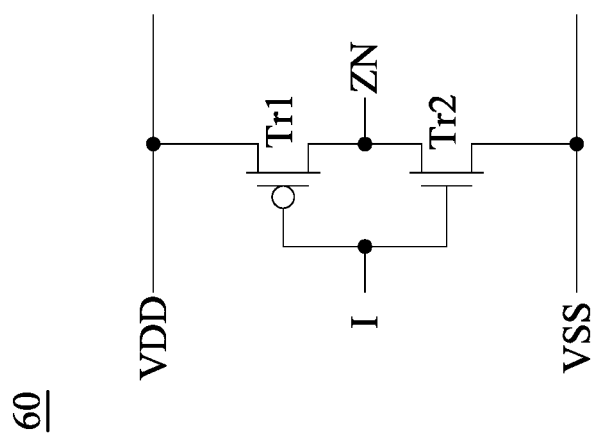
FIG. 6A is a schematic diagram of a circuit.
Figure 6D:
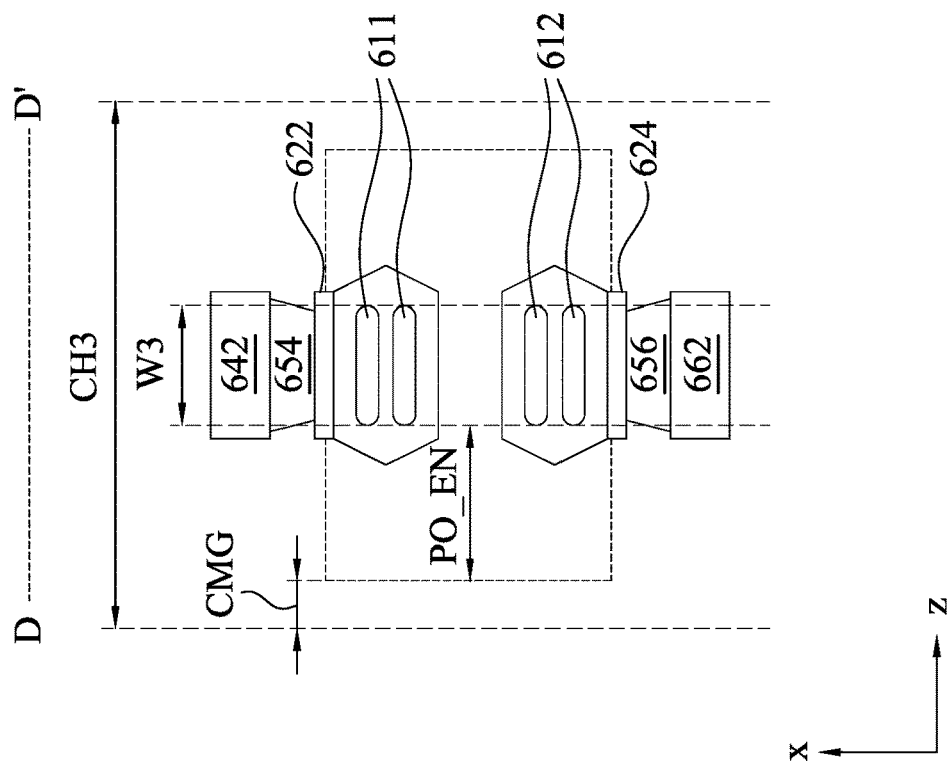
FIG. 6E is another layout diagram in a plan view corresponding to the circuit in FIG. 6A, in accordance with another embodiment.
Figure 6C:
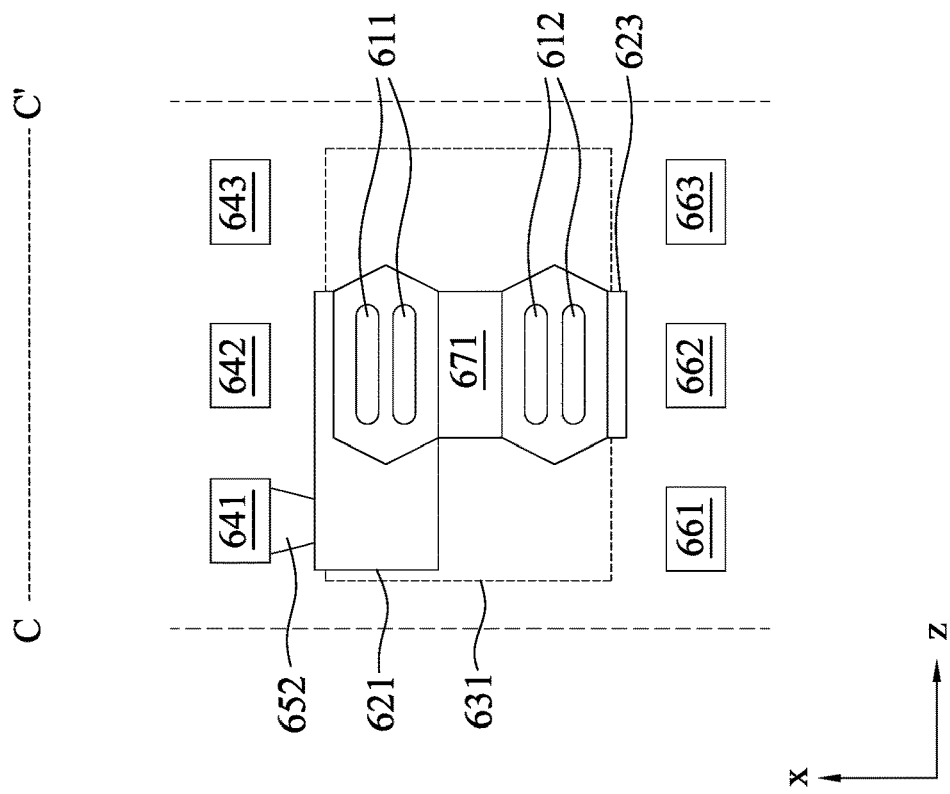

Reference is now made to FIG. 6A-6D. FIG. 6A is a schematic diagram of a circuit 60, FIG. 6B is a layout diagram in a plan view corresponding to the circuit 60 in FIG. 6A, and FIGS. 6C-6D are cross-sectional diagrams corresponding to the circuit 60 in FIG. 6A along lines C-C' and D-D' in FIG. 6B, in accordance with some embodiments.

The circuit 60 is configured as an inverter 60 and includes a P-type transistor Tr1 and a N-type transistor Tr2 that are coupled between the power rails providing the supply voltages VDD and VSS. Gates of the transistors Tr1-Tr2 are coupled together to an input terminal I, and drains of the transistors Tr1-Tr2 are coupled together to an output terminal ZN.

In FIGS. 6B-6D, the circuit 60 corresponds to a cell CELL6 having a cell height CH3. The cell CELL6 includes active regions 611-612 configured with respect to the active regions 111-112 in FIG. 1, conductive segments 621-622 configured with respect to the conductive segment 121 in FIG. 1, a gate 631 configured with respect to the gates 131-132 in FIG. 1, conductive lines 641-643 configured with respect to the conductive line 141 in FIG. 1, vias 651-654, conductive lines 661-663 configured with respect to the conductive line 161 in FIG. 1 and an interconnect segment 671 configured with respect to the interconnect segment 171 in FIG. 1, and cut layers 681-682. In some embodiments, the cut layers 681-682 remove the overlapping portions of gates in the layout view and define the upper and bottom boundaries of the cell CELL6.

In some embodiments, the conductive segment 621 corresponds to the drains of the transistors Tr1-Tr2, the gate 631 corresponds to the gates of the transistors Tr1-Tr2, and the conductive segments 622 and 624 in FIG. 4D correspond to sources of the transistors Tr2 and Tr1 respectively.

In FIG. 6C, the conductive line 641 corresponds to the output terminal ZN and couples to the conductive segment 621 through the via 652. The cell CELL6 further includes an interconnect segment 671 electrically coupled between the active regions 611-612. In some embodiments, the conductive segment 623 coupled to the active regions 612 is omitted.

In FIG. 6D, the conductive line 642 couples to the conductive segment 622 through the via 654 to transmit the supply voltage VSS, and the conductive line 662 couples to the conductive segment 624 through the via 656 to transmit the supply voltage VDD.

In some embodiments, for the cell CELL6 having no contact vias (e.g., the contact via coupled between the front side conductive line to the bottom active regions or the contact via coupled between the back side conductive line to the top active regions), the cell height CH3 of the cell CELL6 is calculated based on the equation (3):

$$CH=WA+2\times PO\_EN+2\times CMG$$

CH corresponds to the cell height CH3 of the cell CELL6, WA corresponds to the width W3 of the active regions 611-612, PO_EN corresponds to a distance between the active regions 611-612 and an edge of the gate 631 crossing thereabove, and CMG corresponds to the edge of the gate 631 and a boundary of the cell CELL6.

Figure 6E:
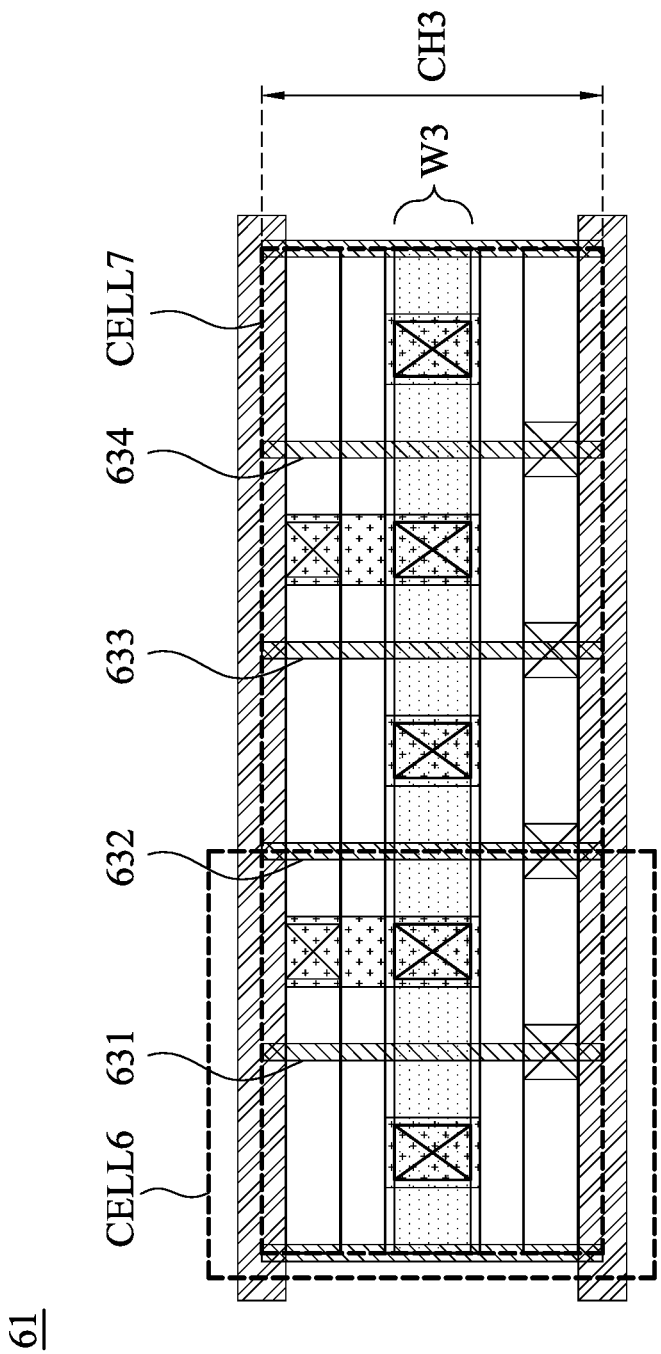

Reference is now made to FIG. 6E. FIG. 6E is another layout diagram in a plan view corresponding to the circuit 60 in FIG. 6A, in accordance with another embodiment. Compared with FIG. 6B, the cell CELL7 of the integrated circuit 61 further includes duplicated structures, for example, gates 632-634, configured with respect to the cell CELL6 and provides at least four times driving capacity than the cell CELL6 in FIG. 6B, in some embodiments.

Figure 7A:
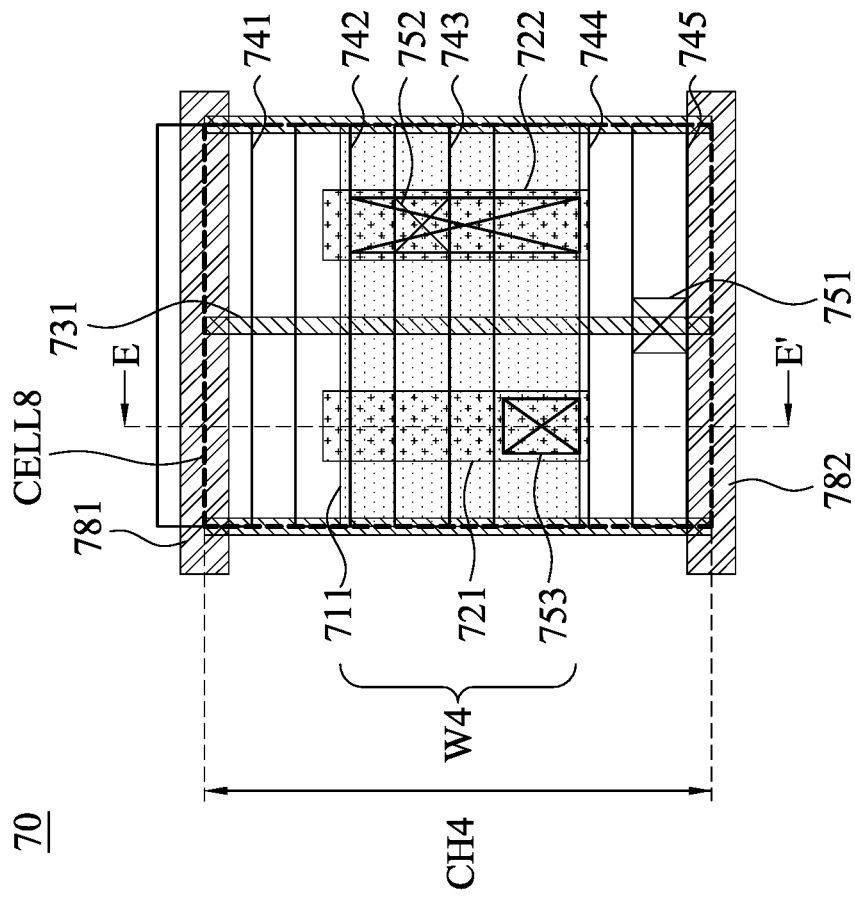
FIG. 7A is a layout diagram in a plan view of an integrated circuit corresponding to the circuit in FIG. 6A.
Figure 7B:
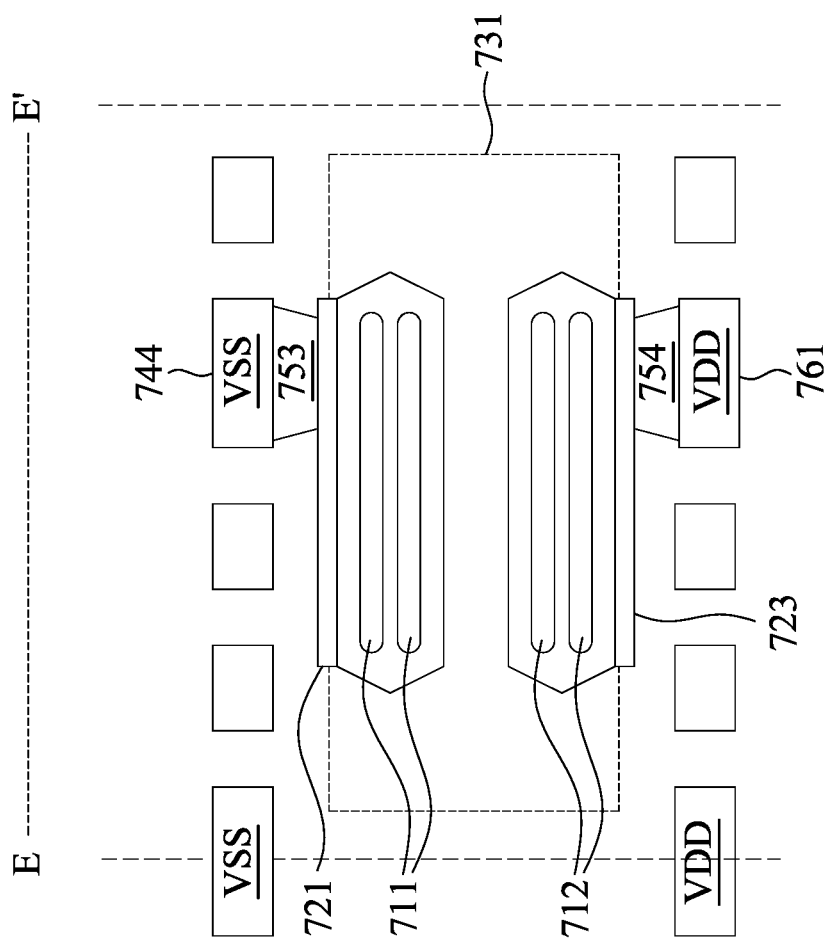
FIG. 7B is a cross-sectional diagram of the integrated circuit along line E-E' in FIG. 7A, in accordance with some embodiments.
Figure 7C:
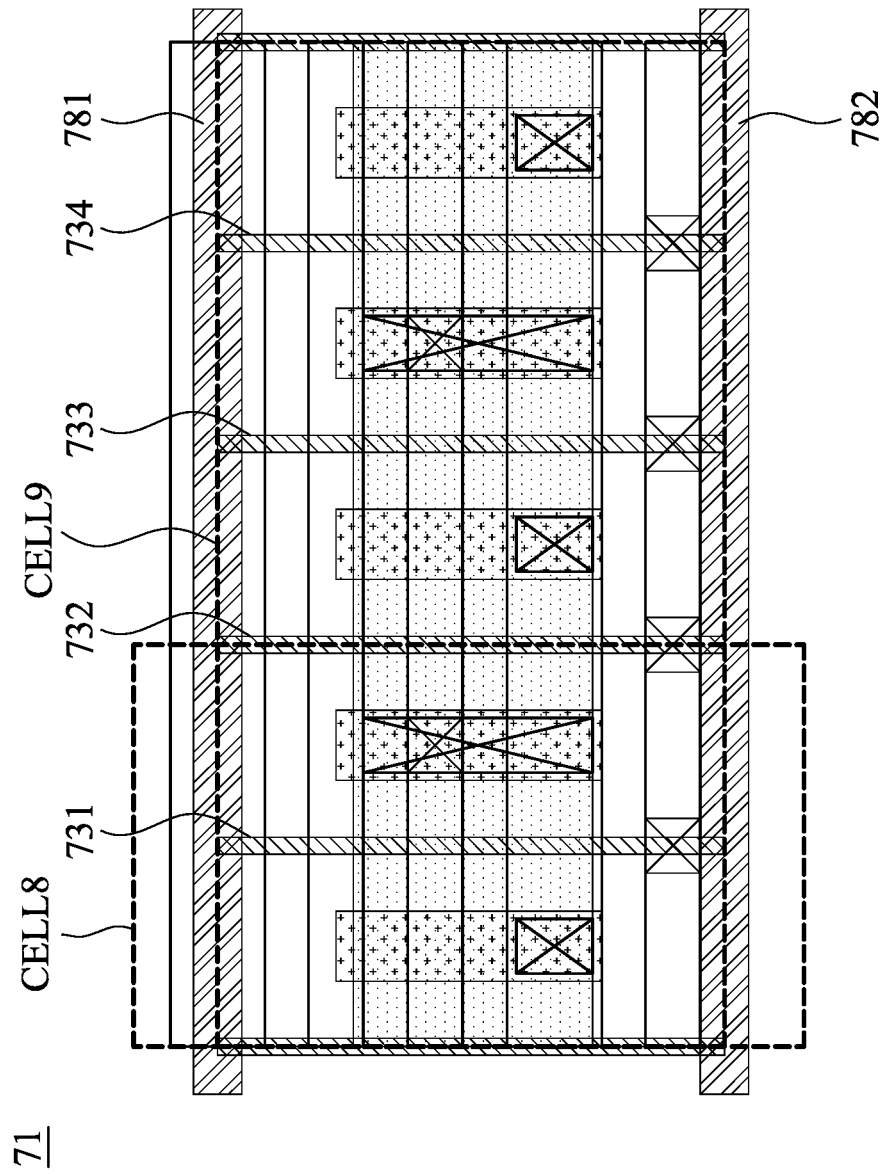
FIG. 7C is another layout diagram in a plan view of another integrated circuit corresponding to the circuit in FIG. 6A, in accordance with another embodiment.

Reference is now made to FIGS. 7A-7C. FIG. 7A is a layout diagram in a plan view of an integrated circuit 70 corresponding to the circuit 60 in FIG. 6A, and FIG. 7B is a cross-sectional diagram of the integrated circuit 70 along line E-E' in FIG. 7A, in accordance with some embodiments.

Compared with the cell CELL6 in FIG. 6B, the cell CELL8 of the integrated circuit 70 has a cell height CH4 which is 1.5 times larger than the cell height CH3 in FIG. 6B, and the active regions 711-712 have a width W4 larger than the width W3 of the active regions 611-612. Accordingly, in some embodiments, the integrated circuit 70 provides faster operational speed than that of the integrated circuit 60. Furthermore, due to larger cell height of the cell CELL8, the cell CELL8 includes more conductive lines, for example, five conductive lines 741-745 for signal routing in integrated circuit design by the automatic placement and routing (APR) tools than the cell CELL6 in FIG. 6B.

In FIG. 7B, the conductive line 744 couples to the conductive segment 721 through the via 753 to transmit the supply voltage VSS, and the conductive line 761 couples to the conductive segment 723 through the via 754 to transmit the supply voltage VDD.

Reference is now made to FIG. 7C. FIG. 7C is a layout diagram in a plan view of another integrated circuit 71 corresponding to the circuit 60 in FIG. 6A, in accordance with another embodiment. Compared with FIG. 6A, the cell CELL9 of the integrated circuit 71 further includes duplicated structures, for example, gates 732-734, configured with respect to the cell CELL8 and provides at least four times driving capacity than the cell CELL8 in FIG. 7A, in some embodiments.

Figure 8A:
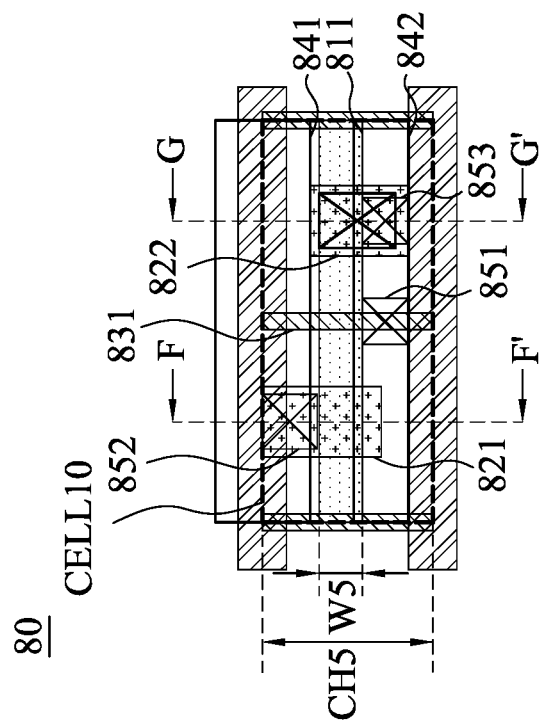
FIG. 8A is a layout diagram in a plan view of an integrated circuit corresponding to the circuit in FIG. 6A, and FIGS. 8B-8C are cross-sectional diagrams of the integrated circuit along lines F-F' and G-G' in FIG. 8A, in accordance with some embodiments.
Figure 8C:
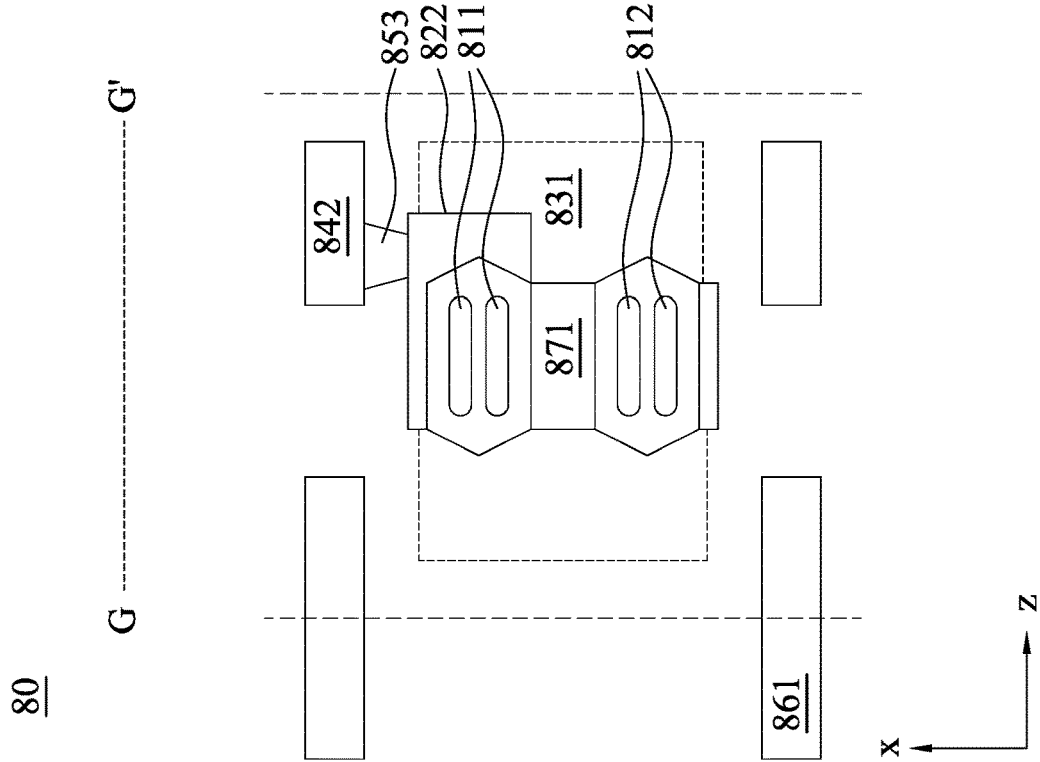
FIG. 8D is a layout diagram in a plan view of another integrated circuit corresponding to the circuit in FIG. 6A, in accordance with another embodiment.
Figure 8B:
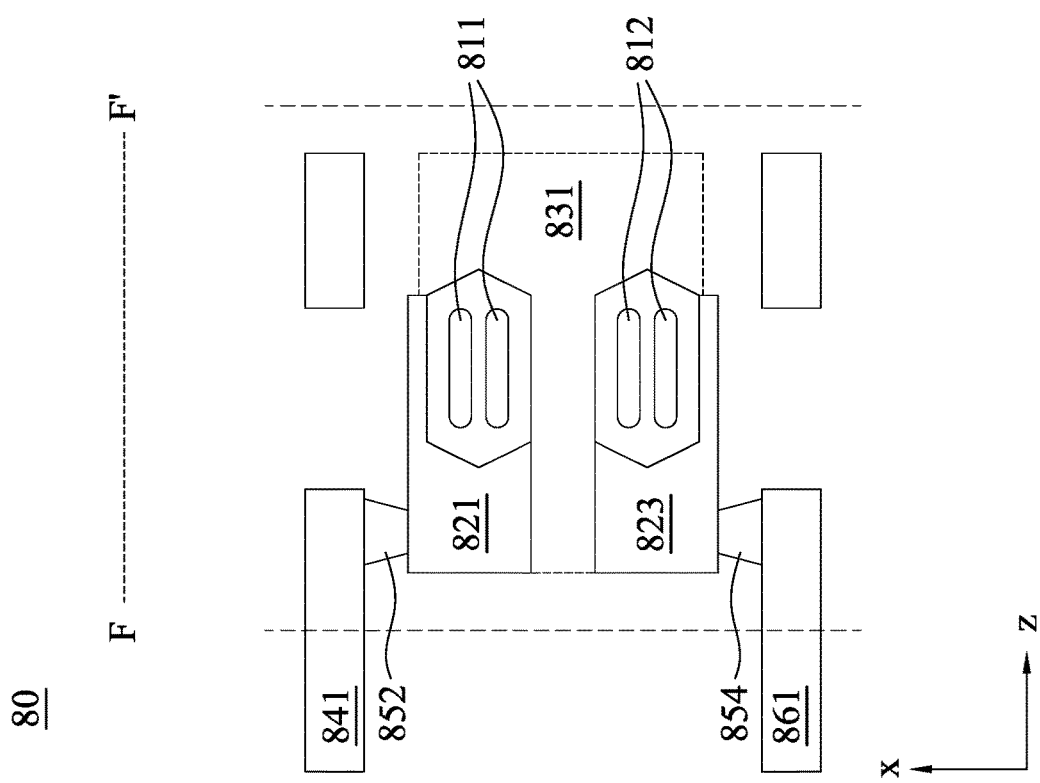

Reference is now made to FIGS. 8A-8C. FIG. 8A is a layout diagram in a plan view of an integrated circuit 80 corresponding to the circuit 60 in FIG. 6A, and FIGS. 8B-8C are cross-sectional diagrams of the integrated circuit 80 along lines F-F' and G-G' in FIG. 8A, in accordance with some embodiments.

Compared with the cell CELL6 in FIG. 6B, the cell CELL10 of the integrated circuit 80 has a cell height CH5 which is half of the cell height CH3 in FIG. 6B, and the active regions 811-812 have a width W5 smaller than the width W3 of the active regions 611-612. Due to smaller cell height of the cell CELL10, the cell CELL10 includes less conductive lines, for example, two conductive lines 841-842 for signal routing in integrated circuit design by the automatic placement and routing (APR) tools than the cell CELL6 in FIG. 6B.

With reference to FIG. 8A-8C, in some embodiments, the conductive segments 821 and 823 correspond to the sources of the transistors Tr2 and Tr1 respectively, the gate 831 corresponds to the gates of the transistors Tr1-Tr2, and the conductive segment 822 in FIG. 8C correspond to the drains of the transistors Tr1-Tr2 respectively.

In FIG. 8B, the conductive line 841 couples to the conductive segment 821 through the via 852 to transmit the supply voltage VSS, and the conductive line 861 couples to the conductive segment 823 through the via 854 to transmit the supply voltage VDD.

In FIG. 8C, the conductive line 842 couples to the conductive segment 822 through the via 853 and corresponding to the output terminal ZN. The cell CELL10 further includes an interconnect segment 871 coupled between the active regions 811-812.

Figure 8D:
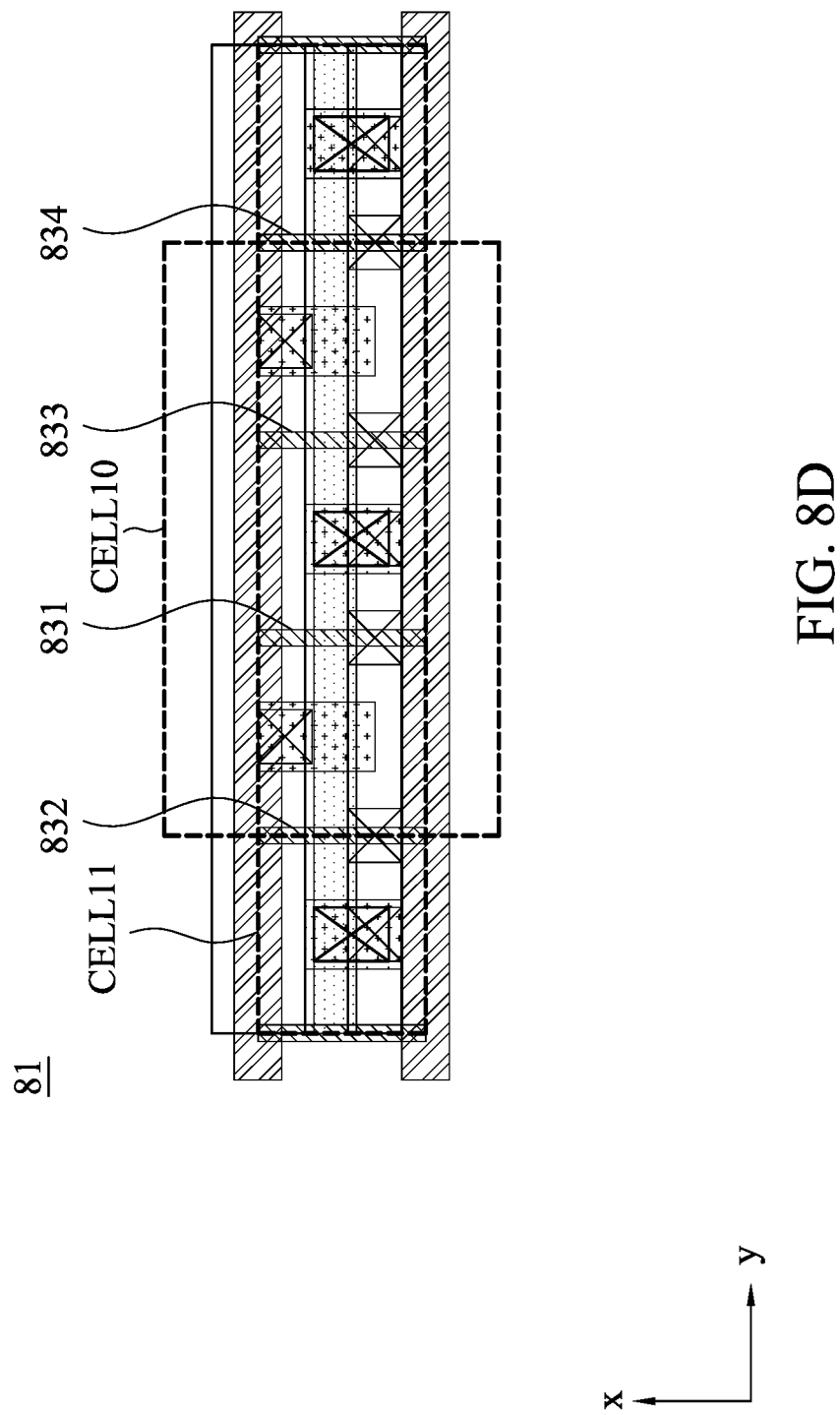

Reference is now made to FIG. 8D. FIG. 8D is a layout diagram in a plan view of another integrated circuit 81 corresponding to the circuit 60 in FIG. 6A, in accordance with another embodiment. Compared with FIG. 8A, the cell CELL11 of the integrated circuit 81 further includes duplicated structures, for example, gates 832-834, configured with respect to the cell CELL10 and provides at least four times driving capacity than the cell CELL10 in FIG. 8A, in some embodiments.

The configurations of FIGS. 2A-8D are given for illustrative purposes. Various implements are within the contemplated scope of the present disclosure.

Figure 9:
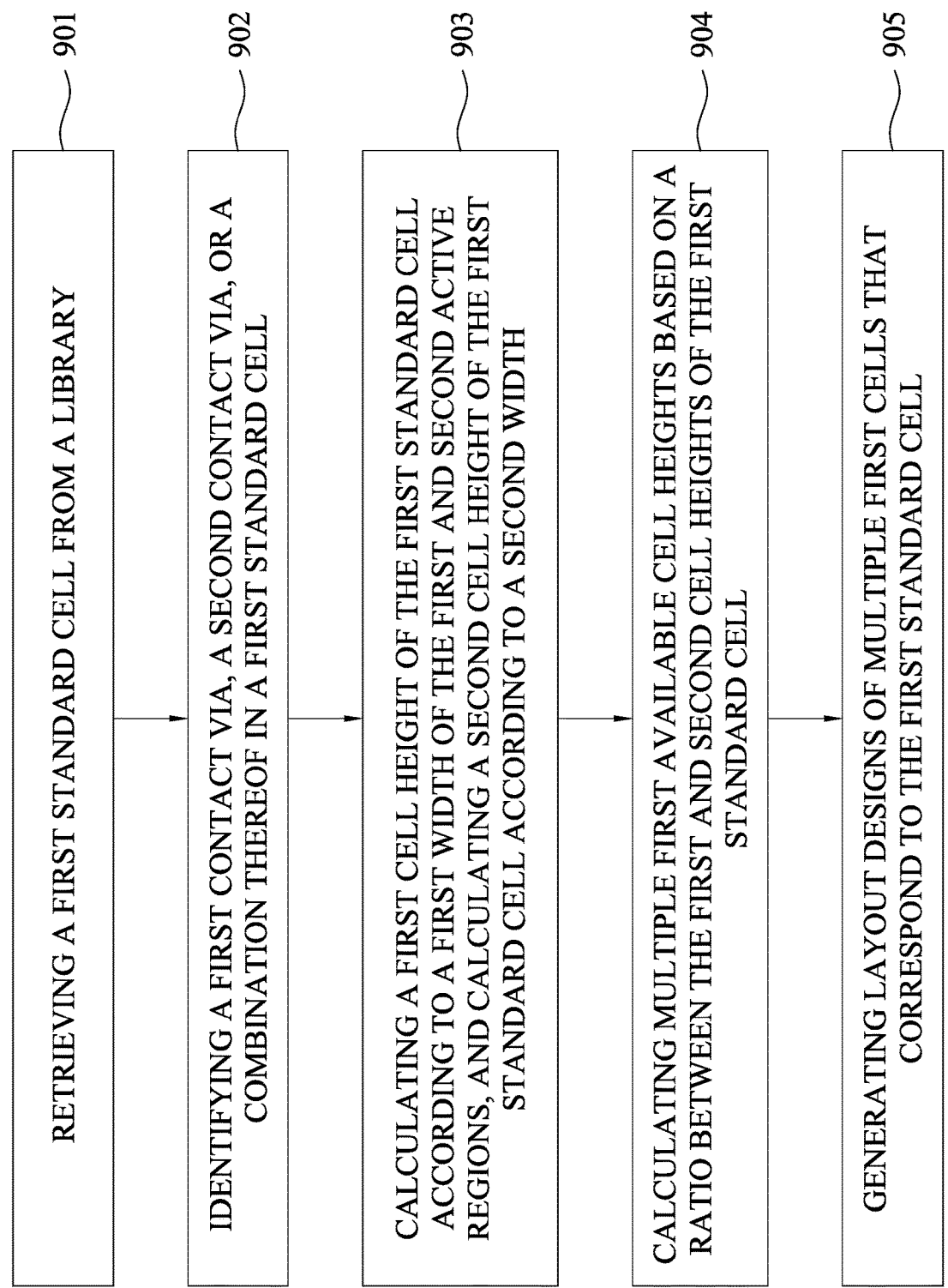
FIG. 9 is a flow chart of a method of manufacturing an integrated circuit, in accordance with some embodiments.

Reference is now made to FIG. 9. FIG. 9 is a flow chart of a method 900 of manufacturing an integrated circuit, in accordance with some embodiments. It is understood that additional operations can be provided before, during, and after the processes shown by FIG. 9, and some of the operations described below can be replaced or eliminated, for additional embodiments of the method. The order of the operations/processes may be interchangeable. Throughout the various views and illustrative embodiments, like reference numbers are used to designate like elements. The method 900 includes operations 901-905 that are described below with reference to the integrated circuits in FIGS. 1-8D, an electronic design automation (EDA) system 1700 in FIG. 17 and a manufacturing system 1800 in FIG. 18. In some embodiments, the method 900 is performed by the processor 1702 in the EDA system 1700.

Figure 17:
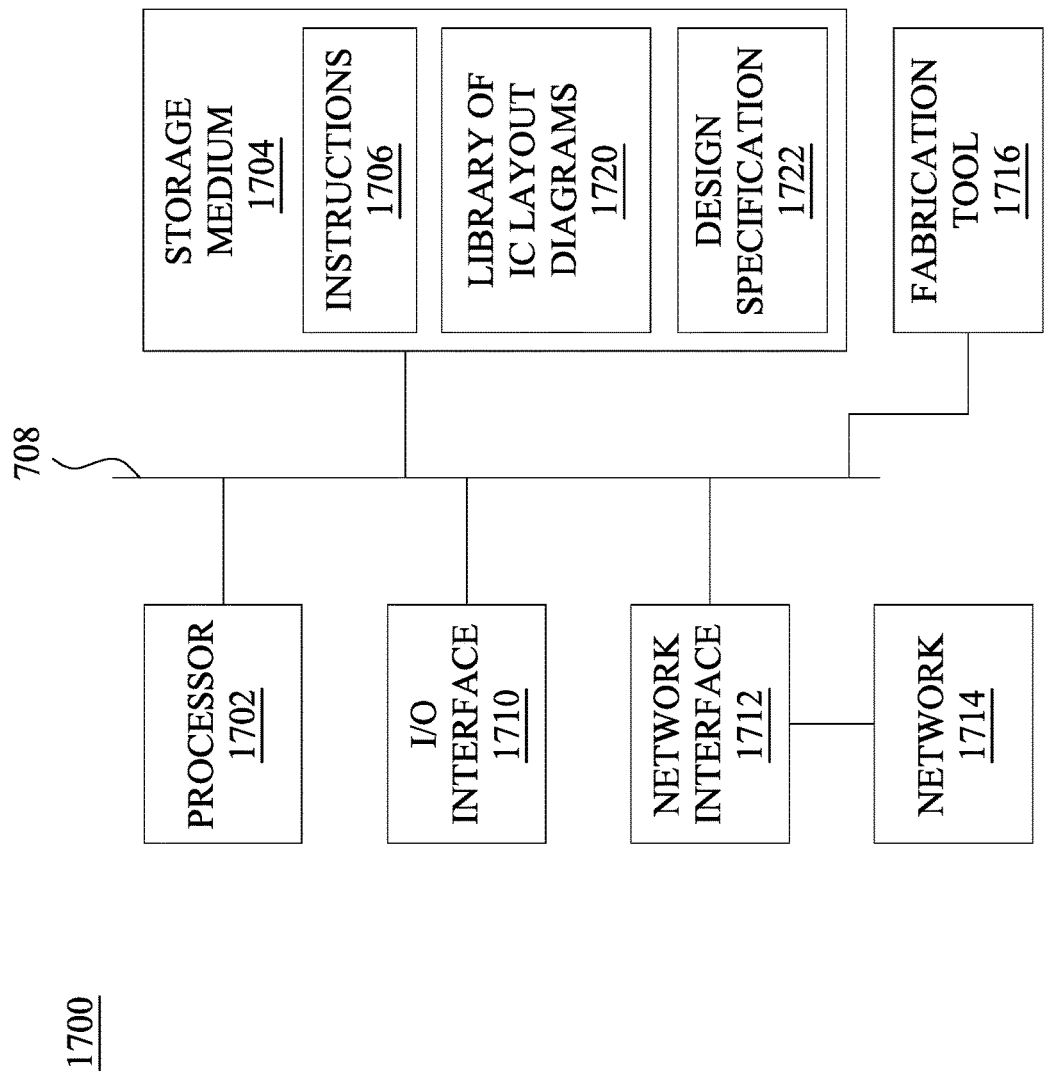
FIG. 17 is a block diagram of a system for designing an integrated circuit layout design, in accordance with some embodiments of the present disclosure.

In operation 901, a first standard cell, for example, one of the cells CELL2-CELL10 in FIGS. 2A-8D, is retrieved from a library 1720 stored in the non-transitory computer readable medium 1704 in FIG. 17, in which the standard cell CELL2 includes a pair of stacked active regions, for example, 211-212.

In operation 902, a first contact via, coupled between a first active region and a first conductive line on a first side of the integrated circuit, a second contact via, coupled between a second active region and a second conductive line on a second side of the integrated circuit, or a combination thereof are identified in the first standard cell. For example, as embodiments in FIGS. 2A-2C, the contact via 251 is identified in the cell CELL2. In the embodiments of FIGS. 3A-3C, the contact vias 351 and 353 are identified in the cell CELL4.

In operation 903, in response to the identification, a first cell height of the first standard cell according to a first width of the first and second active regions is calculated, and a second cell height of the first standard cell according to a second width, smaller than the first width, of the first and second active regions. For example, according to the manufacture process of the integrated circuit, a maximum width of the active regions is around 60 nanometers and is referred to as the first width of the active regions. An appliable width of the active regions, based on the design (e.g., performance, speed, area, power consumption, etc.) of the integrated circuit, is around 17 nanometers and referred to as the second width of the active regions. In the embodiments of FIGS. 2A-2C as there are two contact vias in a cross-sectional view along one line along y direction in the cell CELL2, by applying the maximum and typical widths of the active regions respectively as WA in the equation (1), the first and second cell heights of the cell CELL2 are obtained based on the equation (1). For example, in some embodiments, the first and second cell heights of the cell CELL2 are 118 and 75 nanometers respectively.

Similarly, for example, in the embodiments of FIGS. 3A-3C as there is only contact via in a cross-sectional view along one line along y direction in the cell CELL4, the first and second cell heights of the cell CELL4 are obtained based on the equation (2). For example, in some embodiments, the first and second cell heights of the cell CELL4 are 104 and 71 nanometers respectively.

In addition, for example, in the embodiments of FIGS. 6A-6D as there is no contact via in a cross-sectional view along one line along y direction in the cell CELL6, the first and second cell heights of the cell CELL6 are obtained based on the equation (3). For example, in some embodiments, the first and second cell heights of the cell CELL6 are 102 and 59 nanometers respectively.

Alternatively stated, based on the discussion above, the first and second cell heights of the standard cell are calculating according to a number of contact vias included in the standard cell.

In operation 904, multiple available cell heights are calculated based on a ratio between the first and second cell heights of the first standard cell. Alternatively stated, a cell height range of the first standard cell is obtained based on the ratio between the first and second cell heights of the first standard cell. For example, for the configurations of two contact vias in the embodiments of FIGS. 2A-2C, the ratio between the first and second cell heights of the cell CELL2 is 1.57. For the configurations of one contact vias in the embodiments of FIGS. 3A-3C, the ratio between the first and second cell heights of the cell CELL4 is 1.52. For the configurations of no contact vias in the embodiments of FIGS. 6A-6D, the ratio between the first and second cell heights of the cell CELL6 is 1.73.

In some embodiments, the available cell heights are smaller than the maximum cell height and in multiples of half of the second cell height and the minimum of the available cell heights is set in the operation of the method 900 of identifying the power rails in the standard cell. Alternatively stated, a ratio between the second cell height and each of the available cell height is smaller than the ratio between the first cell height of the standard cell over the second cell height of the standard cell.

For example, as shown in FIGS. 2A-2C, power rails are arranged on the front side of the integrated circuit 10 and one of the power rails is coupled to the active regions through the contact via, the minimum of the available cell heights of the cell CELL2 is set to be equal to the second cell height (e.g., 75 nanometers), accordingly, the cell height range of the cell CELL2 is 1 to 1.5 times of the second cell height. Alternatively stated, the available cell heights are 1 and 1.5 times of the second cell height. Similarly, as shown in FIGS. 3A-3C, power rails are arranged on both the front and back sides of the integrated circuit and two of the power rails are coupled to the active regions through two contact vias, the minimum of the available cell heights of the cell CELL4 is set to be equal to the second cell height (e.g., 71 nanometers), accordingly, the cell height range of the cell CELL4 is 1 to 1.5 times of the second cell height.

Furthermore, in the embodiments shown in FIGS. 6A-6D, power rails are arranged on both the front and back sides of the integrated circuit and no the power rails is coupled to the active regions through two contact vias, the minimum of the available cell heights of the cell CELL6 is set to be equal to half of the second cell height (e.g., 59 nanometers), accordingly, the cell height range of the cell CELL6 is 0.5 to 1.5 times of the second cell height.

In some embodiments, the method 900 further includes operations of adjusting the second width (e.g., the typical width) of the active regions based on the design of the integrated circuit. For example, the second width of the active regions is increased to obtain faster speed or better calculation performance. Accordingly, the second cell height of the standard cell is adjusted for calculation.

Figure 10:
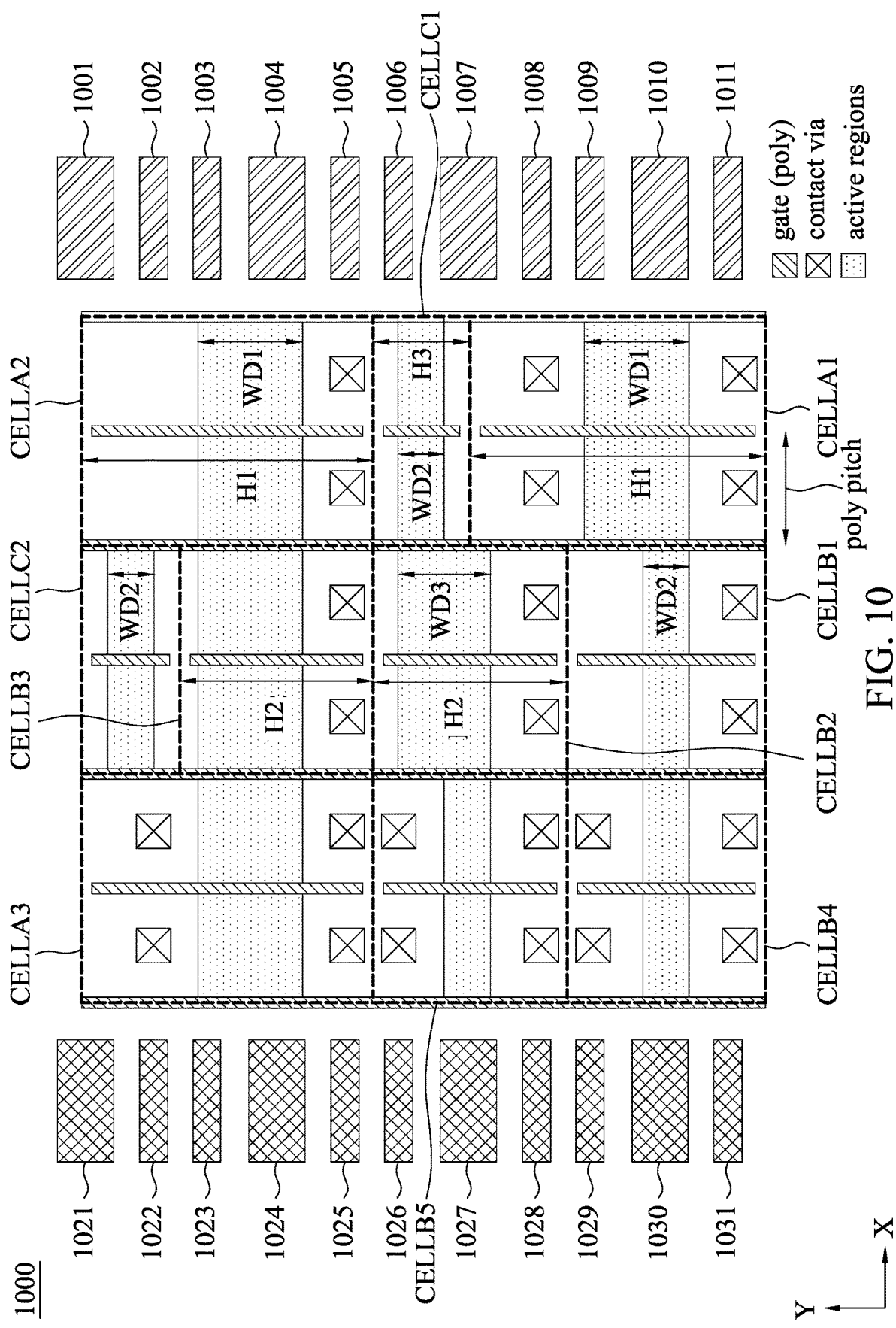
FIG. 10 is a layout diagram in a plan view of an integrated circuit, in accordance with some embodiments.

In operation 905, layout designs of multiple first cells that correspond to the standard cell are generated, in which each of the first cells has one of the available cell heights. For example, as shown in FIG. 10 that is a layout diagram in a plan view of an integrated circuit 1000, the integrated circuit 1000 includes multiple cells CELLA1-CELLA2, CELLB1-CELLB5, and CELLC1-CELLC2. In some embodiments, the cells CELLA2 and CELLB3, that abut each other, correspond to the standard cell CELL2 and have the cell height H1 (equals to 1.5 times second cell height) and the cell height H2 (equals to the second cell height) respectively. In addition, the width of active regions in the cells CELLA2 and CELLB3 are the same, e.g., the WD1. The other configurations of contact vias as shown in FIGS. 3A-3C and FIGS. 6A-6D are similar to that the example of FIGS. 2A-3C given above. Hence, the repetitious descriptions are omitted here.

In some embodiments, the cells generated based on available cell heights of different standard cells are implemented in an integrated circuit. For example, in the integrated circuit 1000 of FIG. 10, the cells CELLA2 and CELLB3 correspond to the standard cell CELL2, and the cell CELLC2 corresponds to the cell CELL6 and abuts the cells CELLA2 and CELLB3 in the layout view. In addition, the width WD2 of the active regions in the cell CELLC2 is different from the width WD1 of the active regions in the cells CELLA2 and CELLB3.

In some embodiments, as shown in FIG. 10, the cells CELLA1, CELLB1 and CELLC1, having different cell heights H1-H3, are configured with respect to, for example, the cells CELL4, CELL2, and CELL6 separately. The cells CELLA1, CELLB1 and CELLC1 have different numbers of contact vias. For example, the cell CELLA1 has two contact vias on opposite sides of the active regions in one poly pitch, the cell CELLB1 has one contact via on one side of the active regions in one poly pitch, and the cell CELLC1 has no contact via. In addition, the boundary of the active regions of the cell CELLB1 is aligned with a boundary of the active regions of the cell CELLA1 along x direction. In some embodiments, the cell height H1 is the largest as the cell height H3 is the smallest among the cell heights H1-H3.

In some embodiments, the cell CELLB4 is configured with respect to the cell CELL4 and has the same number of contact vias as the cell CELLA1. The width WD2 of the active regions in the cell CELLB4 is smaller than the width WD1 of active regions in the cell CELLA1 and equals to the width of the active regions in the cell CELLC1.

In some embodiments, the method 900 further includes operations of saving the layout designs of the generated layout of the mentioned cells into the library 1720 stored in the non-transitory computer readable medium 1704 for signal routing or EDA tool utilization.

In some embodiments, the method 900 further includes operations of manufacturing at least first one element in the integrated circuit based on the layout designs of the first cells and further based on the layout diagram shown in FIGS. 2A-10.

The configurations of FIG. 9 are given for illustrative purposes. Various implements are within the contemplated scope of the present disclosure. For example, in some embodiments, as shown in FIG. 10, the method 900 further includes operations of adjusting the width of active regions or the cell heights of certain cells in the integrated circuit 1000 for optimizing layout design and PPA of the integrated circuit 1000.

Figure 11:
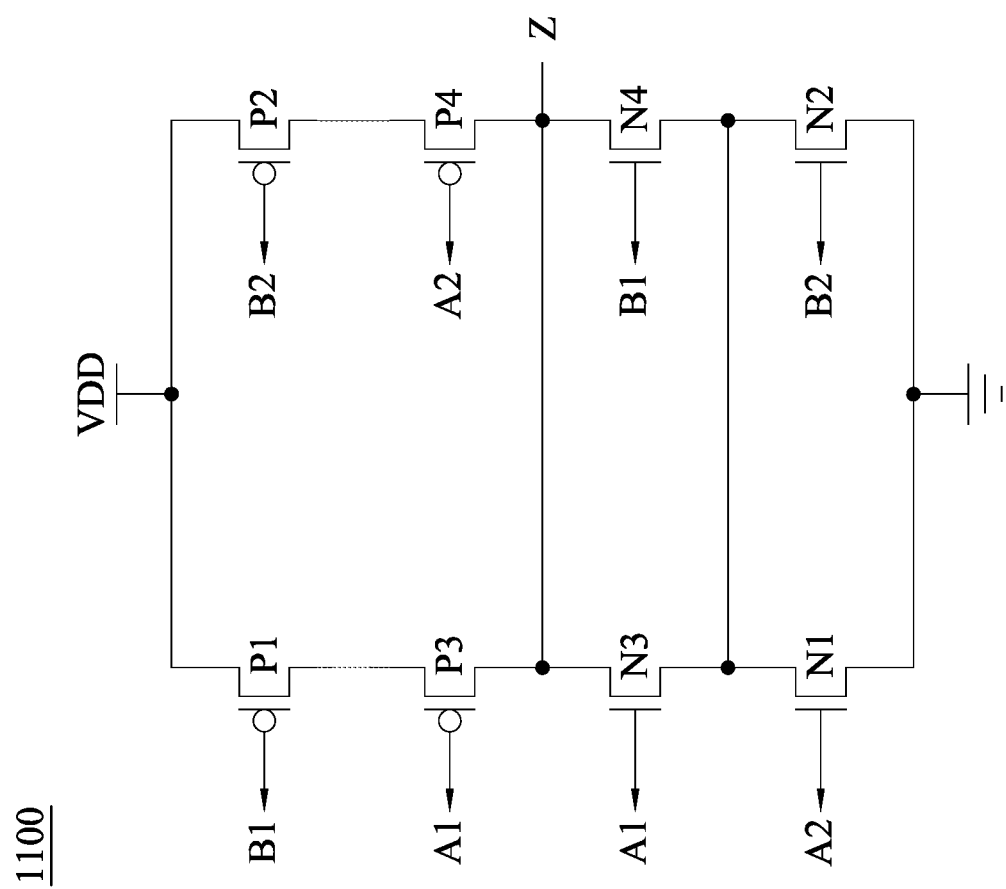
FIG. 11 is a schematic diagram of a circuit, in accordance with some embodiments.

Reference is now made to FIG. 11. FIG. 11 is a schematic diagram of a circuit 1100, in accordance with some embodiments. As shown in FIG. 11, the circuit 1100 includes P type transistors P1-P4 and N type transistors N1-N4. The transistors P1-P2 are coupled to the supply voltage VDD and receive signals B1-B2 at gate terminals thereof respectively. The drain terminal of the transistor P1 is coupled to the source terminal of the transistor P3, and the drain terminal of the transistor P2 is couple to the source terminal of the transistor P4. The transistors P3-P4 receives signals A1-A2 at gate terminals thereof respectively and the drain terminals thereof are coupled to an output terminal Z. The transistors N1-N2 are coupled to the supply voltage VSS and receive signals A2 and B2 at gate terminals thereof respectively, the drain terminals thereof are coupled together to the source terminals of the transistors N3-N4. The transistors N3-N4 receives signals A1 and B1 at gate terminals thereof respectively and the drain terminals thereof are coupled to the output terminal Z.

Figure 12A:
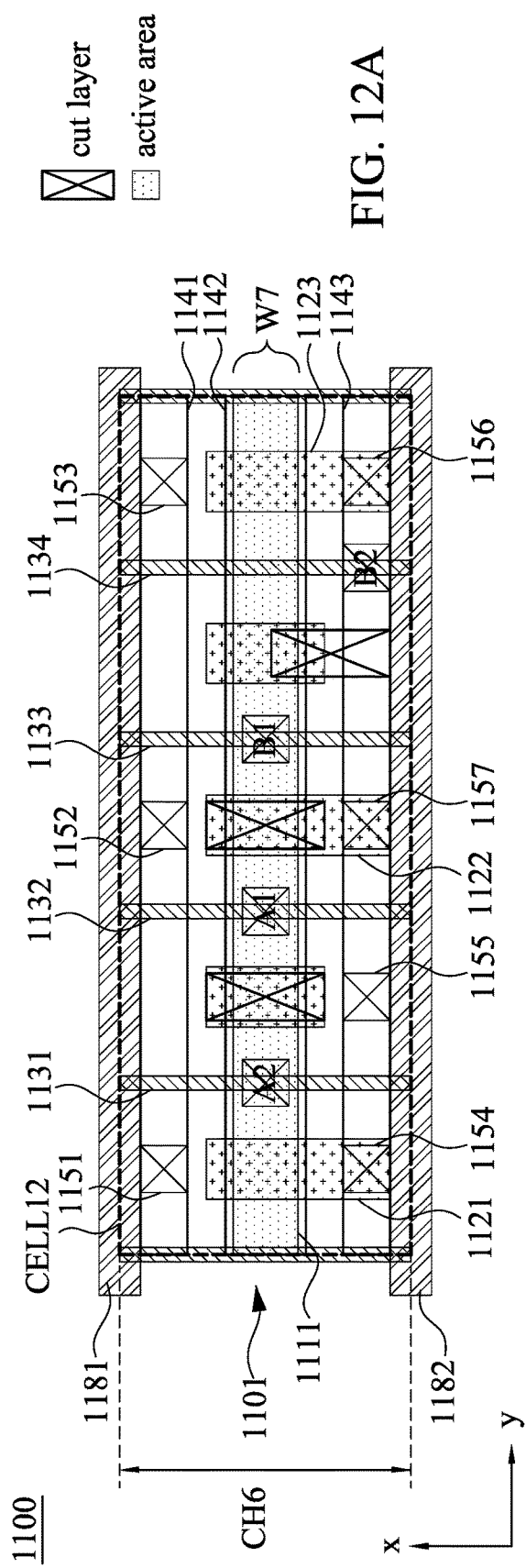
FIGS. 12A-12B are layout diagrams in a plan view of front and back portions corresponding to the circuit in FIG. 11.
Figure 12B:
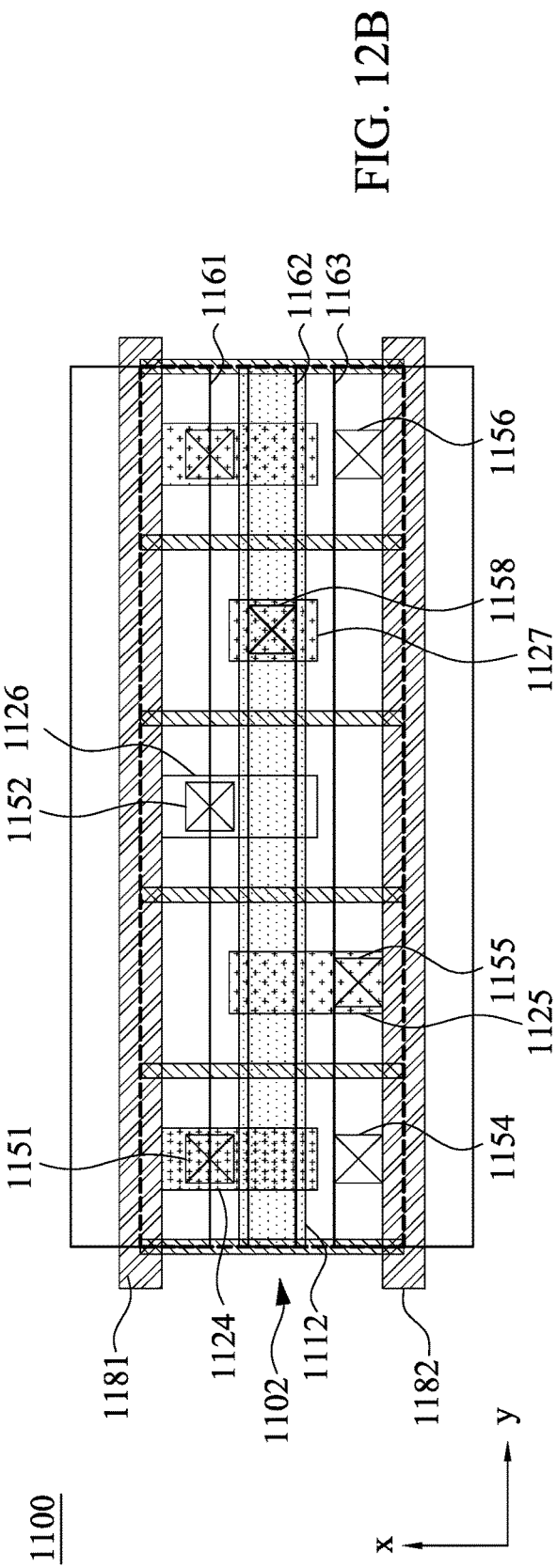
Figure 12C:
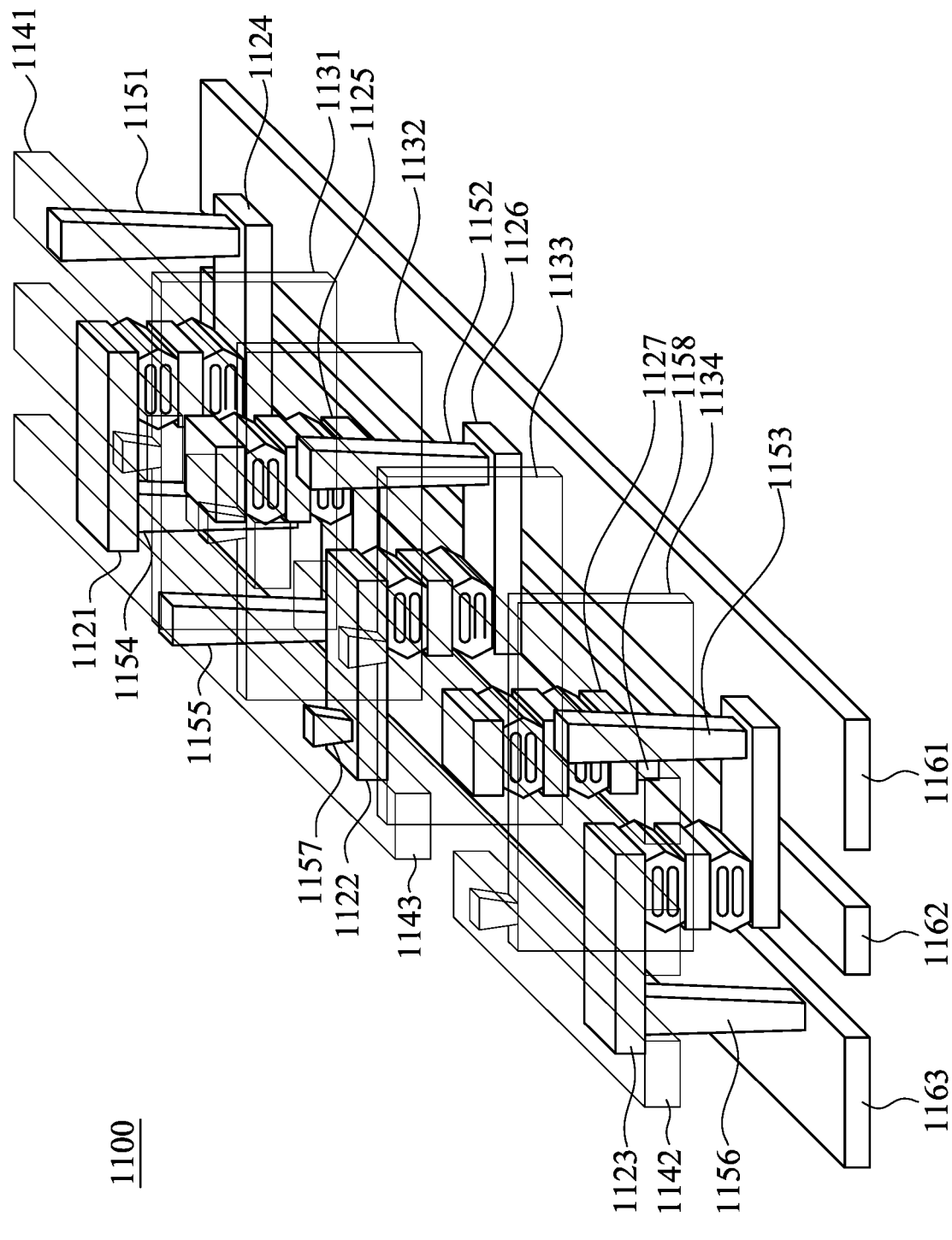
FIG. 12C is a three-dimensional view of the layout diagrams in FIGS. 12A-12B, in accordance with some embodiments.

Reference is now made to FIGS. 12A-12C. FIGS. 12A-12B are layout diagrams in a plan view of front portion 1101 and the back portion 1102 corresponding to the circuit 1100 in FIG. 11, and FIG. 12C is a three-dimensional view of the layout diagrams in FIGS. 12A-12B, in accordance with some embodiments.

In FIGS. 12A-12C the cell CELL12 includes active regions 1111-1112 configured with respect to the active regions 111-112 in FIG. 1, conductive segments 1121 and 1127 configured with respect to the conductive segments 121-122 in FIG. 1, gates 1131-1134 configured with respect to the gates 131-132 in FIG. 1, conductive lines 1141-1143 configured with respect to the conductive line 141 in FIG. 1, contact vias 1151 and 1156 configured with respect to the contact vias 151 and 153 in FIG. 1, and conductive lines 1161-1163 configured with respect to the conductive line 161 in FIG. 1. In some embodiments, the signals A1-B2 are transmitted to the integrated circuit 1100 through the gates 1131-1134 and conductive lines on the front side.

As shown in FIGS. 12A-12C, the cell CELL12 has a cell height CH6. In some embodiments, the cell CELL12 is configured with respect to, for example, the cell CELL4 in FIGS. 3A-3C that has two contact vias in a poly pitch. For illustration, the conductive line 1141 couples to the conductive segments 1124-1126 through the contact vias 1151-1153. The conductive line 1143 couples the conductive segment 1125 through the contact via 1155. The conductive line 1163 couples the conductive segments 1121 and 1123 through the contact vias 1154 and 1156. The conductive line 1162 is coupled to the conductive segment 1127 through the via 1158. In some embodiments, the conductive line 1162 is configured to provide the supply voltage VDD to the integrated circuit 1100, and the conductive line 1163 is configured to provide the supply voltage VSS to the integrated circuit 1100.

Figure 13A:
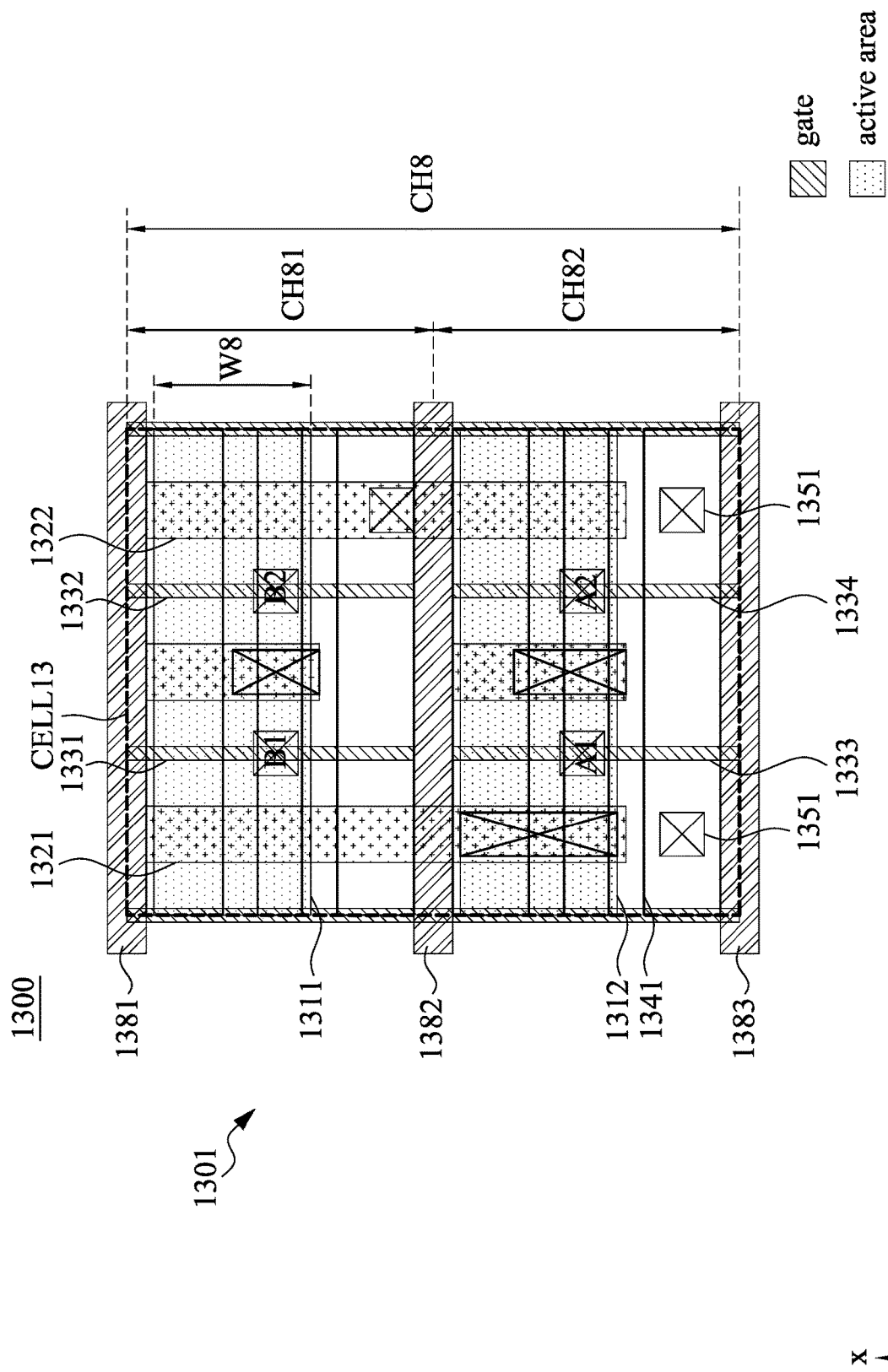
FIGS. 13A-13B are layout diagrams in a plan view of front and back portions corresponding to the circuit in FIG. 11.
Figure 13B:
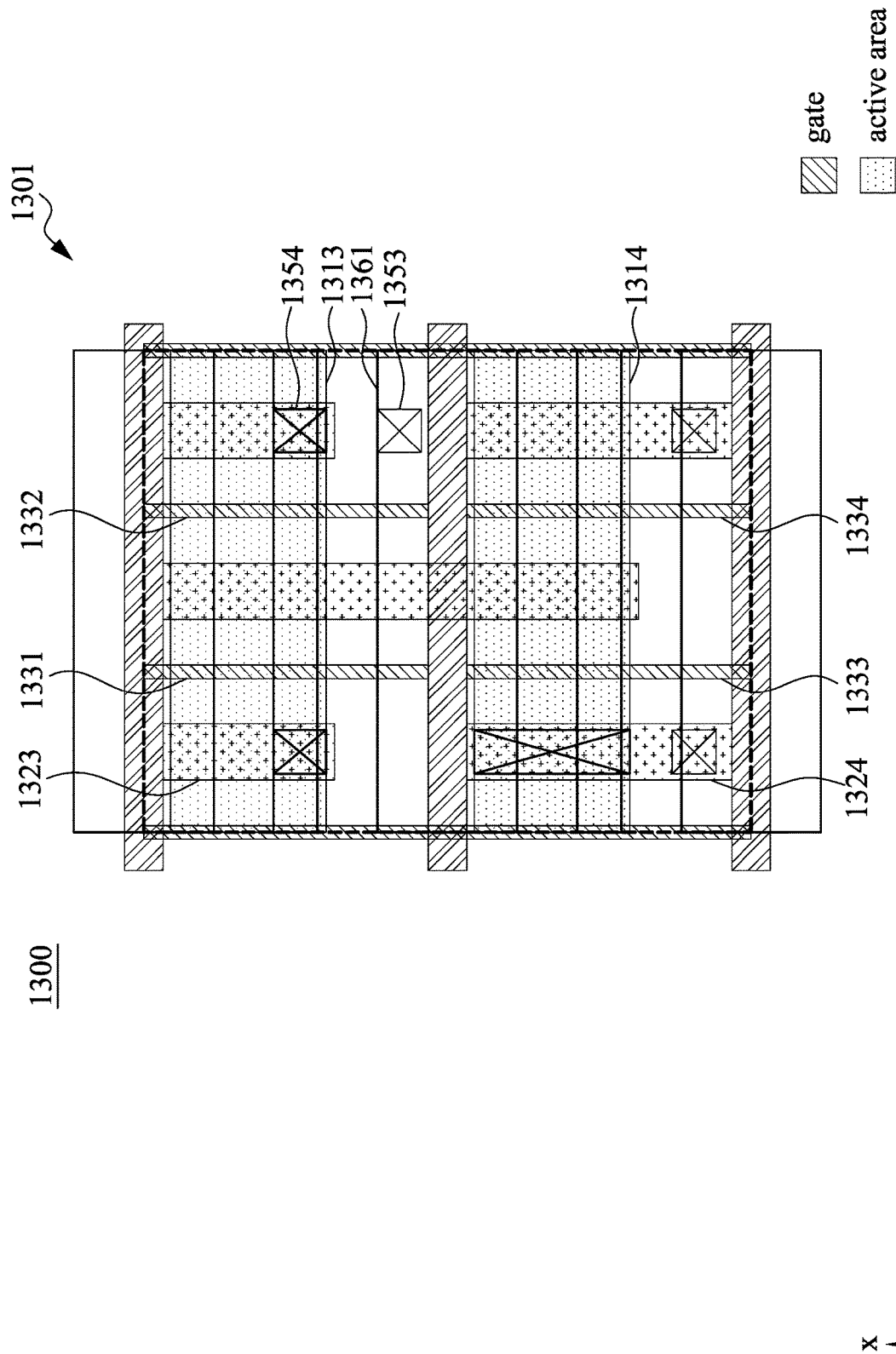
Figure 13C:
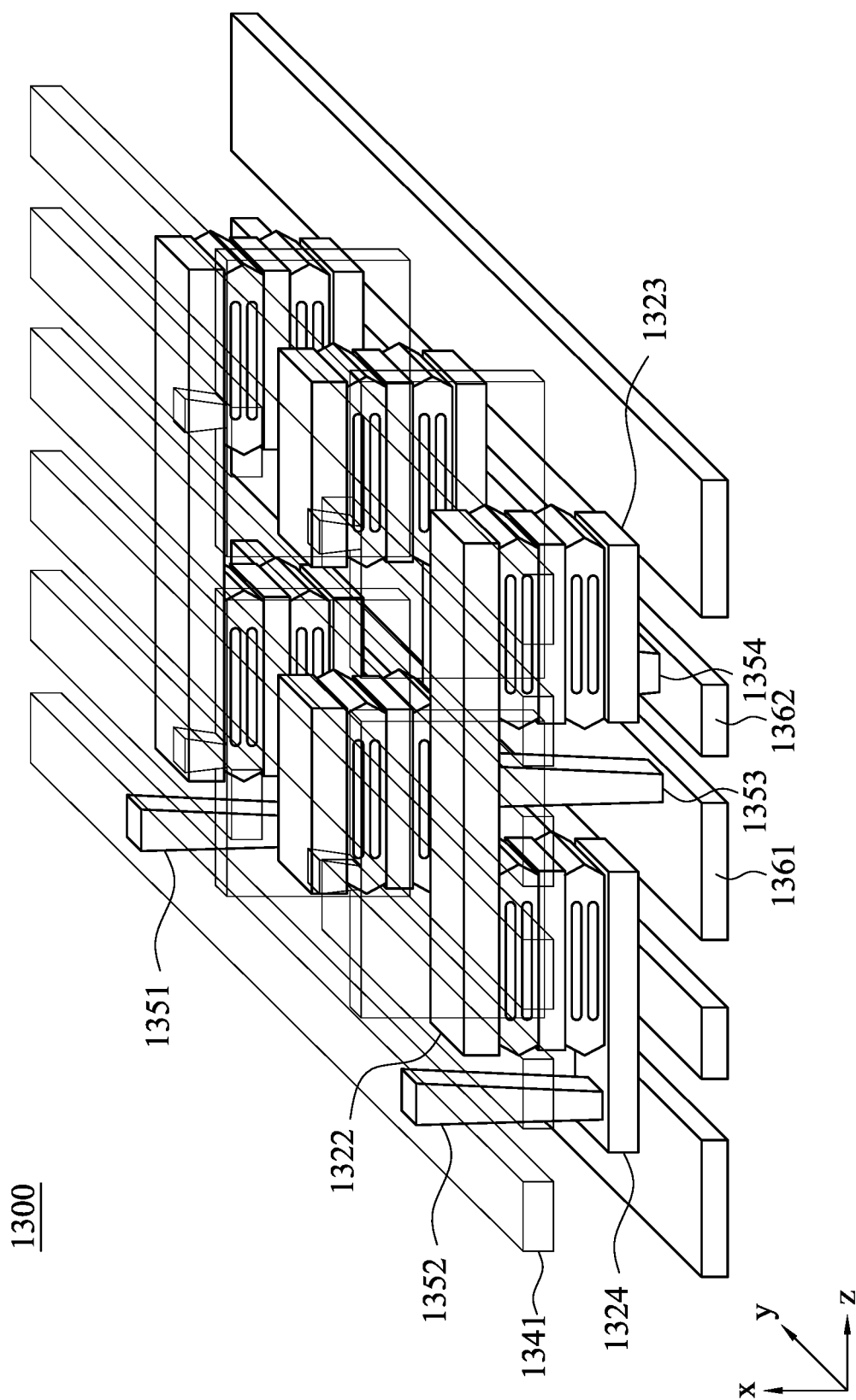
FIG. 13C is a three-dimensional view of the layout diagrams in FIGS. 13A-13B, in accordance with some embodiments.

Reference is now made to FIGS. 13A-13C. FIGS. 13A-13B are layout diagrams in a plan view of front and back portions 1301-1302 corresponding to the circuit 1100 in FIG. 11, and FIG. 13C is a three-dimensional view of the layout diagrams in FIGS. 13A-13B, in accordance with some embodiments.

In FIGS. 13A-13C the cell CELL13 includes active regions 1311-1314 configured with respect to the active regions 111-112 in FIG. 1, conductive segments 1321 and 1324 configured with respect to the conductive segments 121-122 in FIG. 1, gates 1331-1334 configured with respect to the gates 131-132 in FIG. 1, a conductive line 1341 configured with respect to the conductive line 141 in FIG. 1, contact vias 1351-1353 configured with respect to the contact vias 151 and 153 in FIG. 1, and conductive lines 1361-1362 configured with respect to the conductive line 161 in FIG. 1. In some embodiments, the signals A1-B2 are transmitted to the integrated circuit 1300 through the gates 1331-1334 and conductive lines on the front side.

As shown in FIGS. 13A-13C, the cell CELL13 has a cell height CH8 consisted of two sub-cell heights CH81-CH82. In some embodiments, each of the sub-cell heights CH81-CH82 equals to the cell height CH6 in FIGS. 12A-12C. The cell CELL13 further includes cut layers 1381-1383 to separate gates 1331-1334. In some embodiments, each portion, having the sub-cell height CH81 or CH82, of the cell CELL13 is configured with respect to, for example, the cell CELL2 in FIGS. 2A-2C that has one contact vias in a poly pitch.

For illustration, the conductive line 1341 couples to the conductive segments 1323-1324 through the contact vias 1351-1352. The conductive line 1361 couples the conductive segment 1322 through the contact via 1353. The conductive line 1362 coupled to the conductive segment 1323 through the via 1354. In some embodiments, the conductive line 1361 is configured to provide the supply voltage VSS to the integrated circuit 1300, and the conductive line 1362 is configured to provide the supply voltage VDD to the integrated circuit 1300.

Figure 14B:
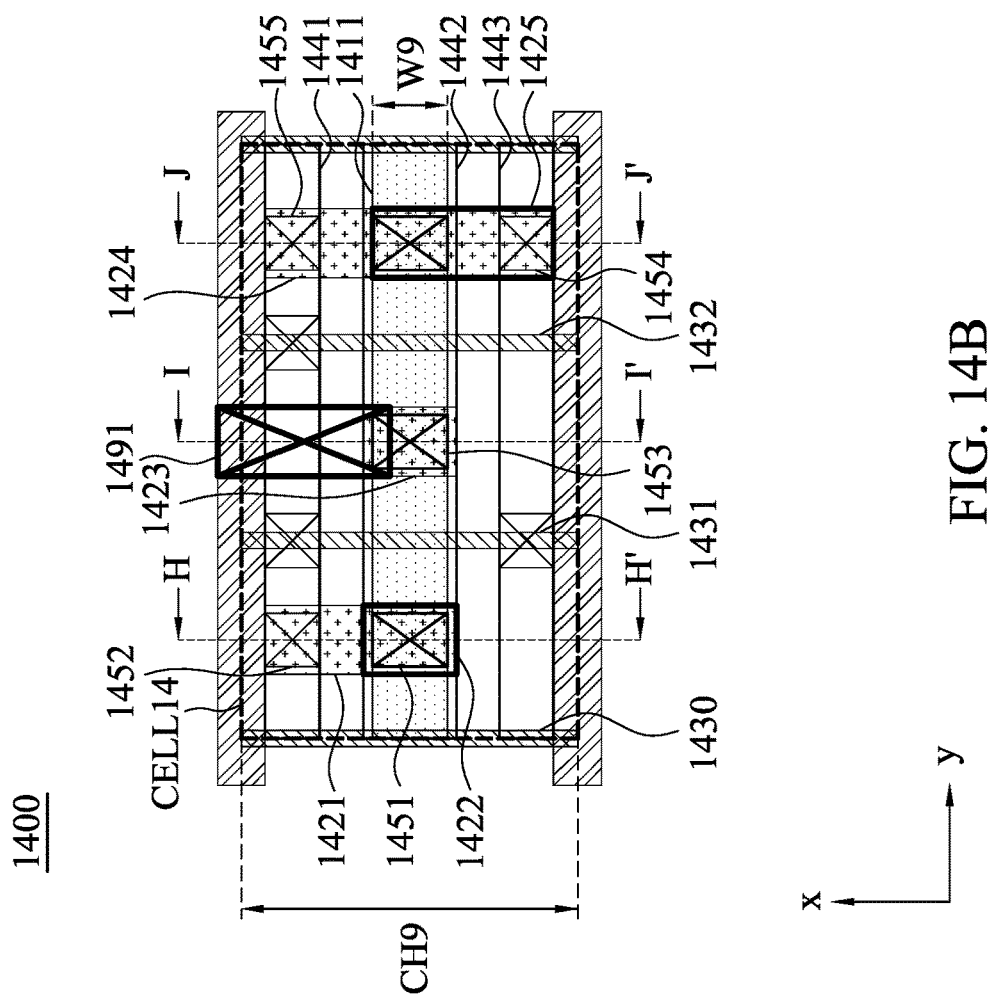
FIG. 14B is a layout diagram in a plan view corresponding to the circuit in FIG. 14A, and FIGS. 14C-14E are cross-sectional diagrams corresponding to the circuit in FIG. 14A along lines H-H', I-I', and J-J' in FIG. 14B, in accordance with some embodiments.
Figure 14A:
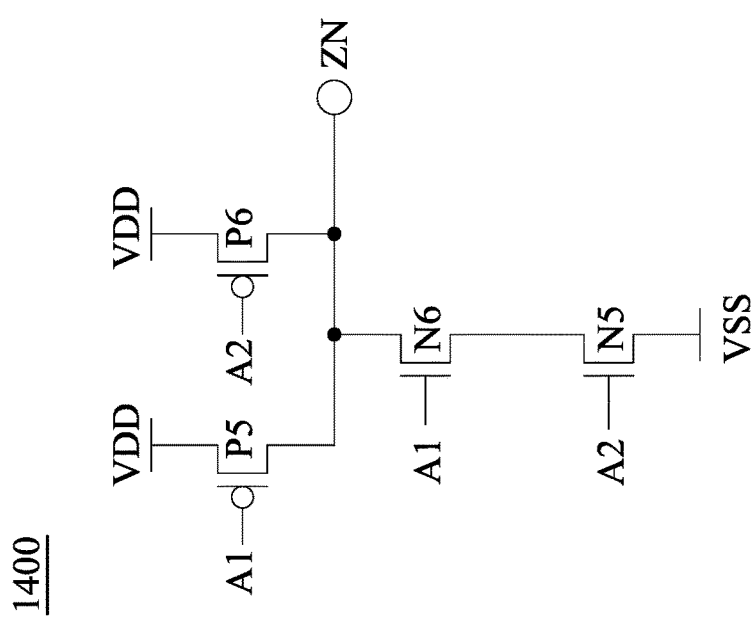
FIG. 14A is a schematic diagram of a circuit.
Figure 14C:
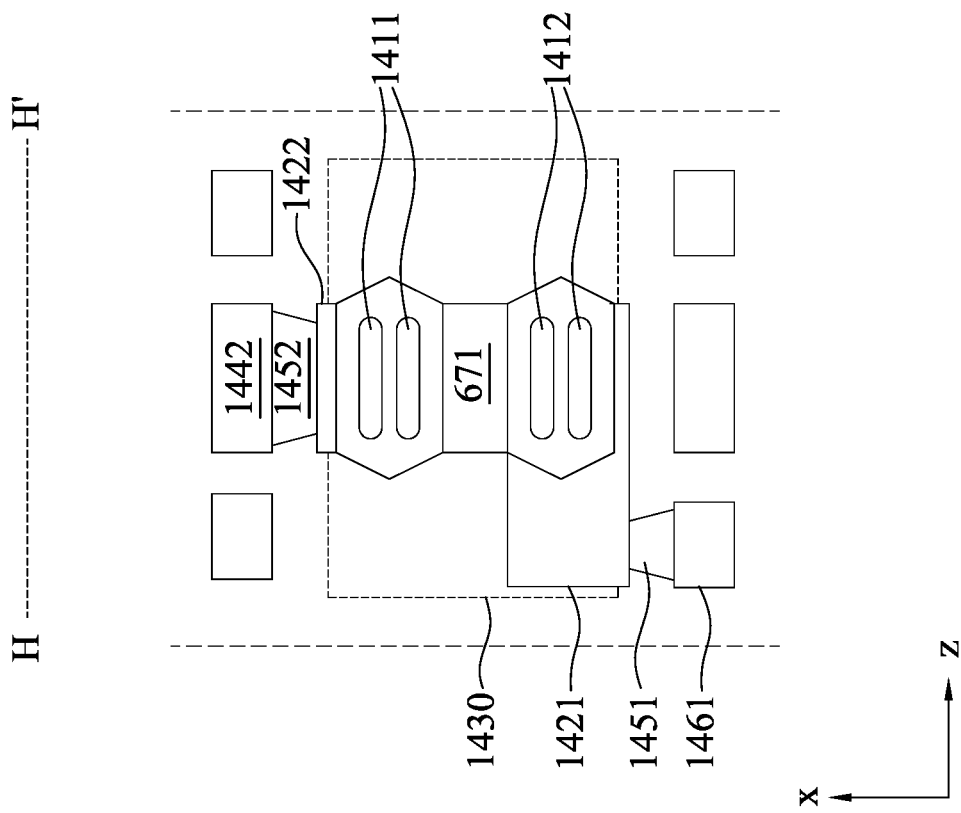
FIG. 14F is another layout diagram in a plan view corresponding to the circuit in FIG. 14A, and FIGS. 14G-14I are cross-sectional diagrams corresponding to the circuit in FIG. 14A along lines K-K', L-L', and M-M' in FIG. 14F, in accordance with another embodiment.
FIG. 14J is another layout diagram in a plan view corresponding to the circuit in FIG. 14A, and FIG. 14K are cross-sectional diagrams corresponding to the circuit in FIG. 14A along line N-N' in FIG. 14J, in accordance with another embodiment.
FIG. 14L is another layout diagram in a plan view corresponding to the circuit in FIG. 14A, in accordance with another embodiment.

Reference is now made to FIGS. 14A-14E. FIG. 14A is a schematic diagram of a circuit 1400, FIG. 14B is a layout diagram in a plan view corresponding to the circuit 1400 in FIG. 14A, and FIGS. 14C-14E are cross-sectional diagrams corresponding to the circuit 1400 in FIG. 14A along lines H-H', I-I', and J-J' in FIG. 14B, in accordance with some embodiments.

As shown in FIG. 14A, the circuit 1400 configured as a NAND logic circuit includes P type transistors P5-P6 and N type transistors N5-N6. The transistors P1-P2 are coupled to the supply voltage VDD and receive signals A1-A2 at gate terminals thereof respectively, the drain terminals thereof are coupled together to the output terminal ZN. The transistor N5 is coupled between the transistor N6 and the supply voltage VSS. The transistors N5-N6 receive signals A2 and A1 at gate terminals thereof respectively, the drain terminal of the transistor N6 is coupled to drain terminals of the transistors P5-P6 at the output terminal ZN.

In FIGS. 14A-14E the cell CELL14 includes active regions 1411-1412 configured with respect to the active regions 111-112 in FIG. 1, conductive segments 1421 and 1425 configured with respect to the conductive segments 121-122 in FIG. 1, gates 1431-1432 configured with respect to the gates 131-132 in FIG. 1, conductive lines 1441-1443 configured with respect to the conductive line 141 in FIG. 1, conductive lines 1461-1462 configured with respect to the conductive line 161 in FIG. 1, and an interconnect segment 1471 configured with respect to, for example, the interconnect segment 171 in FIG. 1. In some embodiments, the signals A1-A2 are transmitted to the integrated circuit 1400 through the gates 1431-1132 and conductive lines on the front side.

Figure 14D:
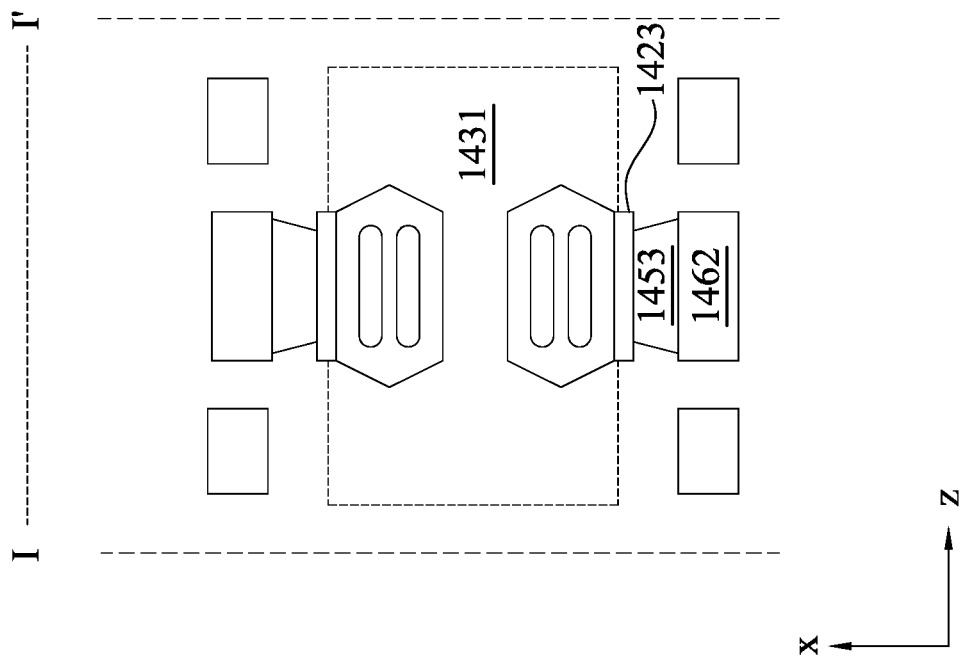
Figure 14E:
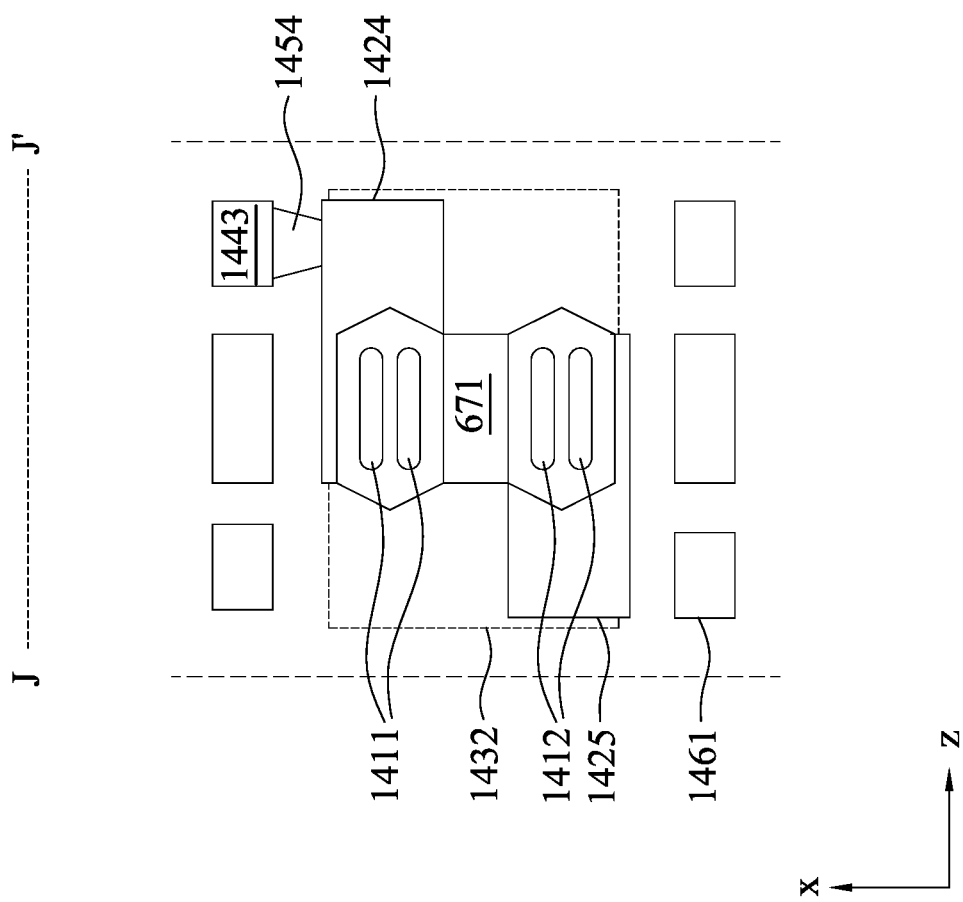

As shown in FIGS. 14B-14E, the cell CELL14 has a cell height CH9. In some embodiments, the cell CELL14 is configured with respect to, for example, the cell CELL6 in FIGS. 6A-6D that has no contact vias in a poly pitch. For illustration, in FIG. 14C, the conductive line 1442 couples to the conductive segment 1422 through the via 1452 to provide the supply voltage VSS to the integrated circuit 1400. The conductive line 1461 couples the conductive segment 1421 through the via 1451. In FIG. 14D, the conductive line 1462 couples the conductive segment 1423 through the contact via 1453 to provide the supply voltage VDD to the integrated circuit 1400. In FIG. 14E, the conductive line 1461 is further coupled to the conductive segment 1425 through the via 1455. The conductive line 1443, corresponding to the output terminal ZN, is further coupled to the conductive segment 1424 through the via 1454, while the interconnect segment 1471 couples the active regions 1411-1412.

Figure 14F:
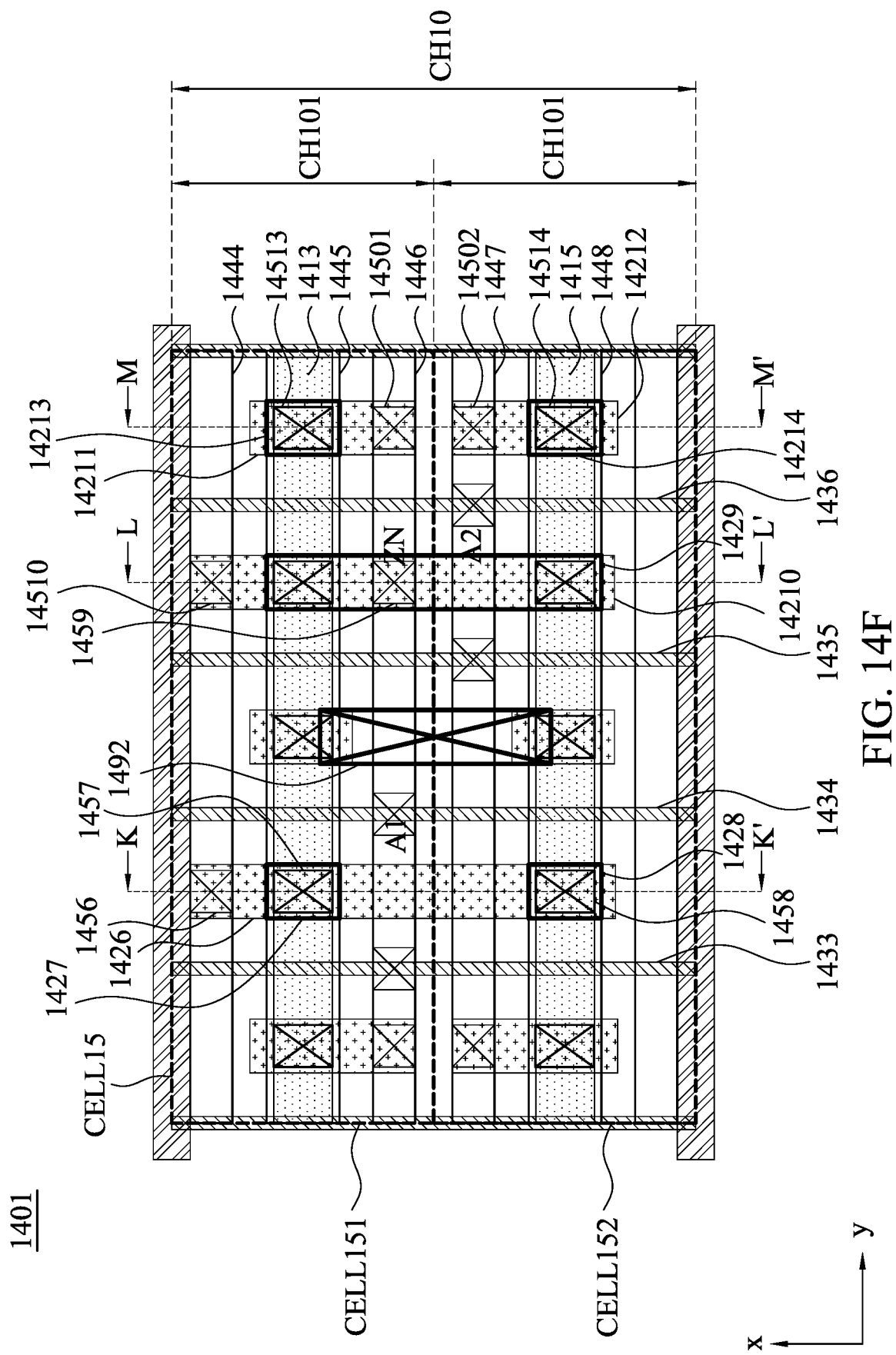

Reference is now made to FIG. 14F-14I. FIG. 14F is another layout diagram in a plan view corresponding to the circuit 1400 in FIG. 14A, and FIGS. 14G-14I are cross-sectional diagrams corresponding to the circuit 1400 in FIG.

14A along lines K-K', L-L', and M-M' in FIG. 14F, in accordance with another embodiment.

In FIGS. 14F-14I, the cell CELL15 in the integrated circuit 1401 includes active regions 1413-1416 configured with respect to the active regions 111-112 in FIG. 1, conductive segments 1426-14214 configured with respect to the conductive segments 121-122 in FIG. 1, gates 1433-1436 configured with respect to the gates 131-132 in FIG. 1, conductive lines 1444-1448 configured with respect to the conductive line 141 in FIG. 1, contact vias 14511-14512 configured with respect to the contact vias 151 and 153 in FIG. 1, and conductive lines 1463-1467 configured with respect to the conductive line 161 in FIG. 1. In some embodiments, the signals A1-A2 are transmitted to the integrated circuit 1401 through the gates 1434-1436 and conductive lines on the front side.

As shown in FIGS. 14F-14I, the cell CELL15 has a cell height CH10 consisted of two sub-cell heights CH101-CH102. In some embodiments, each of the sub-cell heights CH101-CH102 equals to the cell height CH9 in FIGS. 14B-14E. In some embodiments, each portion, having the sub-cell height CH101 or CH102, of the cell CELL15 is configured with respect to, for example, the cell CELL2 in FIGS. 2A-2C that has one contact vias in a poly pitch.

Figure 14G:
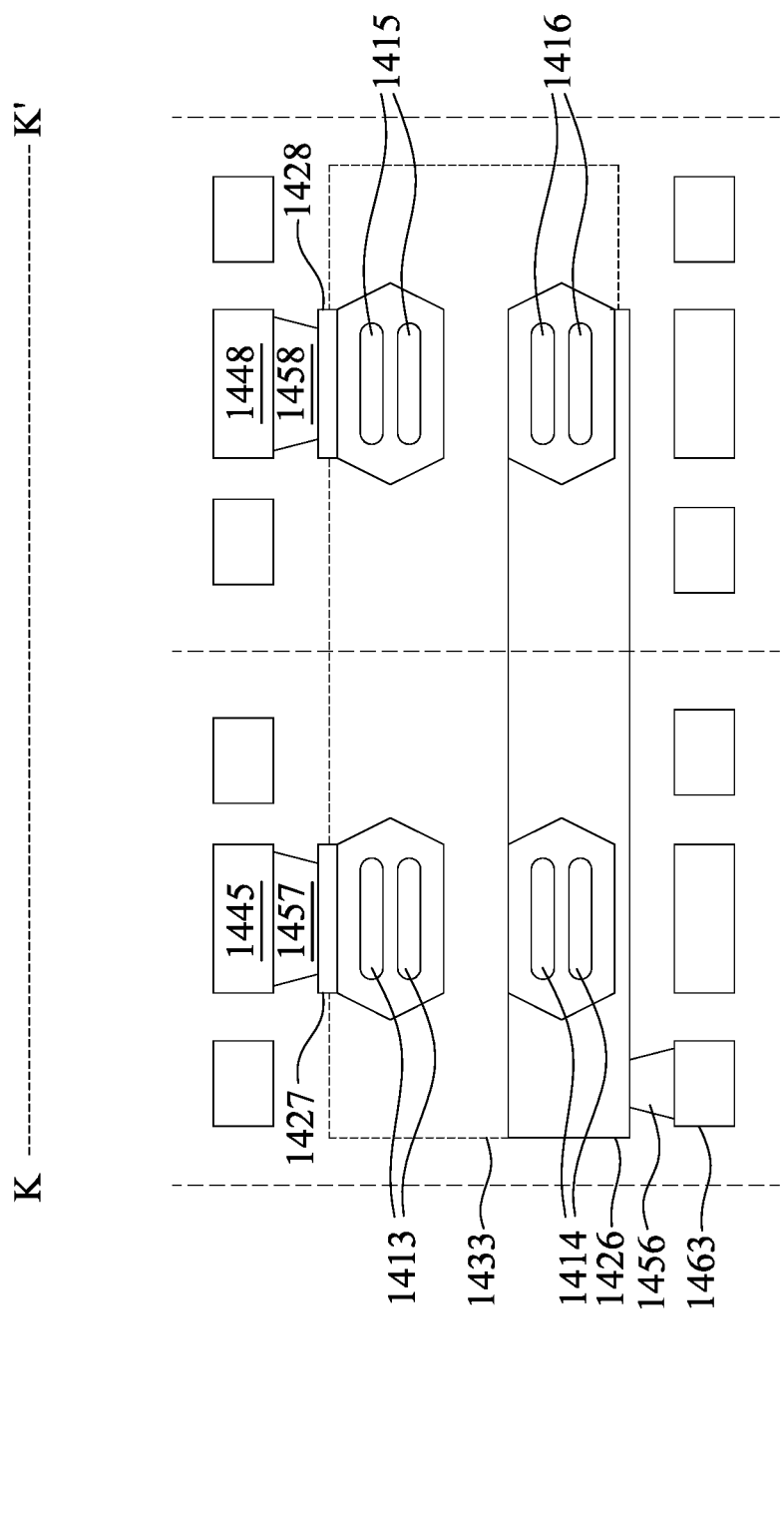

In FIG. 14G, for illustration, the conductive line 1445 couples to the conductive segment 1427 through via 1457. The conductive line 1448 couples to the conductive segment 1428 through via 1458. In some embodiments, the conductive lines 1445 and 1448 are configured to provide the supply voltage VSS to the integrated circuit 1401. The conductive line 1463 couples the conductive segment 1426 through the via 1456, in which the conductive segment 1426 couples the active regions 1414 and 1416.

Figure 14H:
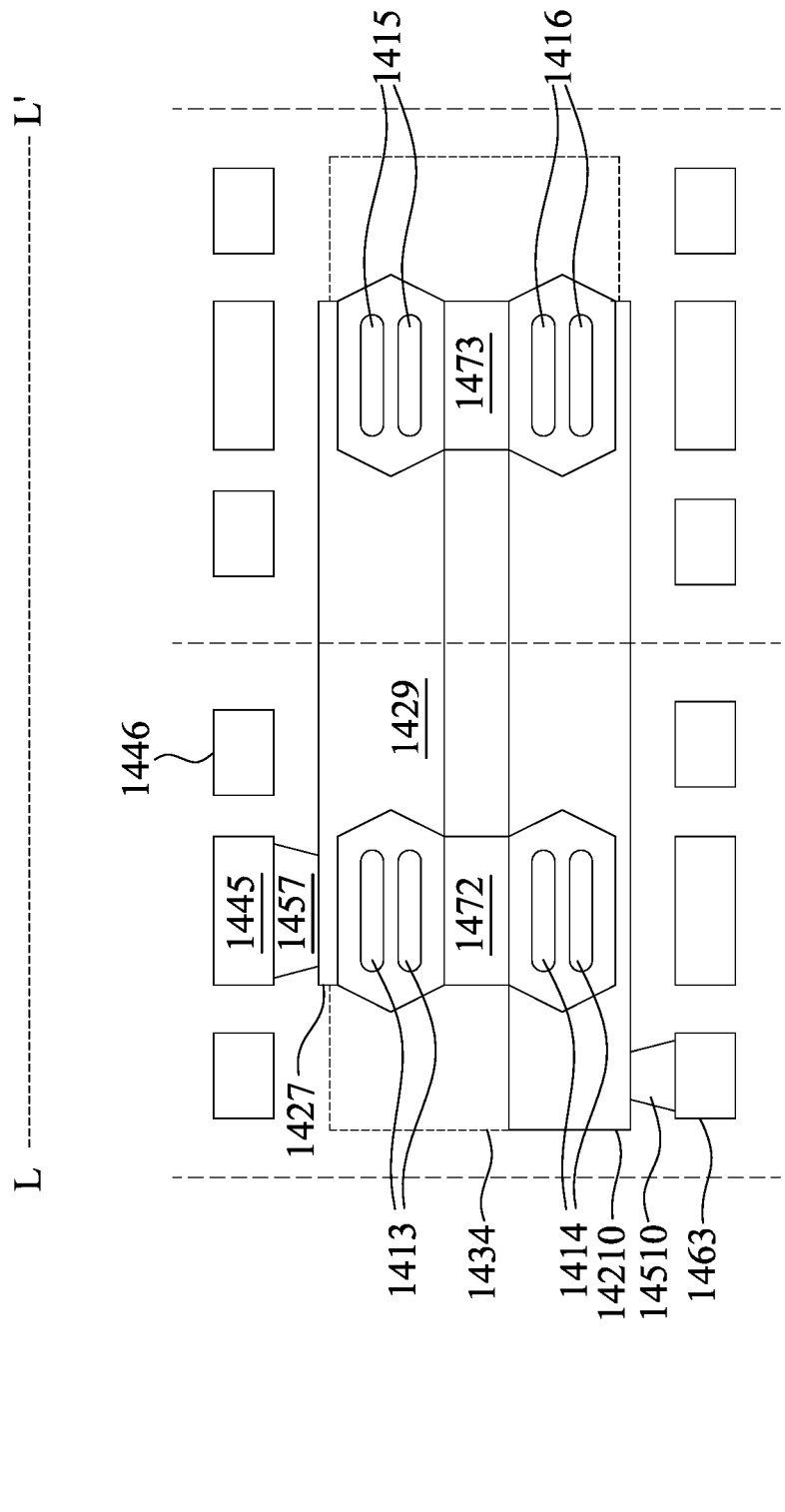

In FIG. 14H, the conductive line 1446, corresponding to the output terminal ZN, couples to the conductive segment 1429 through via 1459, in which the conductive segment 1429 couples the active regions 1413 and 1415. The conductive line 1463 couples the conductive segment 14210 through the via 14510, in which the conductive segment 14210 couples the active regions 1414 and 1416. The interconnect segments 1472 couples the active regions 1413 and 1414, and the interconnect segments 1473 couples the active regions 1415 and 1416.

Figure 14I:
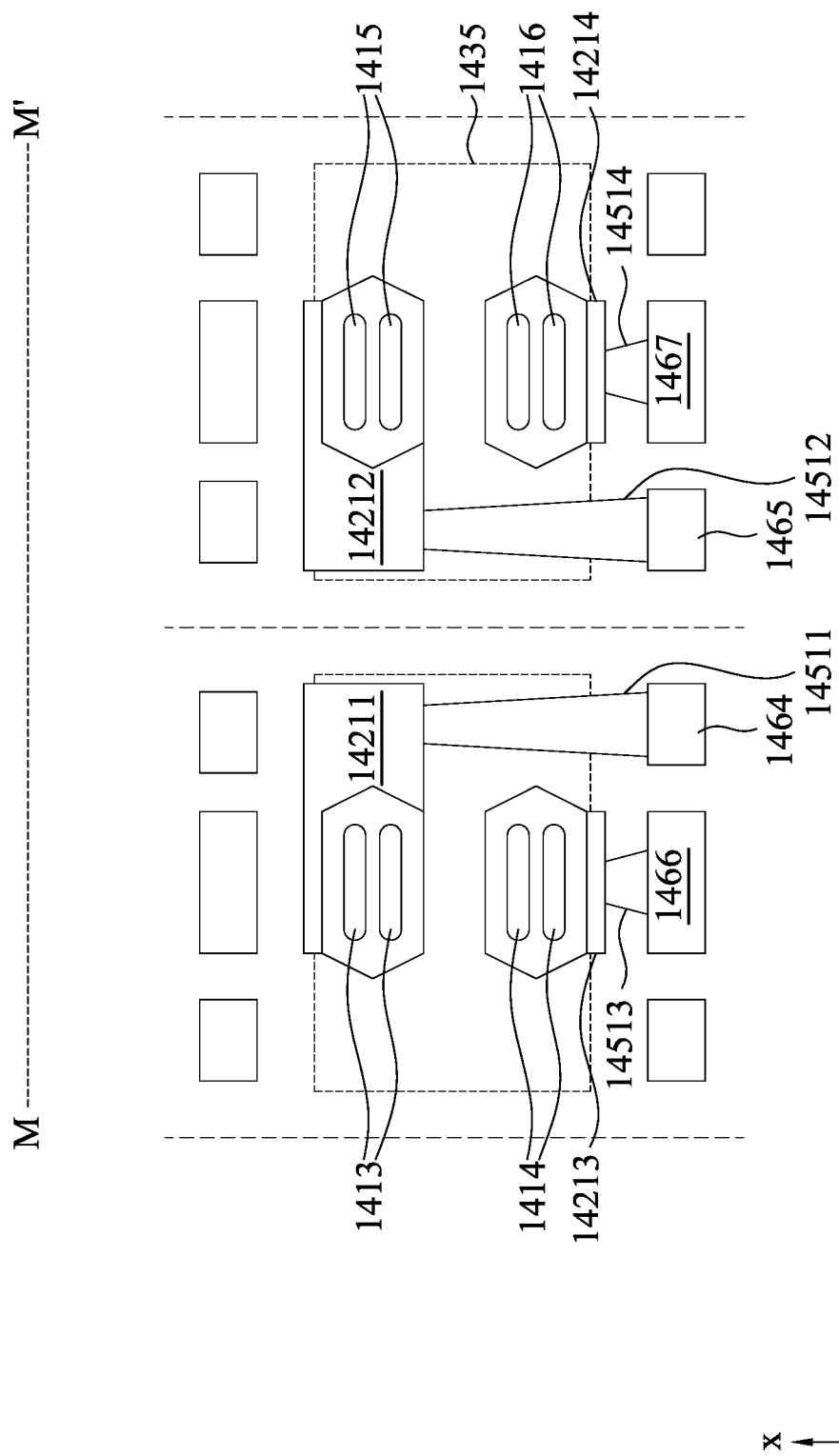

In FIG. 14I, the conductive line 1464 couples the conductive segment 14211 through the contact via 14511, and the conductive line 1465 couples the conductive segment 14212 through the contact via 14512. The conductive line 1466 couples to the conductive segment 14213 through via 14513 to provide the supply voltage VDD, and the conductive line 1467 couples to the conductive segment 14214 through via 14514 to provide the supply voltage VDD.

Figure 14J:
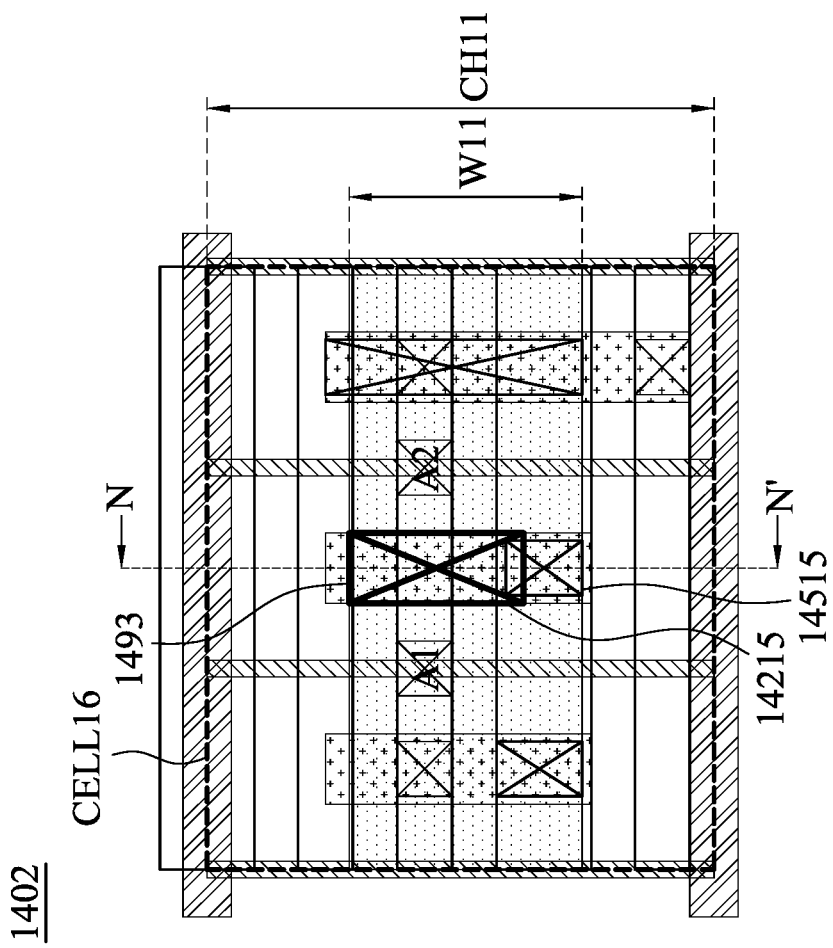
Figure 14K:
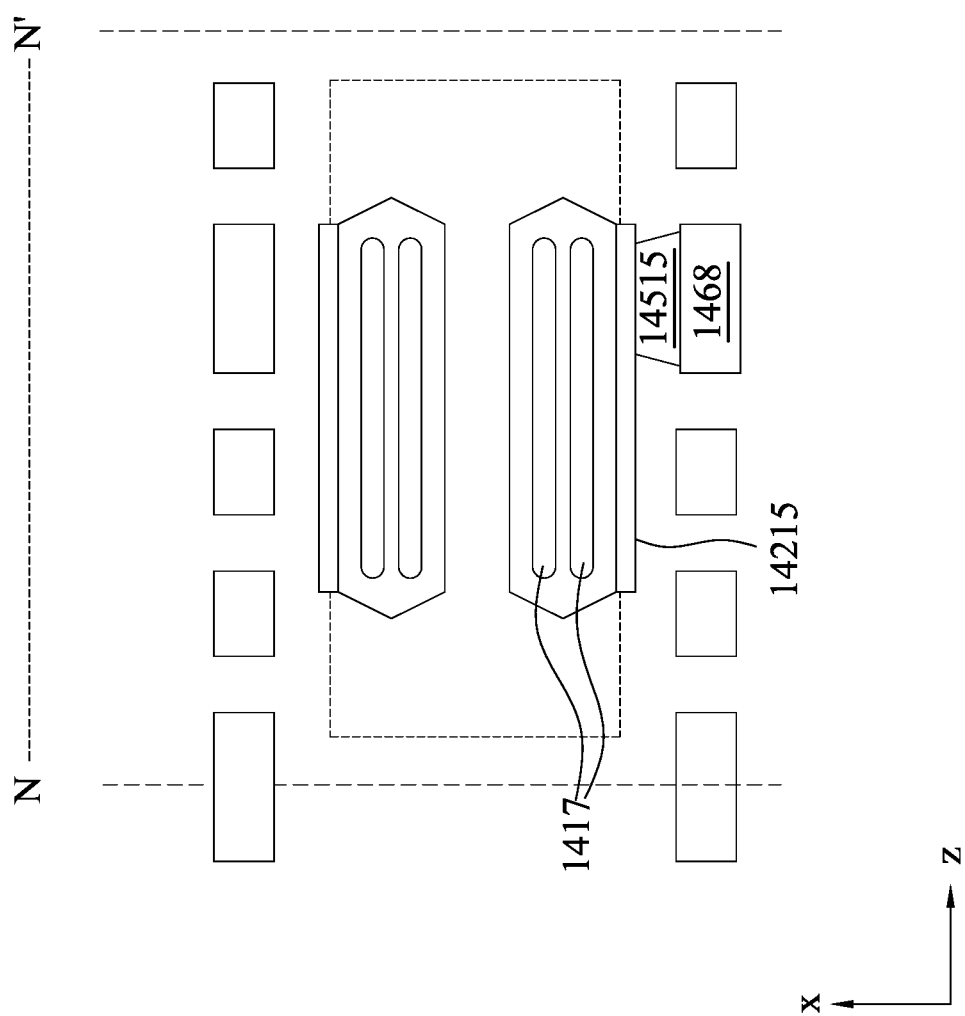

Reference is now made to FIGS. 14J-14K. FIG. 14J is another layout diagram in a plan view corresponding to the circuit 1400 in FIG. 14A, and FIG. 14K are cross-sectional diagrams corresponding to the circuit in FIG. 14A along line N-N' in FIG. 14J, in accordance with another embodiment. In some embodiments, the cell CELL16 of the integrated circuit 1402 is configured with respect to, for example, the cell CELL14 in FIG. 14B.

Compared with FIG. 14B, s shown in FIG. 14J, the cell CELL16 has a cell height CH11 which is 1.5 times larger than the cell height CH9 in FIG. 14B. In some embodiments, the width W11 is larger than the width W9 in FIG. 14B. In FIG. 14K, the conductive line 1468 is coupled to the conductive segment 14215 through the via 14515.

Figure 14L:
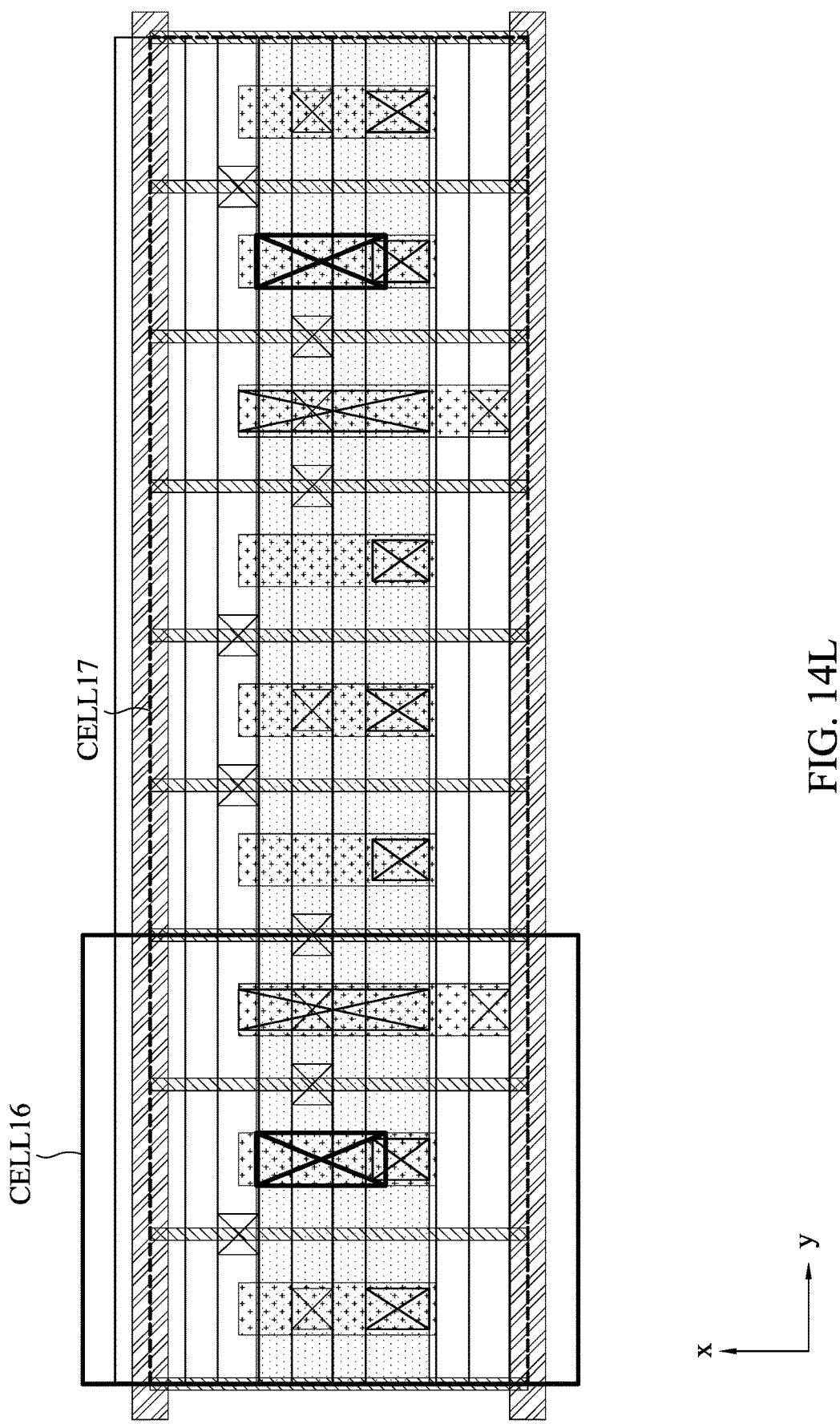

Reference is now made to FIG. 14L. FIG. 14L is another layout diagram in a plan view corresponding to the circuit 1400 in FIG. 14A, in accordance with another embodiment. Compared with FIG. 14J, the cell CELL17 further includes duplicated structures configured with respect to the cell CELL16 and provides at least four times driving capacity than the cell CELL16 in FIG. 14J, in some embodiments.

Figure 15C:
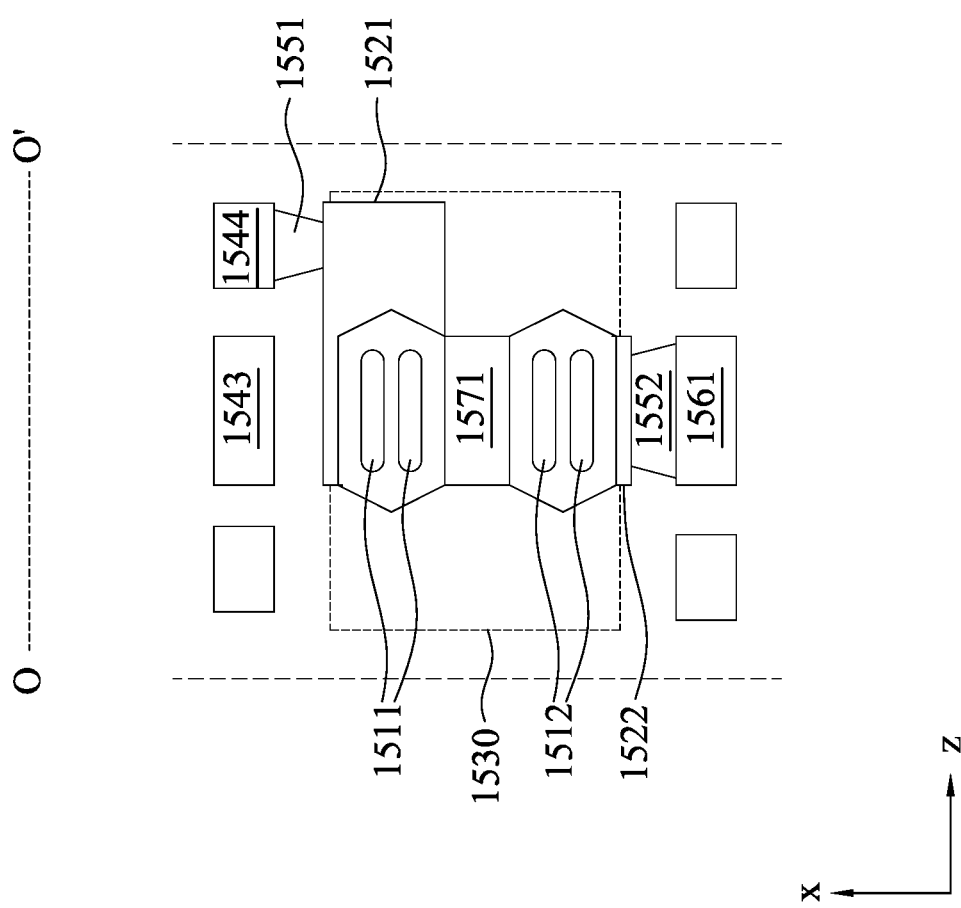
FIG. 15C is a cross-sectional diagram corresponding to the circuit in FIG. 15A along line O-O' in FIG. 15B, in accordance with some embodiments.

Reference is now made to FIGS. 15A-15C. FIG. 15A is a schematic diagram of a circuit 1500, FIG. 15B is a layout diagram in a plan view corresponding to the circuit 1500 in FIG. 15A, and FIG. 15C is a cross-sectional diagram corresponding to the circuit in FIG. 15A along line O-O' in FIG. 15B, in accordance with some embodiments.

As shown in FIG. 15A, the circuit 1500 configured as a NOR logic circuit includes N type transistors N7-N8 and P type transistors P7-P8. The transistors N1-N2 are coupled to the supply voltage VSS and receive signals A1-A2 at gate terminals thereof respectively, the drain terminals thereof are coupled together to the output terminal ZN. The transistor P7 is coupled between the transistor P8 and the supply voltage VDD. The transistors P7-P8 receive signals A1-A2 at gate terminals thereof respectively, the drain terminal of the transistor P8 is coupled to drain terminals of the transistors N7-N8 at the output terminal ZN.

In FIGS. 15A-15C, the cell CELL18 includes active regions 1511-1512 configured with respect to the active regions 111-112 in FIG. 1, conductive segments 1521-1522 configured with respect to the conductive segments 121-122 in FIG. 1, gates 1530-1531 configured with respect to the gates 131-132 in FIG. 1, conductive lines 1541-1542 configured with respect to the conductive line 141 in FIG. 1, conductive line 1561 configured with respect to the conductive line 161 in FIG. 1, and an interconnect segment 1571 configured with respect to, for example, the interconnect segment 171 in FIG. 1. In some embodiments, the signals A1-A2 are transmitted to the integrated circuit 1400 through the gates 1531-1532 and conductive lines on the front side.

As shown in FIGS. 15B-15C, the cell CELL18 has a cell height CH12. In some embodiments, the cell CELL18 is configured with respect to, for example, the cell CELL6 in FIGS. 6A-6D that has no contact vias in a poly pitch. For illustration, in FIG. the conductive line 1544, corresponding to the output terminal ZN, couples to the conductive segment 1521 through the via 1551. The conductive line 1561 couples the conductive segment 1522 through the via 1552 to provide the supply voltage VDD to the integrated circuit 1500. The interconnect segments 1571 couples the active regions 1511 and 1512.

Figure 15D:
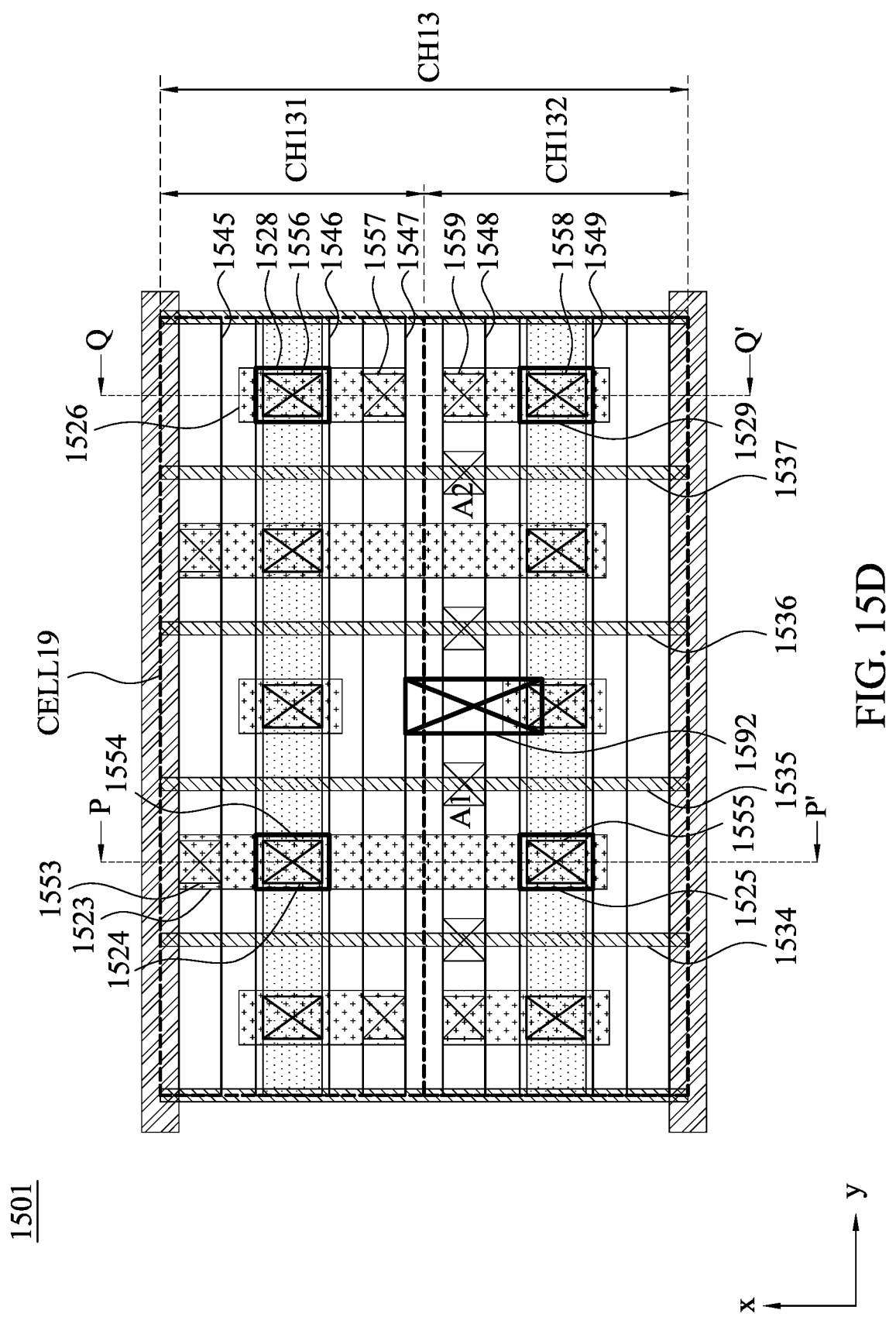
FIG. 15D is another layout diagram in a plan view corresponding to the circuit in FIG. 15A, and FIGS. 15E-15F are cross-sectional diagrams corresponding to the circuit in FIG. 15A along lines P-P' and Q-Q' in FIG. 15D, in accordance with another embodiment.
Figure 15E:
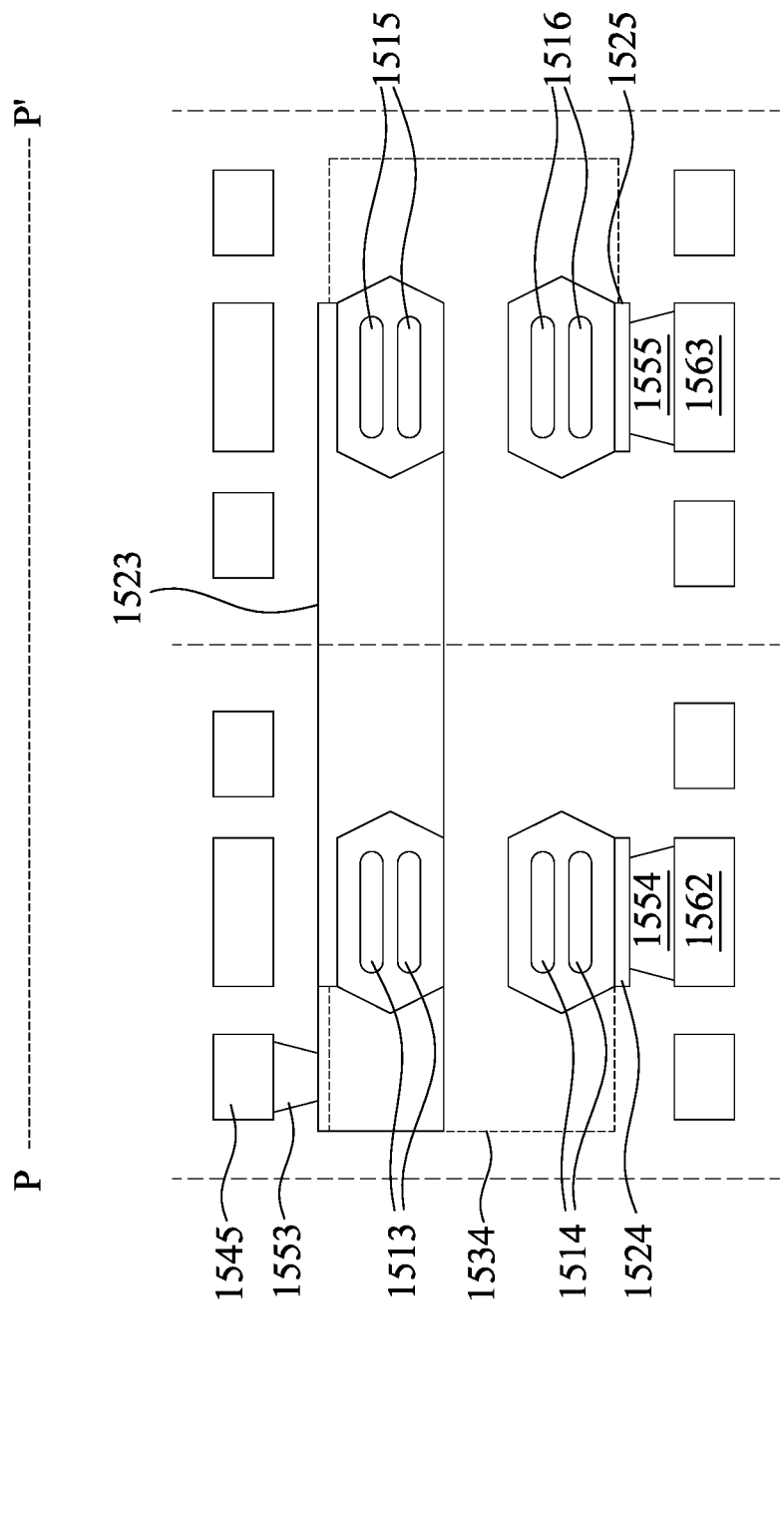
FIG. 15A is a schematic diagram of a circuit.
FIG. 15B is a layout diagram in a plan view corresponding to the circuit in FIG. 15A.
FIG. 15G is another layout diagram in a plan view corresponding to the circuit in FIG. 15A, and FIG. 15H are cross-sectional diagrams corresponding to the circuit in FIG. 15A along line R-R' in FIG. 15G, in accordance with another embodiment.
FIG. 15I is another layout diagram in a plan view corresponding to the circuit in FIG. 15A, in accordance with another embodiment.
Figure 15F:
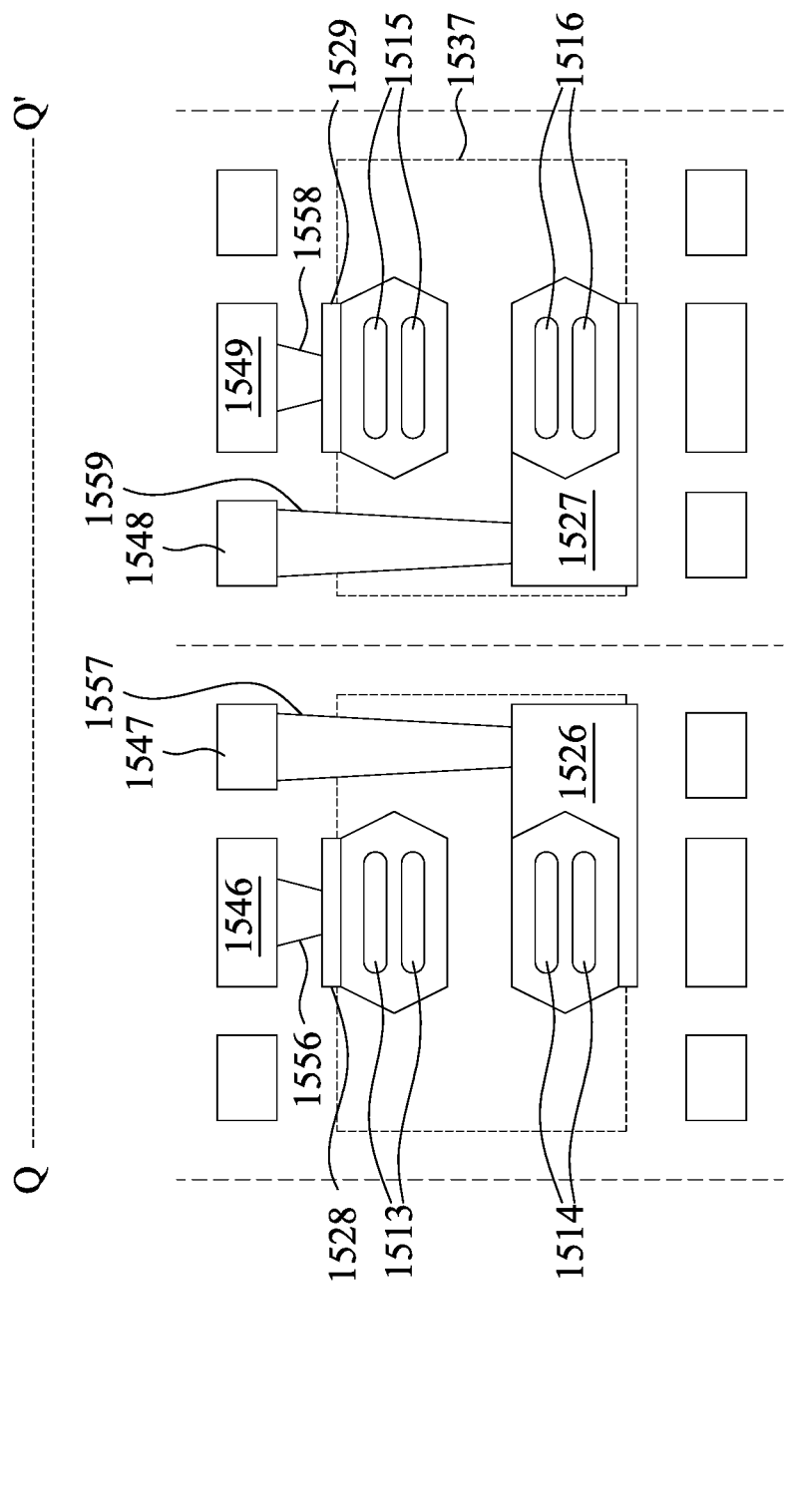

Reference is now made to FIGS. 15D-15F. FIG. 15D is another layout diagram in a plan view corresponding to the circuit 1500 in FIG. 15A, and FIGS. 15E-15F are cross-sectional diagrams corresponding to the circuit 1500 in FIG. 15A along lines P-P' and Q-Q' in FIG. 15D, in accordance with another embodiment.

In FIGS. 15D-15F, the cell CELL19 in the integrated circuit 1501 includes active regions 1513-1516 configured with respect to the active regions 111-112 in FIG. 1, conductive segments 1523-1529 configured with respect to the conductive segments 121-122 in FIG. 1, gates 1534-1537 configured with respect to the gates 131-132 in FIG. 1, conductive lines 1545-1549 configured with respect to the conductive line 141 in FIG. 1, contact vias 1557 and 1559 configured with respect to the contact vias 151 and 153 in FIG. 1, and conductive lines 1562-1563 configured with respect to the conductive line 161 in FIG. 1. In some embodiments, the signals A1-A2 are transmitted to the integrated circuit 1401 through the gates 1531-1532 and conductive lines on the front side.

As shown in FIGS. 15D-15F, the cell CELL19 has a cell height CH13 consisted of two sub-cell heights CH131-CH132. In some embodiments, each of the sub-cell heights CH131-CH132 equals to the cell height CH12 in FIGS. 15A-15C. In some embodiments, each portion, having the sub-cell height CH131 or CH132, of the cell CELL19 is configured with respect to, for example, the cell CELL2 in FIGS. 2A-2C that has one contact vias in a poly pitch.

In FIG. 15E, for illustration, the conductive line 1545, corresponding to the output terminal ZN, couples to the conductive segment 1523 through via 1553, in which the conductive segment 1523 couples the active regions 1513 and 1515. The conductive line 1562 couples to the conductive segment 1524 through via 1554. The conductive line 1563 couples to the conductive segment 1525 through via 1555. In some embodiments, the conductive lines 1562-1563 are configured to provide the supply voltage VDD to the integrated circuit 1501.

In FIG. 15F, the conductive line 1547 couples the conductive segment 1526 through the contact via 1557, and the conductive line 1548 couples the conductive segment 1527 through the contact via 1559. The conductive line 1546 couples to the conductive segment 1528 through the via 1556 to provide the supply voltage VDD, and the conductive line 1549 couples to the conductive segment 1529 through the via 1558 to provide the supply voltage VDD.

Figure 15G:
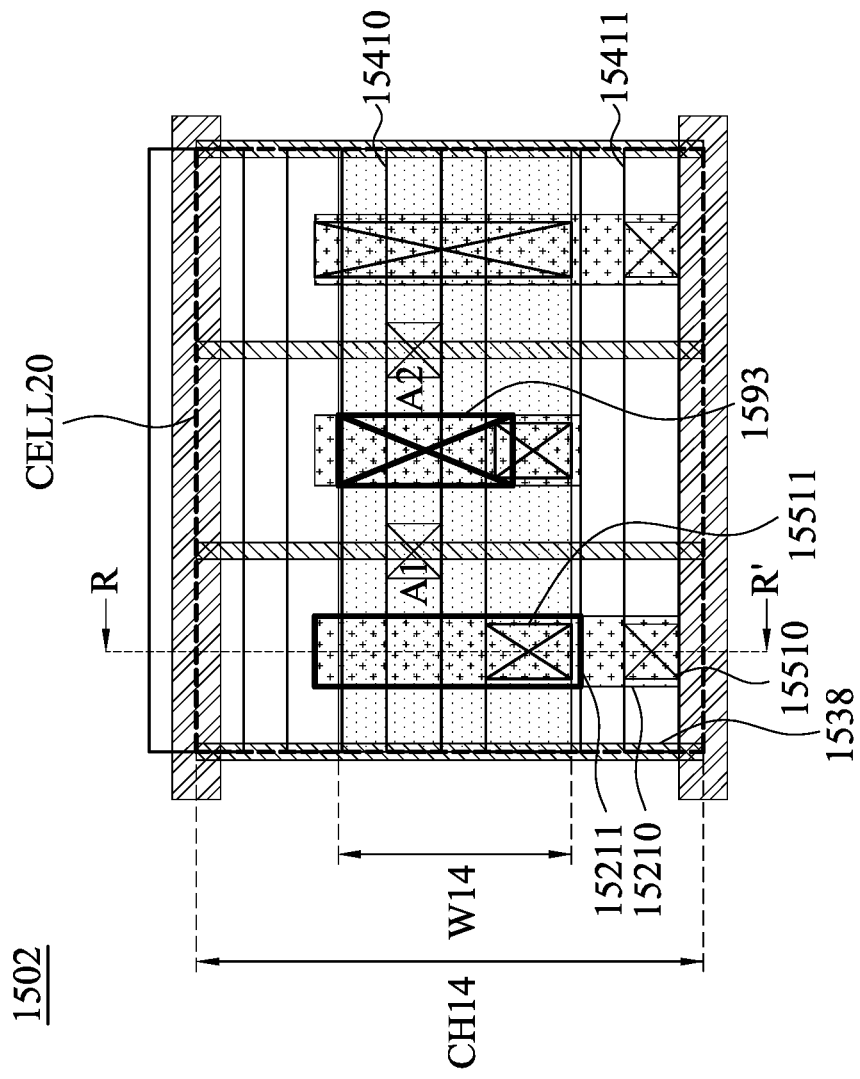
Figure 15H:
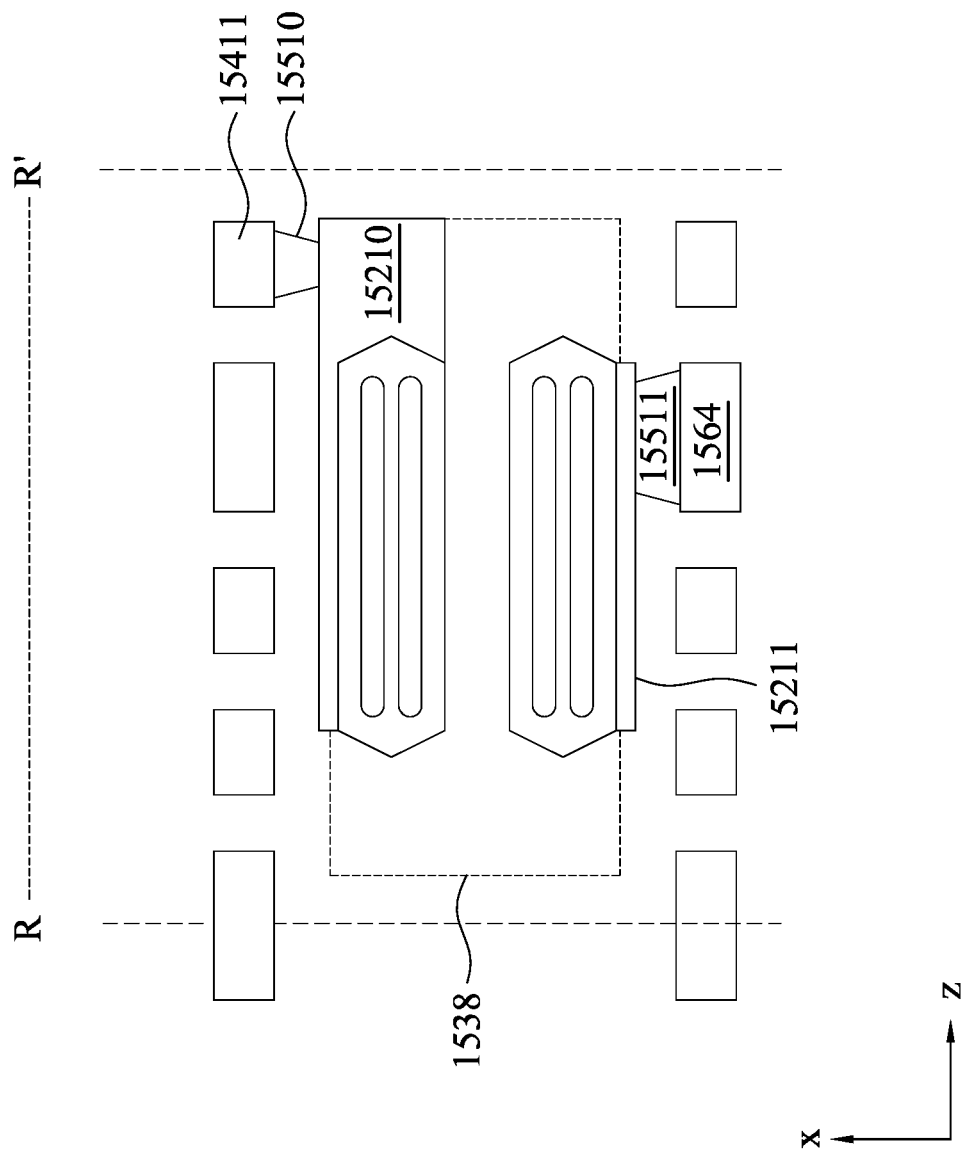

Reference is now made to FIGS. 15G-15H. FIG. 15G is another layout diagram in a plan view corresponding to the circuit in FIG. 15A, and FIG. 15H are cross-sectional diagrams corresponding to the circuit in FIG. 15A along line R-R' in FIG. in accordance with another embodiment. In some embodiments, the cell CELL20 of the integrated circuit 1502 is configured with respect to, for example, the cell CELL18 in FIG. 15B.

Compared with FIG. 15B, as shown in FIG. 15G, the cell CELL20 has a cell height CH14 which is 1.5 times larger than the cell height CH12 in FIG. 15B. In some embodiments, the width W14 is larger than the width of active regions in FIG. 15B. In FIG. 15H, the conductive line 15411, corresponding to the output terminal ZN, is coupled to the conductive segment 15210 through the via 15510. The conductive line 1564, configured to provide the supply voltage VDD to the integrated circuit 1502, is coupled to the conductive segment 15211 through via 15511.

Figure 15I:
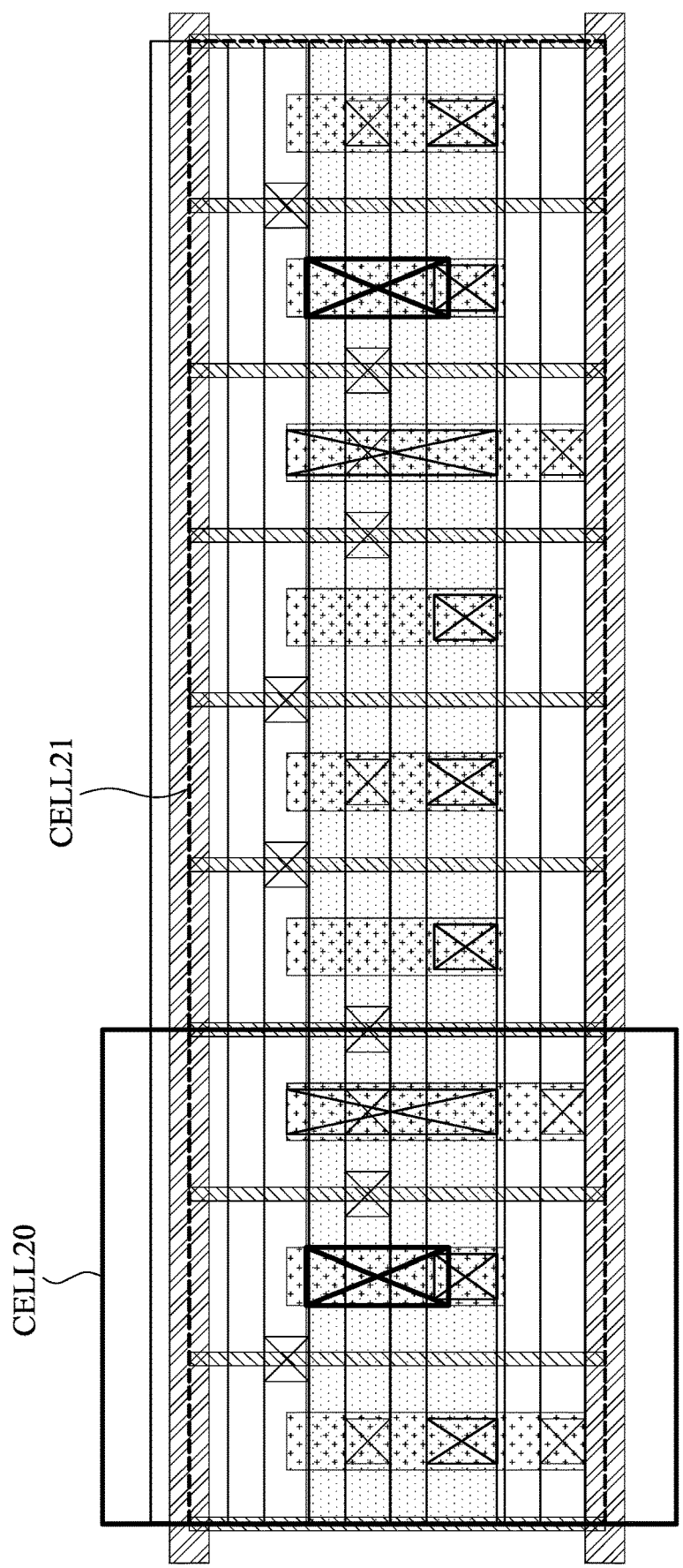

Reference is now made to FIG. 15I. FIG. 15I is another layout diagram in a plan view corresponding to the circuit 1500 in FIG. 15A, in accordance with another embodiment. Compared with FIG. 15G, the cell CELL21 further includes duplicated structures configured with respect to the cell CELL20 and provides at least four times driving capacity than the cell CELL20 in FIG. 15G, in some embodiments.

Figure 16C:
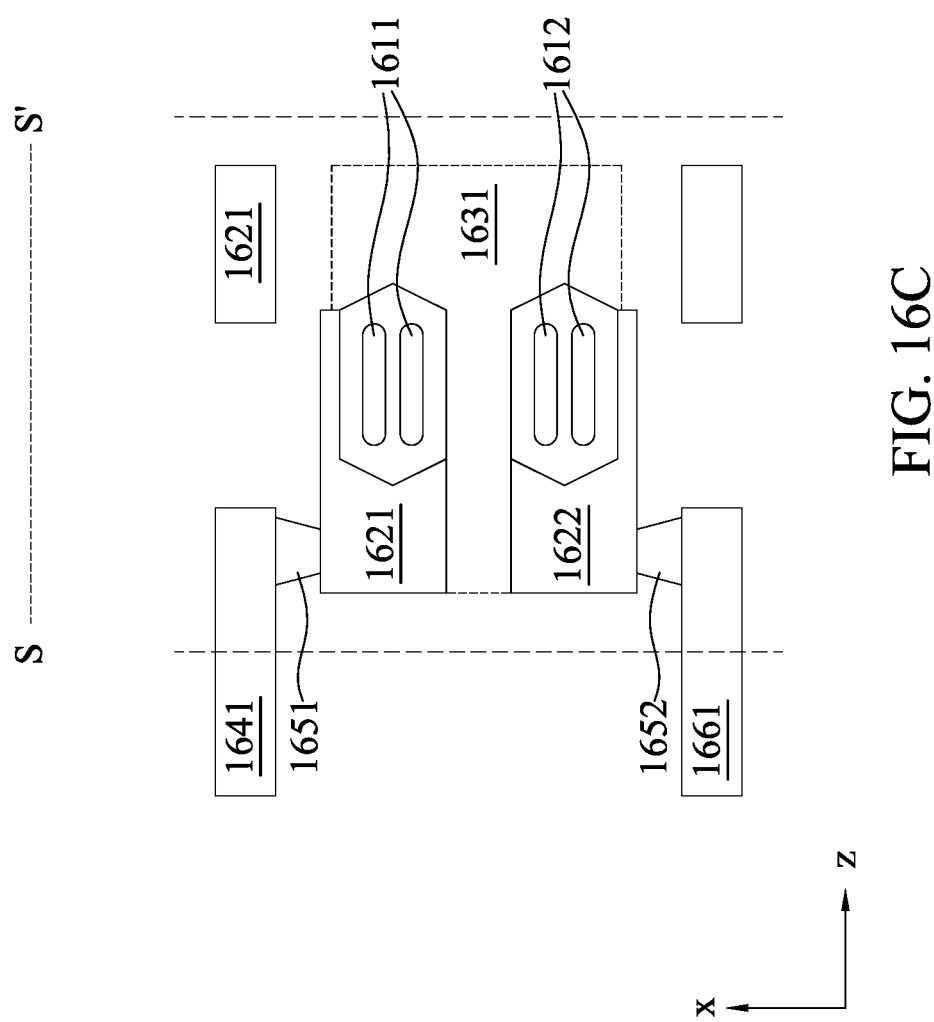
FIG. 16C is a cross-sectional diagram corresponding to the circuit in FIG. 16A along line S-S in FIG. 16B, in accordance with some embodiments.

Reference is now made to FIGS. 16A-16C. FIG. 16A is a schematic diagram of a circuit, FIG. 16B is a layout diagram in a plan view corresponding to the circuit in FIG. 16A, and FIG. 16C is a cross-sectional diagram corresponding to the circuit in FIG. 16A along line S-S in FIG. 16B, in accordance with some embodiments.

For illustration, the circuit 1600 configured as a buffer circuit includes P type transistors P9-P10 and N type transistors N9-N10. The transistors P9-P10 are coupled to the supply voltage VDD, and the transistors N9-N10 are coupled to the supply voltage VSS. The gate terminals of the transistors P9-P10 are coupled to an input terminal I and drain terminals of the transistors P9-P10 are coupled to gate terminals of the gate terminals of the transistors P10 and N10. The drain terminals of the transistors P10 and N10 are coupled to an output terminal ZN.

In FIGS. 16B-16C, the cell CELL22, having a cell height CH15, includes active regions 1611-1612 that have a width W15 and are configured with respect to the active regions 111-112 in FIG. 1, conductive segments 1621 and 1622 configured with respect to the conductive segment 121 in FIG. 1, a gate 1631 configured with respect to the gates 131-132 in FIG. 1, conductive lines 1641-1642 configured with respect to the conductive line 141 in FIG. 1, and a conductive line 1661 configured with respect to the conductive line 161 in FIG. 1. In some embodiments, the conductive line 1642 is cut into two portions, that correspond to the input terminal I and the output terminal ZN respectively, by the cut layer 1691. In some embodiments, the cell CELL12 is configured with respect to, for example, the cell CELL6 in FIGS. 6A-6D that has no contact via.

In FIG. 16C, the conductive line 1641 couples to the conductive segment 1621 through the via 1651. The conductive line 1661 couples to the conductive segment 1622 through the via 1652.

Figure 16D:
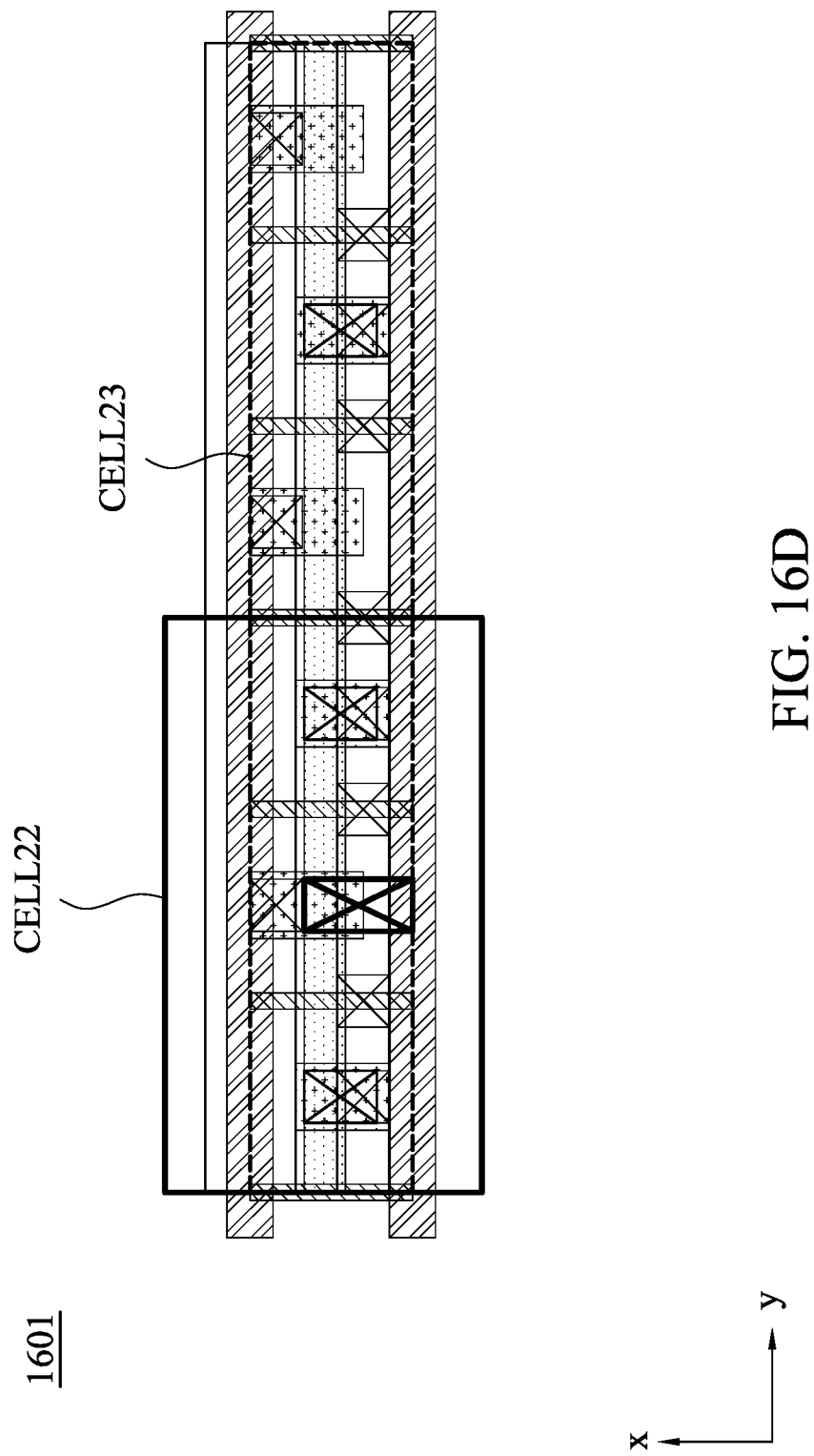
FIG. 16D is another layout diagram in a plan view corresponding to the circuit in FIG. 16A, in accordance with another embodiment.

Reference is now made to FIG. 16D. FIG. 16D is another layout diagram in a plan view corresponding to the circuit 1600 in FIG. 16A, in accordance with another embodiment. Compared with FIG. 16B, the cell CELL23 further includes duplicated structures configured with respect to the cell CELL22 and provides at least four times driving capacity than the cell CELL22 in FIG. 16B, in some embodiments.

The configurations of FIGS. 11-16D are given for illustrative purposes. Various implements are within the contemplated scope of the present disclosure.

Reference is now made to FIG. 17. FIG. 17 is a block diagram of an electronic design automation (EDA) system 1700 for designing the integrated circuit layout design, in accordance with some embodiments of the present disclosure. EDA system 1700 is configured to implement one or more operations of the method 900 disclosed in FIG. 9 and further explained in conjunction with FIGS. 1-16D. In some embodiments, EDA system 1700 includes an APR system.

In some embodiments, EDA system 1700 is a general purpose computing device including a hardware processor 1702 and a non-transitory, computer-readable storage medium 1704. Storage medium 1704, amongst other things, is encoded with, i.e., stores, computer program code (instructions) 1706, i.e., a set of executable instructions. Execution of instructions 1706 by hardware processor 1702 represents (at least in part) an EDA tool which implements a portion or all of, e.g., the method 900.

The processor 1702 is electrically coupled to computer-readable storage medium 1704 via a bus 1708. The processor 1702 is also electrically coupled to an I/O interface 1710 and a fabrication tool 1716 by bus 1708. A network interface 1712 is also electrically connected to processor 1702 via bus 1708. Network interface 1712 is connected to a network 1714, so that processor 1702 and computer-readable storage medium 1704 are capable of connecting to external elements via network 1714. The processor 1702 is configured to execute computer program code 1706 encoded in computer-readable storage medium 1704 in order to cause EDA system 1700 to be usable for performing a portion or all of the noted processes and/or methods. In one or more embodiments, processor 1702 is a central processing unit (CPU), a multi-processor, a distributed processing system, an application specific integrated circuit (ASIC), and/or a suitable processing unit.

In one or more embodiments, computer-readable storage medium 1704 is an electronic, magnetic, optical, electromagnetic, infrared, and/or a semiconductor system (or apparatus or device). For example, computer-readable storage medium 1704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1704 includes a compact disk-read only memory (CD-ROM), a compact disk-read/write (CD-R/W), and/or a digital video disc (DVD).

In one or more embodiments, storage medium 1704 stores computer program code 1706 configured to cause EDA system 1700 (where such execution represents (at least in part) the EDA tool) to be usable for performing a portion or all of the noted processes and/or methods. In one or more embodiments, storage medium 1704 also stores information which facilitates performing a portion or all of the noted processes and/or methods. In one or more embodiments, storage medium 1704 stores library 1720 of IC layout diagram of standard cells including such standard cells as disclosed herein, for example, a cell including in the cells CELL1-CELL23 discussed above with respect to FIGS. 1-16D.

EDA system 1700 includes I/O interface 1710. I/O interface 1710 is coupled to external circuitry. In one or more embodiments, I/O interface 1710 includes a keyboard, keypad, mouse, trackball, trackpad, touchscreen, and/or cursor direction keys for communicating information and commands to processor 1702.

EDA system 1700 also includes network interface 1712 coupled to processor 1702. Network interface 1712 allows EDA system 1700 to communicate with network 1714, to which one or more other computer systems are connected. Network interface 1712 includes wireless network interfaces such as BLUETOOTH, WIFI, WIMAX, GPRS, or WCDMA; or wired network interfaces such as ETHERNET, USB, or IEEE-1764. In one or more embodiments, a portion or all of noted processes and/or methods, is implemented in two or more systems 1700.

EDA system 1700 also includes the fabrication tool(s) 1716 coupled to processor 1702. The fabrication tools 1716 are configured to fabricate integrated circuits, e.g., the integrated circuits illustrated in FIGS. 1-16D, according to the design files processed by the processor 1702. In some embodiments, the fabrication tools 1716 perform various semiconductor processes including, for example, generating photomasks based on layouts, fabricating using the photomasks, etching, deposition, implantation, and annealing. The fabrication tools 1716 include, for example, photolithography steppers, etch tools, deposition tools, polishing tools, rapid thermal anneal tools, ion implantation tools, and the like. Each fabrication tool 1716 modifies the wafer according to a particular operating recipe. For illustration, one fabrication tool 1716 is configured to deposit a film having a certain thickness on a wafer, and another fabrication tool 1716 is configured to etch away a layer from a wafer. Furthermore, in some embodiments, the fabrication tools 1716 of the same type are designed to perform the same type of process.

EDA system 1700 is configured to receive information through I/O interface 1710. The information received through I/O interface 1710 includes one or more of instructions, data, design rules, libraries of standard cells, and/or other parameters for processing by processor 1702. The information is transferred to processor 1702 via bus 1708. EDA system 1700 is configured to receive information related to a UI through I/O interface 1710. The information is stored in computer-readable medium 1704 as design specification 1722.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 18:
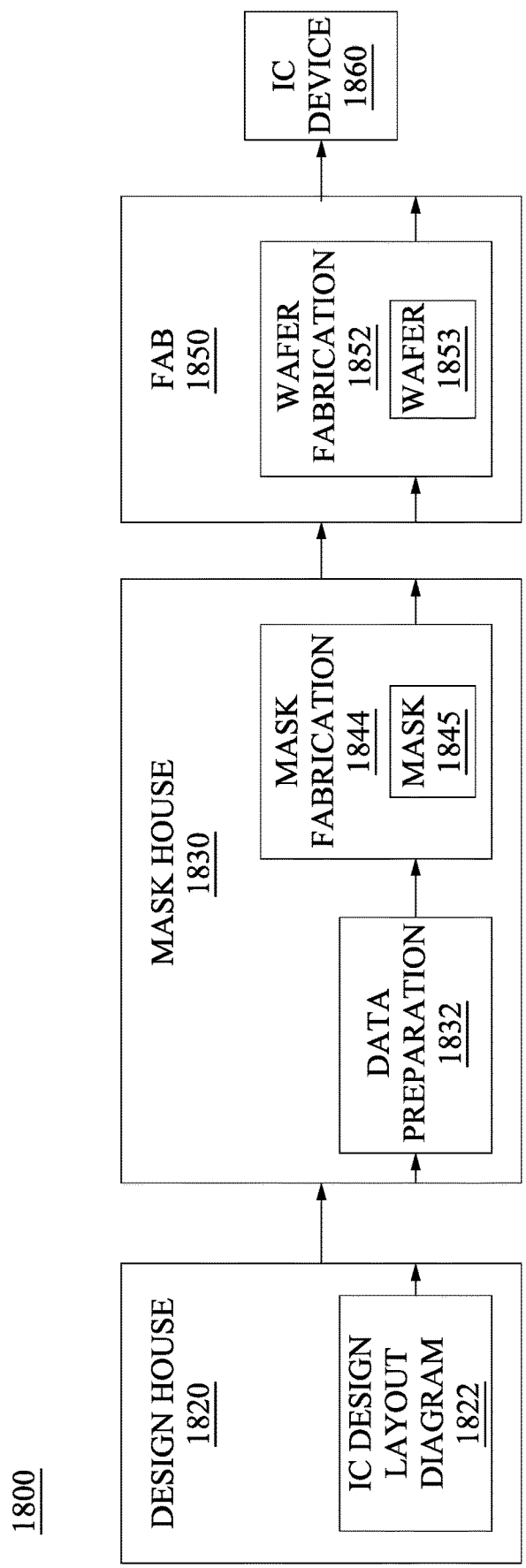
FIG. 18 is a block diagram of an integrated circuit manufacturing system, and an integrated circuit manufacturing flow associated therewith, in accordance with some embodiments.

FIG. 18 is a block diagram of IC manufacturing system 1800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1800.

In FIG. 18, IC manufacturing system 1800 includes entities, such as a design house 1820, a mask house 1830, and an IC manufacturer/fabricator ("fab") 1850, that interact with one another in the design, development, and manufacturing cycles and/or services related to manufacturing an IC device 1860. The entities in IC manufacturing system 1800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1820, mask house 1830, and IC fab 1850 is owned by a single larger company. In some embodiments, two or more of design house 1820, mask house 1830, and IC fab 1850 coexist in a common facility and use common resources.

Design house (or design team) 1820 generates an IC design layout diagram 1822. IC design layout diagram 1822 includes various geometrical patterns, for example, an IC layout design depicted in FIGS. 1-16D, designed for an IC device 1860, for example, the integrated circuits discussed above with respect to FIGS. 1-16D. The geometrical patterns correspond to patterns of metal, oxide, or semiconductor layers that make up the various components of IC device 1860 to be fabricated. The various layers combine to form various IC features. For example, a portion of IC design layout diagram 1822 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1820 implements a proper design procedure to form IC design layout diagram 1822. The design procedure includes one or more of logic design, physical design or place and route. IC design layout diagram 1822 is presented in one or more data files having information of the geometrical patterns. For example, IC design layout diagram 1822 can be expressed in a GDSII file format or DFII file format.

Mask house 1830 includes data preparation 1832 and mask fabrication 1844. Mask house 1830 uses IC design layout diagram 1822 to manufacture one or more masks 1845 to be used for fabricating the various layers of IC device 1860 according to IC design layout diagram 1822. Mask house 1830 performs mask data preparation 1832, where IC design layout diagram 1822 is translated into a representative data file ("RDF"). Mask data preparation 1832 provides the RDF to mask fabrication 1844. Mask fabrication 1844 includes a mask writer. A mask writer converts the RDF to an image on a substrate, such as a mask (reticle) 1845 or a semiconductor wafer 1853. The IC design layout diagram 1822 is manipulated by mask data preparation 1832 to comply with particular characteristics of the mask writer and/or requirements of IC fab 1850. In FIG. 18, data preparation 1832 and mask fabrication 1844 are illustrated as separate elements. In some embodiments, data preparation 1832 and mask fabrication 1844 can be collectively referred to as mask data preparation.

In some embodiments, data preparation 1832 includes optical proximity correction (OPC) which uses lithography enhancement techniques to compensate for image errors, such as those that can arise from diffraction, interference, other process effects and the like. OPC adjusts IC design layout diagram 1822. In some embodiments, data preparation 1832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1832 includes a mask rule checker (MRC) that checks the IC design layout diagram 1822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1822 to compensate for limitations during mask fabrication 1844, which may undo part of the modifications performed by OPC in order to meet mask creation rules.

In some embodiments, data preparation 1832 includes lithography process checking (LPC) that simulates processing that will be implemented by IC fab 1850 to fabricate IC device 1860. LPC simulates this processing based on IC design layout diagram 1822 to create a simulated manufactured device, such as IC device 1860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1822.

It should be understood that the above description of data preparation 1832 has been simplified for the purposes of clarity. In some embodiments, data preparation 1832 includes additional features such as a logic operation (LOP) to modify the IC design layout diagram 1822 according to manufacturing rules. Additionally, the processes applied to IC design layout diagram 1822 during data preparation 1832 may be executed in a variety of different orders.

After data preparation 1832 and during mask fabrication 1844, a mask 1845 or a group of masks 1845 are fabricated based on the modified IC design layout diagram 1822. In some embodiments, mask fabrication 1844 includes performing one or more lithographic exposures based on IC design layout diagram 1822. In some embodiments, an electron-beam (e-beam) or a mechanism of multiple e-beams is used to form a pattern on a mask (photomask or reticle) 1845 based on the modified IC design layout diagram 1822. Mask 1845 can be formed in various technologies. In some embodiments, mask 1845 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1845 includes a transparent substrate (for example, fused quartz) and an opaque material (for example, chromium) coated in the opaque regions of the binary mask. In another example, mask 1845 is formed using a phase shift technology. In a phase shift mask (PSM) version of mask 1845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1844 is used in a variety of processes. For example, such a mask(s) is used in an ion implantation process to form various doped regions in semiconductor wafer 1853, in an etching process to form various etching regions in semiconductor wafer 1853, and/or in other suitable processes.

IC fab 1850 includes wafer fabrication 1852. IC fab 1850 is an IC fabrication business that includes one or more manufacturing facilities for the fabrication of a variety of different IC products. In some embodiments, IC Fab 1850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1850 uses mask(s) 1845 fabricated by mask house 1830 to fabricate IC device 1860. Thus, IC fab 1850 at least indirectly uses IC design layout diagram 1822 to fabricate IC device 1860. In some embodiments, semiconductor wafer 1853 is fabricated by IC fab 1850 using mask(s) 1845 to form IC device 1860. In some embodiments, the IC fabrication includes performing one or more lithographic exposures based at least indirectly on IC design layout diagram 1822. Semiconductor wafer 1853 includes a silicon substrate or other proper substrate having material layers formed thereon. Semiconductor wafer 1853 further includes one or more of various doped regions, dielectric features, multi-level interconnects, and the like (formed at subsequent manufacturing steps).

As described above, the present application provides an integrated circuit and method of manufacturing the same to optimize layout design in hybrid cell height structure. Instead of manually adjusting cell height of a standard cell to obtain various cells and arranging cells corresponding to different standard cell in a layout design, by applying the present application, various of cell heights are calculated as process limitation and power rails arrangements are taken into concern, the routing and layout design for the integrated circuit is optimized. Accordingly, the power, performance and area of the integrated circuit manufactured based on the layout design is improved.

In some embodiments, a method is provided, including following operations: identifying a first contact via, a second contact via, or a combination thereof in a first standard cell, wherein the first contact via is coupled between a first active region and a first conductive line on a first side of an integrated circuit, and the second contact via is coupled between a second active region and a second conductive line on a second side, opposite of the first side of the integrated circuit; in response to the identification, calculating a first cell height of the first standard cell according to a first width of the first and second active regions, and calculating a second cell height of the first standard cell according to a second width, smaller than the first width, of the first and second active regions; calculating multiple first available cell heights based on a ratio between the first and second cell heights of the first standard cell; generating layout designs of multiple first cells that correspond to the first standard cell, wherein each of the first cells has one of the first available cell heights; and manufacturing at least first one element in the integrated circuit based on the layout designs of the first cells.

In some embodiments, an integrated circuit is provided, including first to third cells. The first cell has a first cell height and includes a first pair of stacked active regions a first width, and a first number of first contact vias arranged on opposite sides of the first pair of stack active regions. One of the first contact via couples a first active region in the first pair of stacked active regions to a first conductive line on a back side of the integrated circuit. The second cell has a second cell height smaller than the first cell height and includes a second pair of stacked active regions having a second width and a second number of second contact vias. One of the second contact via extends in a first direction to pass a first active region in the second pair of stacked active regions. A first boundary of the second pair of stacked active regions is aligned with a first boundary of the first pair of stacked active regions in a second direction. The third cell has a third cell height smaller than the first and second cell heights and includes a third pair of stacked active regions having a third width. The third cell abuts one of the first and second cells.

In some embodiments, a system is provided. The system includes a non-transitory computer readable medium for storing instructions thereon and a processor connected to the non-transitory computer readable medium. The processor is configured to execute the instructions for retrieving a standard cell from a library stored in the non-transitory computer readable medium, wherein the standard cell comprises a pair of stacked active regions; calculating a ratio between a first cell height of the standard cell over a second cell height of the standard cell for a cell height range of the standard cell, wherein the first and second cell heights of the standard cell correspond to first and second widths of the pair of stacked active regions; generating layout designs of multiple cells each corresponding to the standard cell and having a cell height in the cell height range; and saving the layout designs of the cells into the library stored in the non-transitory computer readable medium for signal routing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   identifying a first contact via, a second contact via, or a combination thereof in a first standard cell, wherein the first contact via is coupled between a first active region and a first conductive line on a first side of an integrated circuit, and the second contact via is coupled between a second active region and a second conductive line on a second side, opposite of the first side of the integrated circuit;
   in response to the identification, calculating a first cell height of the first standard cell according to a first width of the first and second active regions, and calculating a second cell height of the first standard cell according to a second width, smaller than the first width, of the first and second active regions;
   calculating a plurality of first available cell heights based on a ratio between the first and second cell heights of the first standard cell;
   generating layout designs of a plurality of first cells that correspond to the first standard cell, wherein each of the plurality of first cells has one of the plurality of first available cell heights; and
   manufacturing at least first one element in the integrated circuit based on the layout designs of the plurality of first cells.

2. The method of claim 1, wherein the first active region and the second active region have different conductivity types, and
   the first active region is stacked above the second active region.

3. The method of claim 1, wherein when the first standard cell includes a first power rail on the first side of the integrated circuit and a second power rail on the second side of the integrated circuit, one of the plurality of first available cell heights equals to half of the second cell height.

4. The method of claim 1, further comprising:
   identifying a plurality of power rails on the first side of the integrated circuit in the first standard cell; and
   when the plurality of power rails are in the first standard cell, setting a minimum of the plurality of first available cell heights to be equal to the second cell height.

5. The method of claim 1, wherein calculating the first cell height of the first standard cell and calculating the second cell height of the first standard cell comprise:

when one of the first and second contact vias is included in the first standard cell, calculating the first cell height based on the equation below:

$$CHA=WA+PO\_EN+CMG+DV\_OD+DV\_W+\max(CMG; 0.5 \times DV\_DV)$$

and calculating the second cell height based on the equation below:

$$CHB=WB+PO\_EN+CMG+DV\_OD+DV\_W+\max(CMG; 0.5 \times DV\_DV)$$

wherein CHA and CHB correspond to the first cell height and the second cell height respectively, WA and WB correspond to the first width and the second width of the first and second active regions, PO_EN corresponds to a distance between the first and second active regions and an edge of a gate structure crossing thereabove, CMG corresponds to the edge of the gate structure and a first boundary of the first standard cell, DV_OD corresponds to a distance between the first and second active regions and the one of the first and second contact vias, DV_W corresponds to a width of the one of the first and second contact vias, and DV_DV corresponds to a distance between a third via and the one of the first and second contact vias, wherein the third via and the one of the first and second contact vias are separated by a second boundary of the first standard cell.

6. The method of claim 5, wherein calculating the first cell height of the first standard cell and calculating the second cell height of the first standard cell further comprise:

when both of the first and second contact vias are included in the first standard cell, calculating the first cell height based on the equation below:

$$CHA=WA+\max(PO\_EN+CMG; DV\_OD+DV\_W+0.5 \times DV\_DV; CMG+DV\_OD+DV) \times 2$$

and calculating the second cell height based on the equation below:

$$CHB=WB+\max(PO\_EN+CMG; DV\_OD+DV\_W+0.5 \times DV\_DV; CMG+DV\_OD+DV) \times 2.$$

7. The method of claim 5, wherein calculating the first cell height of the first standard cell and calculating the second cell height of the first standard cell further comprise:

when the first and second contact vias are not included in the first standard cell, calculating the first cell height based on the equation below:

$$CHA=WA+2 \times PO\_EN+2 \times CMG$$

and calculating the second cell height based on the equation below:

$$CHB=WB+2 \times PO\_EN+2 \times CMG.$$

8. The method of claim 1, further comprising:
adjusting the second width of the first and second active regions.

9. The method of claim 1, further comprising:
identifying a third contact via, a fourth contact via, or a combination thereof in a second standard cell, wherein the third contact via is coupled between a third active region and a third conductive line on the first side of the integrated circuit, and the fourth contact via is coupled between a fourth active region and a fourth conductive line on the second side of the integrated circuit;
in response to the identification, calculating a first cell height of the second standard cell according to a first width of the third and fourth active regions, and calculating a second cell height of the second standard cell according to a second width of the third and fourth active regions;
calculating a plurality of first available cell heights based on a ratio between the first and second cell heights of the second standard cell to obtain a plurality of second available cell heights;
generating layout designs of a plurality of second cells that correspond to the second standard cell, wherein each of the plurality of second cells has one of the plurality of second available cell heights; and
implementing the layout designs of a plurality of second cells in the integrated circuit.

10. The method of claim 9, wherein in a layout view one of the plurality of first cells abuts one of the plurality of second cells.

11. The method of claim 9, wherein the second width of the third and fourth active regions is different from the second width of the first and second active regions.

12. A method, comprising:
forming a first standard cell having a first cell height, comprising:
  forming a first pair of stacked active regions a first width; and
  forming a first number of first contact vias arranged on opposite sides of the first pair of stack active regions, wherein one of the first contact vias couples a first active region in the first pair of stacked active regions to a first conductive line on a back side of an integrated circuit;
forming a second standard cell having a second cell height smaller than the first cell height, comprising:
  forming a second pair of stacked active regions having a second width; and
  forming a second number of second contact vias, wherein one of the second contact vias extends in a first direction to pass a first active region in the second pair of stacked active regions, wherein a first boundary of the second pair of stacked active regions is aligned with a first boundary of the first pair of stacked active regions in a second direction; and
forming a third standard cell having a third cell height smaller than the first and second cell heights, comprising:
  forming a third pair of stacked active regions having a third width,
  wherein the third standard cell abuts one of the first and second standard cells.

13. The method of claim 12, wherein the first active region in the first pair of stacked active regions is N conductivity type, and
a second active region in the first pair of stacked active regions is P conductivity type and coupled to a second conductive line on a front side of the integrated circuit by a first via of the first contact vias extending in the first direction to pass the first active region in the first pair of stacked active regions.

14. The method of claim 12, wherein the first number of the first contact vias equals to the second number of the second contact vias, and
the first width is greater than the second width.

15. The method of claim 12, wherein the first number of the first contact vias is greater than the second number of the second contact vias, and
the first width equals to the second width.

16. The method of claim 12, wherein the first cell height and the third cell height are in multiples of half of the second cell height.

17. A method, comprising:
calculate a ratio between a first cell height of a standard cell over a second cell height of the standard cell for a cell height range of the standard cell, wherein the first and second cell heights of the standard cell correspond to first and second widths of a pair of stacked active regions in the standard cell;
generate layout designs of a plurality of cells each corresponding to the standard cell and having a cell height in the cell height range for signal routing; and
manufacturing at least first one element in an integrated circuit based on the layout designs.

18. The method of claim 17, further comprising:
set a minimum of the cell height range to be half of the second cell height of the standard cell when the standard cell comprises a front side power rail and a back side power rail.

19. The method of claim 17, wherein the cell height of each of the plurality of cells is in multiples of 0.5 of the second cell height of the standard cell, and
a ratio between the second cell height and the cell height of each of the plurality of cells is smaller than the ratio between the first cell height of the standard cell over the second cell height of the standard cell.

20. The method of claim 17, further comprising:
calculate the first and second cell heights of the standard cell according to a number of contact vias included in the standard cell, wherein each one of the contact vias passes at least one of an active region in the pair of stacked active regions to a front side conductive line or a back side conductive line.

* * * * *